United States Patent
Ide et al.

(10) Patent No.: US 9,591,789 B2
(45) Date of Patent: Mar. 7, 2017

(54) POWER SEMICONDUCTOR MODULE AND POWER MODULE

(71) Applicant: Hitachi Automotive Systems, Ltd., Hitachinaka-shi, Ibaraki (JP)

(72) Inventors: Eiichi Ide, Tokyo (JP); Eiji Nishioka, Tokyo (JP); Toshiaki Ishii, Tokyo (JP); Junpei Kusukawa, Tokyo (JP); Kinya Nakatsu, Tokyo (JP); Nobutake Tsuyuno, Tokyo (JP); Toshiya Satoh, Hitachinaka (JP); Masahiko Asano, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 159 days.

(21) Appl. No.: 14/364,133

(22) PCT Filed: Nov. 9, 2012

(86) PCT No.: PCT/JP2012/079057
§ 371 (c)(1),
(2) Date: Jun. 10, 2014

(87) PCT Pub. No.: WO2013/088870
PCT Pub. Date: Jun. 20, 2013

(65) Prior Publication Data
US 2015/0003019 A1    Jan. 1, 2015

(30) Foreign Application Priority Data

Dec. 15, 2011 (JP) .................................. 2011-274400

(51) Int. Cl.
*H05K 7/00* (2006.01)
*H05K 5/00* (2006.01)
(Continued)

(52) U.S. Cl.
CPC ......... *H05K 7/20427* (2013.01); *H01L 23/34* (2013.01); *H01L 23/36* (2013.01);
(Continued)

(58) Field of Classification Search
CPC ...................................................... B60K 6/445
(Continued)

(56) References Cited

U.S. PATENT DOCUMENTS

2012/0087095 A1* 4/2012 Tokuyama ............. B60K 6/445
361/721
2012/0268379 A1* 10/2012 Yoshioka ............... H01H 13/83
345/168

FOREIGN PATENT DOCUMENTS

JP          64-32656 A      2/1989
JP       2001-308237 A     11/2001
(Continued)

OTHER PUBLICATIONS

Japanese-language Office Action dated Sep. 2, 2014 (Four (4) pages).
(Continued)

*Primary Examiner* — Jerry Wu
(74) *Attorney, Agent, or Firm* — Crowell & Moring LLP

(57) ABSTRACT

An insulation film that strongly adheres to a power semiconductor module having a resin sealer and a conductor plate and has high thermal conductivity is provided.
An insulation layer 700 is provided between a power semiconductor module 302 and a heat dissipation portion 307B. The power semiconductor module 302 includes a resin sealer 348, which covers a circumferential side surface of a conductor plate 315, and a plurality of recesses 348D are provided in the resin sealer 348. The insulation layer 700 is formed of a spray coated film 710, an insulation film 720, and a resin layer 730, and the spray coated film 710 is
(Continued)

formed on the surface of the resin sealer 348 including recesses 348D to form a seamless flat surface. The planar size of each of the recesses 348D is greater than the planar size of each flat portion 711, which forms the spray coated film 710.

11 Claims, 42 Drawing Sheets

(51) Int. Cl.
*H05K 7/20* (2006.01)
*H01L 23/34* (2006.01)
*H01L 23/36* (2006.01)
*H01L 23/433* (2006.01)
*H01L 23/473* (2006.01)
*H01L 23/495* (2006.01)
*H05K 1/02* (2006.01)
*H05K 7/02* (2006.01)

(52) U.S. Cl.
CPC ........ *H01L 23/4334* (2013.01); *H01L 23/473* (2013.01); *H01L 23/49524* (2013.01); *H01L 23/49562* (2013.01); *H01L 23/49575* (2013.01); *H05K 1/0271* (2013.01); *H05K 7/02* (2013.01); *H01L 2224/32245* (2013.01); *H01L 2224/48091* (2013.01); *H01L 2224/48137* (2013.01); *H01L 2224/48247* (2013.01); *H01L 2224/48472* (2013.01); *H01L 2224/4903* (2013.01); *H01L 2224/49175* (2013.01); *H01L 2224/73265* (2013.01); *H01L 2924/13055* (2013.01); *H01L 2924/13091* (2013.01); *H01L 2924/181* (2013.01); *H01L 2924/3025* (2013.01); *H01L 2924/30107* (2013.01)

(58) Field of Classification Search
USPC .................................................. 361/705–711
See application file for complete search history.

(56) References Cited

FOREIGN PATENT DOCUMENTS

| | | |
|---|---|---|
| JP | 4023397 B2 | 10/2007 |
| JP | 2008-166333 A | 7/2008 |
| JP | 2010-258315 A | 11/2010 |
| JP | 2011-52240 A | 3/2011 |
| JP | 2011-54607 A | 3/2011 |
| JP | 2011-91259 A | 5/2011 |
| JP | 2011-216754 A | 10/2011 |
| JP | 2013-73964 A | 4/2013 |
| JP | 2013-143439 A | 7/2013 |

OTHER PUBLICATIONS

International Search Report (PCT/ISA/210) dated Dec. 18, 2012 with English translation thereof {Two (2) pages}.

* cited by examiner (a)

(b)

POWER SEMICONDUCTOR MODULE AND POWER MODULE

TECHNICAL FIELD

The present invention relates to a power semiconductor module and a power module that excel in heat dissipation characteristic and reliability.

BACKGROUND ART

From a viewpoint of energy conservation, an automobile is required to increase gas mileage, and an electric automobile driven by a motor and a hybrid car driven by a combination of a motor and an engine now receive attention. A high-capacity, on-vehicle motor used in an automobile is difficult to drive and control by using a DC voltage from a battery, and an electric power converter that uses switching operation of a power semiconductor device is essentially required for voltage step up and AC control. Since a power semiconductor device generates heat when energized, a power semiconductor module having a power semiconductor device incorporated therein requires an insulation layer having a high heat dissipation capability.

For example, a known power semiconductor module of this type has a structure in which a power semiconductor device and a conductor plate on which the power semiconductor device is mounted are sealed with a resin to form an integrated structure and a ceramic insulation layer is formed on the lower surfaces of the conductor portion and the resin portion in a spray coating process (see PTL 1, for example). Since a ceramic insulation layer has excellent thermal conductivity, the ceramic insulation layer with a heat sink for cooling purposes layered thereon allows a power semiconductor module having an excellent heat dissipation characteristic to be manufactured at low cost.

CITATION LIST

Patent Literature

PTL 1: Japanese Patent No. 4023397

SUMMARY OF INVENTION

Technical Problem

In the power semiconductor module described above, since a spray coated film is simply formed on the conductor plate, on which the power semiconductor device is mounted, and the sealing resin, the sealing resin and the spray coated film weakly adhere to each other. In this case, thermal stress resulting from the difference in coefficient of thermal expansion between the conductor plate and the sealing resin causes the spray coated film to separate from the resin sealer, and the reliability of the power semiconductor module is not ensured.

Solution to Problem

A power semiconductor module according to the invention is characterized in that the power semiconductor module includes a semiconductor device, a conductor plate having one surface on which the semiconductor device is mounted, a resin sealer that covers a side portion of the conductor plate and exposes at least part of the other surface of the conductor plate that faces away from the one surface, and a spray coated film provided on a lower surface of the resin sealer and the part of the other surface of the conductor plate that is exposed through the resin sealer, and a recess is formed in the lower surface of the resin sealer and the planar size of the recess is greater than the planar size of each flat portion that forms the spray coated film.

Advantage of Invention

According to the invention, providing the recess in the resin sealer increases intimate adhesion strength between the spray coated film and the resin sealer and hence prevents the spray coated film from separating from the resin sealer, whereby reliability can be improved.

BRIEF DESCRIPTION OF DRAWINGS

FIG. 9(a) is a cross-sectional view before a die is clamped, and FIG. 9(b) is a cross-sectional view after the die is clamped.

FIG. 25(a) shows a state after under pressure to form an integrated structure, and FIG. 25(b) shows a state before the terminals are bent under pressure to form an integrated structure.

DESCRIPTION OF EMBODIMENTS

Preferable embodiments of a power semiconductor module and a power module according to the invention will be described below with reference to the drawings.

First Embodiment

[Overall Structure of Power Module]

Figure 1:
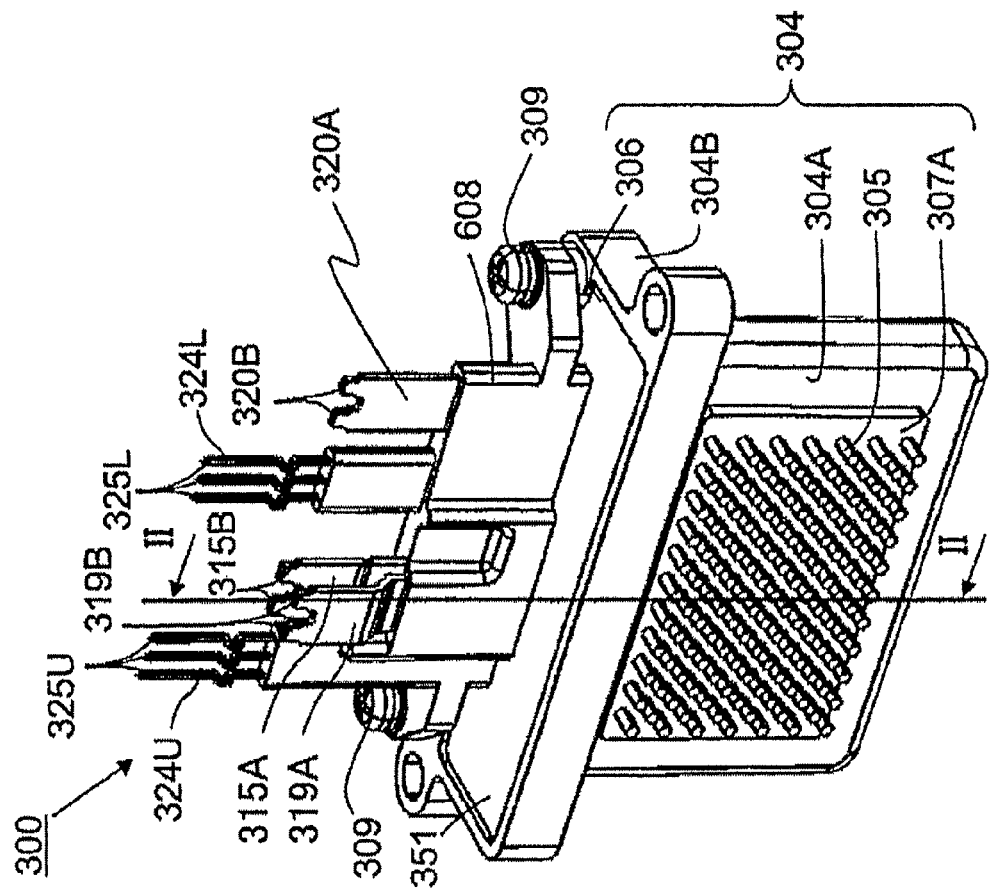
FIG. 1 shows an embodiment of a power module including a power semiconductor module according to the invention and is a perspective view of the external appearance of the power module.
Figure 2:
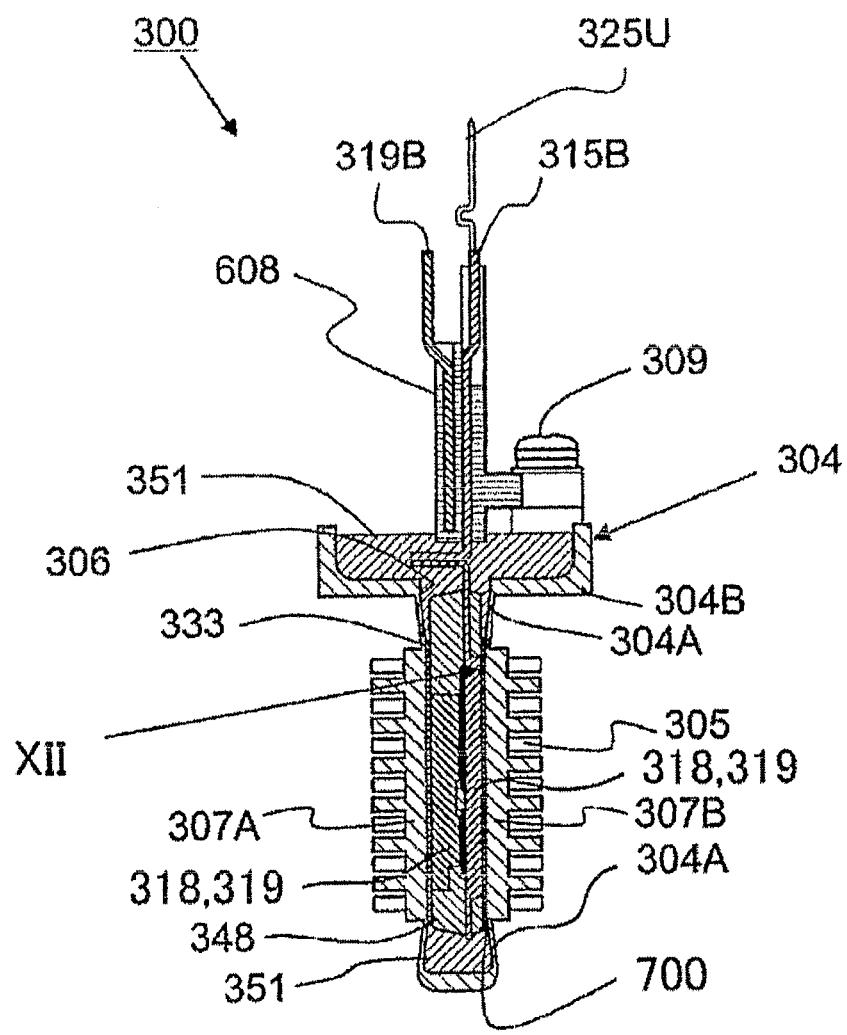
FIG. 2 is a cross-sectional view of the power module shown in FIG. 1 taken along the line II-II.

FIGS. 1 to 15 show a first embodiment of a power semiconductor module according to the invention. FIG. 1 is a perspective view of the external appearance of a power module having the power semiconductor module. FIG. 2 is a cross-sectional view of the power module taken along the line II-II in FIG. 1.

A power module 300 has a module case 304, which accommodates a power semiconductor module including a switching device and formed in a transfer mold process. The power module 300 is used, for example, in an electric power converter incorporated in an electric automobile, a hybrid automobile, or any other electric vehicle.

Figure 3:
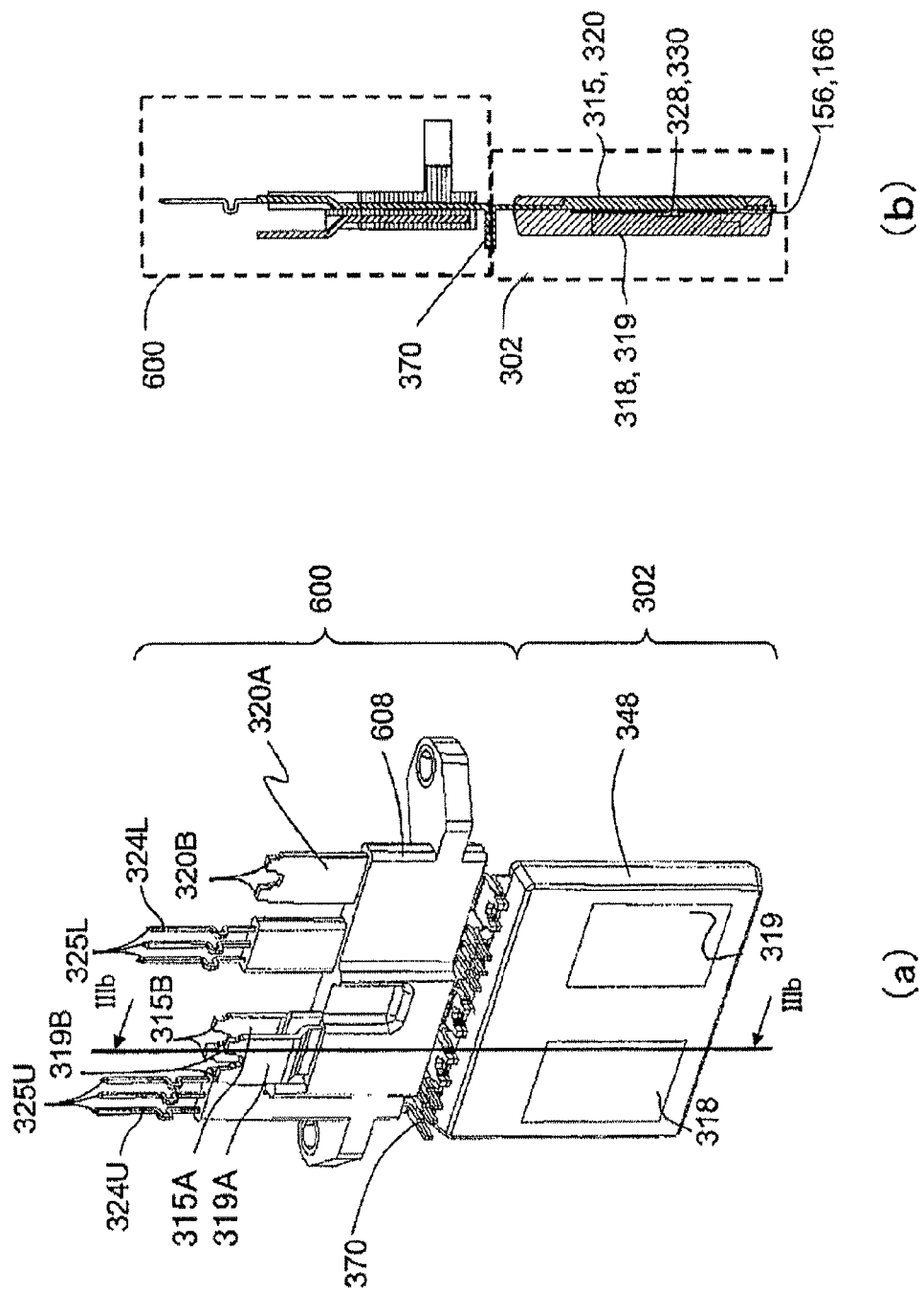
FIG. 3(a) is a perspective view of the power module from which a module case is removed.
FIG. 3(b) is a cross-sectional view of the power module shown in FIG. 3(a) taken along the line IIIb-IIIb.

As shown in FIG. 2, the power module 300 has a power semiconductor module 302 shown in FIG. 3 accommodated in the module case (heat dissipation member) 304, which is a CAN-type cooler. The CAN-type cooler is a tubular cooler having an insertion opening 306 (see FIG. 2) on one side and a bottom on the other side. The module case 304 is formed, for example, of an electrically conductive member made, for example, of Cu, a Cu alloy, Cu—C, or Cu—CuO, or any other Cu-based composite material or Al, an Al alloy, Al—SiC, Al—C, or any other Al-based composite material. The module case 304 is a monolithic, seamless case formed in a welding process or any other bonding process that provides high waterproofness, a forging process, or a casting process.

The module case 304 is a flat-shaped case with no opening except the insertion opening 306 provided on one side, and a flange 304B is provided on the side where the insertion opening 306 of the flat-shaped case is present. One of the two wide-area surfaces of the flat-shaped case that face each other has a heat dissipation portion 307A provided thereon, and the other wide-area surface has a heat dissipation portion 307B provided thereon. Each of the heat dissipation portions 307A and 307B functions as a heat dissipation wall of the module case 304 and has an outer surface having a plurality of fins 305 uniformly formed thereon. The surface that surrounds each of the heat dissipation portions 307A and 307B forms a thin-walled portion 304A, which has an extremely small thickness and is readily plastically deformed. The thin-walled portion 304A, which is extremely thin, can be readily deformed when pressure is applied to each of the heat dissipation portions 307A and 307B in a direction toward the interior of the case. The module case 304 does not necessarily have an exactly box-like shape and may have rounded corners as shown in FIG. 1.

FIG. 3(a) is a perspective view of the power module 300 from which the module case 304 is removed, and FIG. 3(b) is a cross-sectional view of the power module 300 shown in FIG. 3(a) taken along the line IIIb-IIIb.

The module case 304 accommodates the power semiconductor module 302, which is a primary sealed body, and an auxiliary power module 600 is connected to the power semiconductor module 302 via a connection portion 370 so that the two modules form an integrated structure. The bonding performed at the connection portion 370 can be metal bonding, for example, TIG welding. A wiring insulator 608 provided around the auxiliary power module 600 is fixed to the flange 304B of the module case 304 with screws 309, as shown in FIG. 1. The power semiconductor module 302 is thus positioned in the module case 304.

[Power Semiconductor Module]

Figure 4:
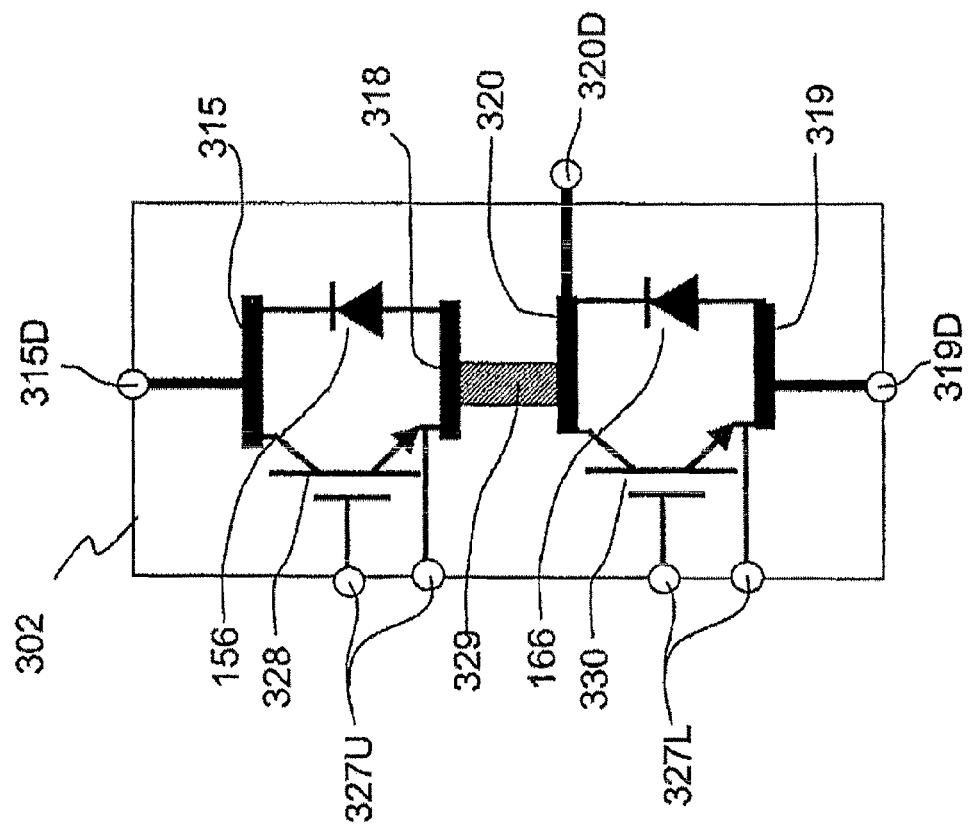
FIG. 4 is a circuit diagram of the power semiconductor module.
Figure 5:
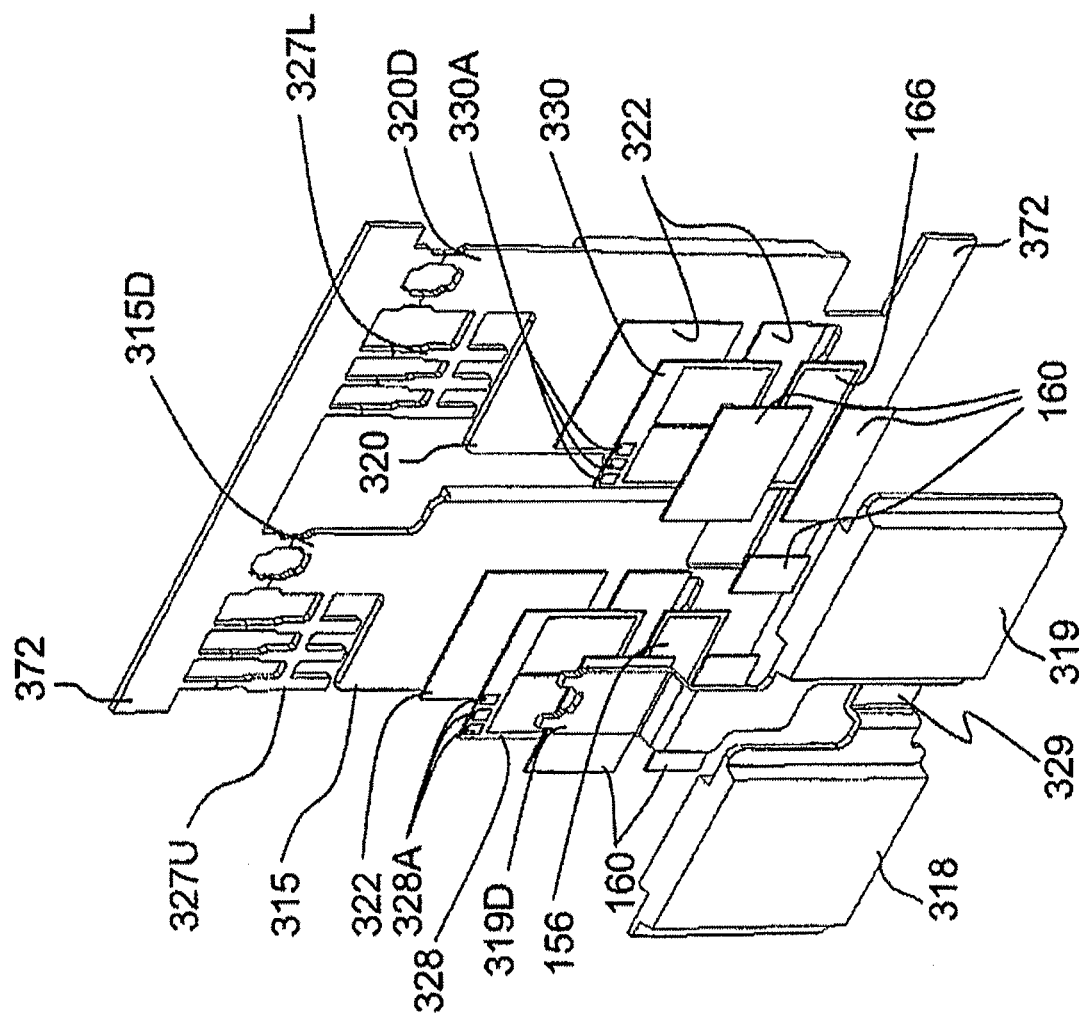
FIG. 5 is a perspective view for describing the step of manufacturing the power semiconductor module.

The configuration of the power semiconductor module 302 will next be described with reference to FIGS. 4 to 10. FIG. 4 is a circuit diagram of the power semiconductor module 302. FIGS. 5 to 10 show the steps of manufacturing the power semiconductor module 302. The power semiconductor module 302 is formed of an IGBT 328 for an upper arm and an IGBT 330 for a lower arm serially connected to each other and includes the IGBTs 328 and 330 and diodes 156 and 166, each of which is a semiconductor device. The semiconductor devices form a flat package structure, and electrodes are formed on the front and rear surfaces of the package, as shown in FIG. 5.

The collector electrode of the IGBT 328 for the upper arm and the cathode electrode of the diode 156 for the upper arm are connected to a conductor plate 315, and the emitter electrode of the IGBT 328 and the anode electrode of the diode 156 are connected to a conductor plate 318. The collector electrode of the IGBT 330 for the lower arm and the cathode electrode of the diode 166 for the lower arm are connected to a conductor plate 320, and the emitter electrode of the IGBT 330 and the anode electrode of the diode 166 are connected to a conductor plate 319. The conductor plate 318 and the conductor plate 320 are connected to each other via an intermediate electrode 329. The intermediate electrode 329 electrically connects the upper arm circuit and the lower arm circuit to each other, which form an upper/lower arm series circuit, such as that shown in FIG. 4. The conductor plates 315, 320, 318, and 319 are made of Cu, Al, Ni, Au, Ag, Mo, Fe, Co, or any other metal, an alloy thereof, or a composite material thereof.

As shown in FIG. 5, the conductor plate 315 on the DC positive polarity side, the conductor plate 320 on the AC output side, signal connection terminals 327U for the upper arm, and signal connection terminals 327L for the lower arm are so monolithically formed that they are connected to common tie bars 372 and disposed in a substantially same plane. Control electrodes 328A of the IGBT 328 are connected to the signal connection terminals 327U for the upper arm with bonding wires 371 (see FIG. 7). Control electrodes 330A of the IGBT 330 are connected to the signal connection terminals 327L for the lower arm with other bonding wires 371 (see FIG. 7). Convex, device fixing portions 322 are formed on the conductor plates 315 and 320 in portions to which the semiconductor devices (IGBTs 328, 330, diodes 156, 166) are bonded. Each of the semiconductor devices is bonded to the corresponding device fixing portion 322 with a metal bonding member 160. The metal bonding member 160 is made, for example, of a low-temperature sintered bonding material containing a soldering material, a silver sheet, and fine metal particles. The metal bonding member 160 is desirably made of a soldering material primarily containing tin but can instead be made, for example, of a material primarily containing gold, silver, or copper, a wax material, or a paste material.

The conductor plates 318 and 319 are disposed on and bonded to the IGBTs 328, 330 and the diodes 156, 166 via the metal bonding members 160 in a metal bonding process in such a way that the conductor plates 318 and 319 are located in substantially the same flat plane. The emitter electrode of the IGBT 328 on the upper arm side and the anode electrode of the diode 156 on the upper arm side are bonded to the conductor plate 318, as shown in FIG. 4. The emitter electrode of the IGBT 330 on the lower arm side and the anode electrode of the diode 166 on the lower arm side are bonded to the conductor plate 319. A DC positive polarity connection terminal 315D is formed as part of the conductor plate 315. An AC connection terminal 320D is formed as part of the conductor plate 320. ADC negative polarity connection terminal 319D is formed as part of the conductor plate 319.

Figure 6:
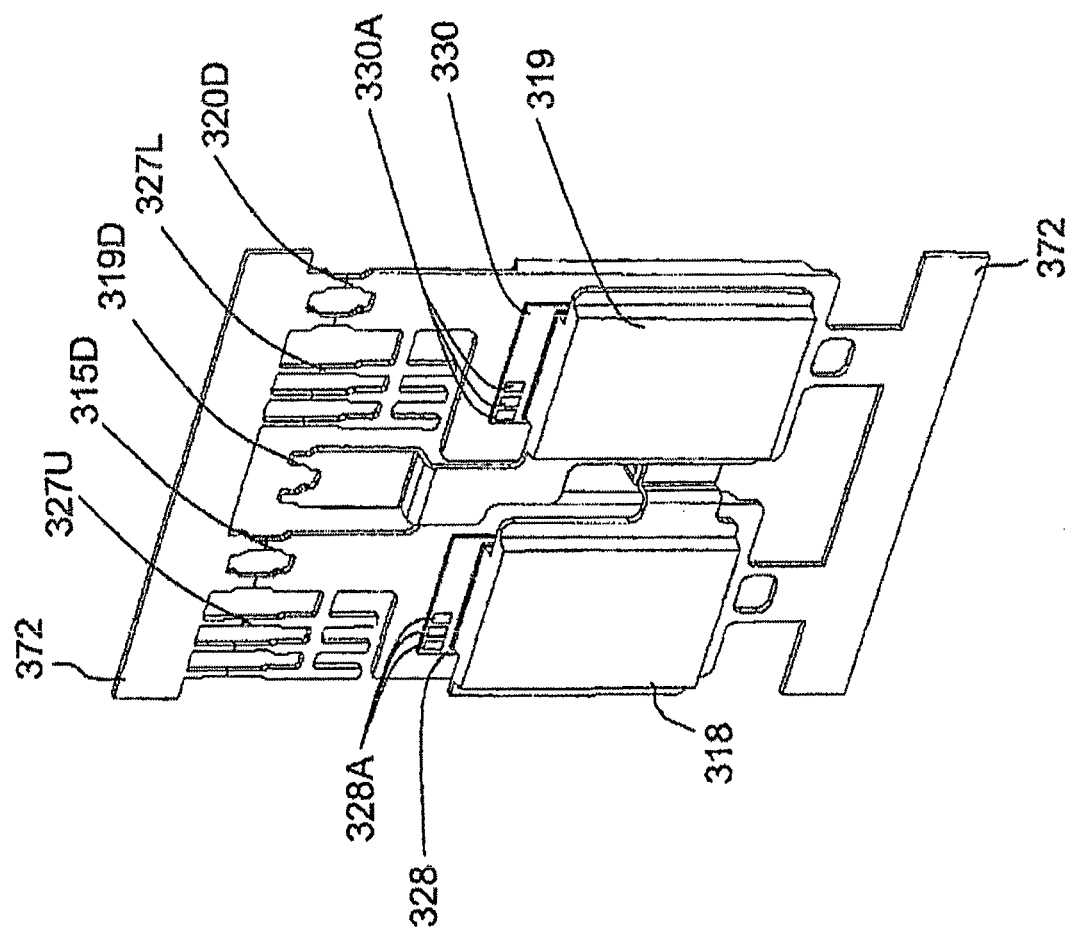
FIG. 6 is a perspective view for describing the step following the step in FIG. 5.

The state shown in FIG. 6 is formed by sandwiching the IGBT 328 and the diode 156 between the conductor plate 315 and the conductor plate 318, sandwiching the IGBT 330 and the diode 166 between the conductor plate 320 and the conductor plate 319, and connecting the conductor plates 320 and 318 to the intermediate electrode 329, as described above. Further, the state shown in FIG. 7 is formed by connecting the control electrode 328A of the IGBT 328 to the signal connection terminals 327U with bonding wires 371 and connecting the control electrode 330A of the IGBT 330 to the signal connection terminals 327L with other bonding wires 371.

Figure 7:
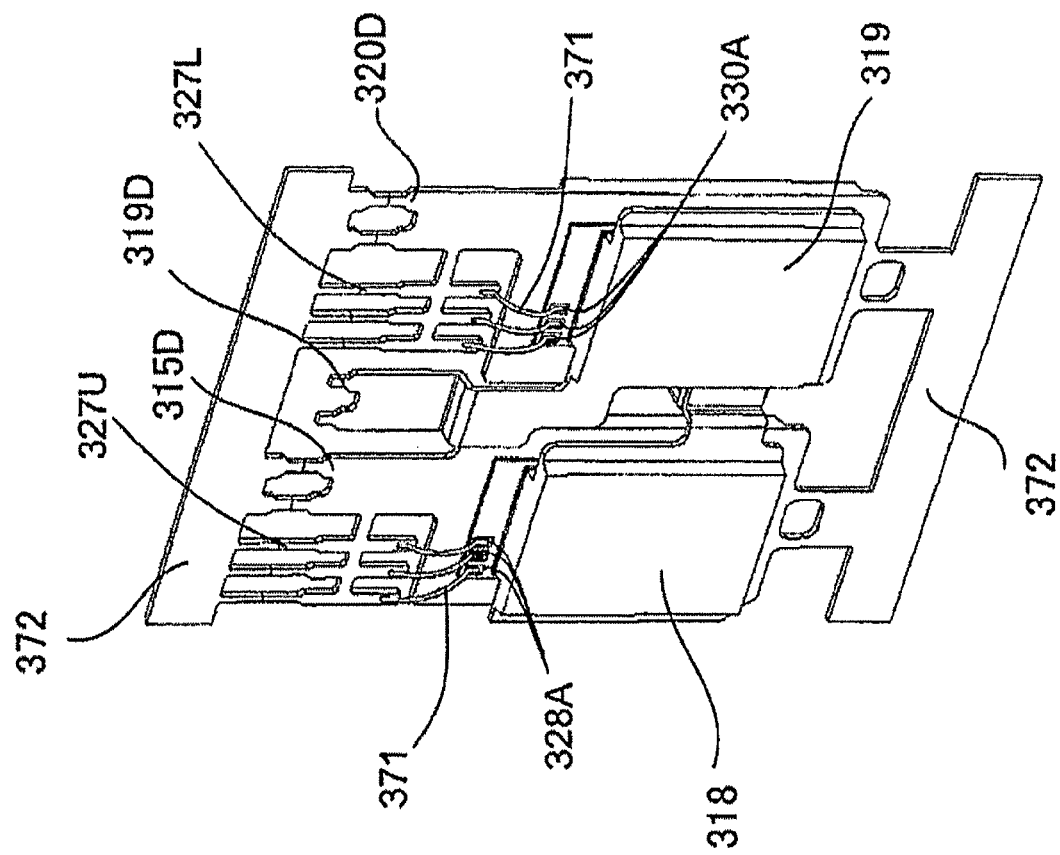
FIG. 7 is a perspective view for describing the step following the step in FIG. 6.
Figure 8:
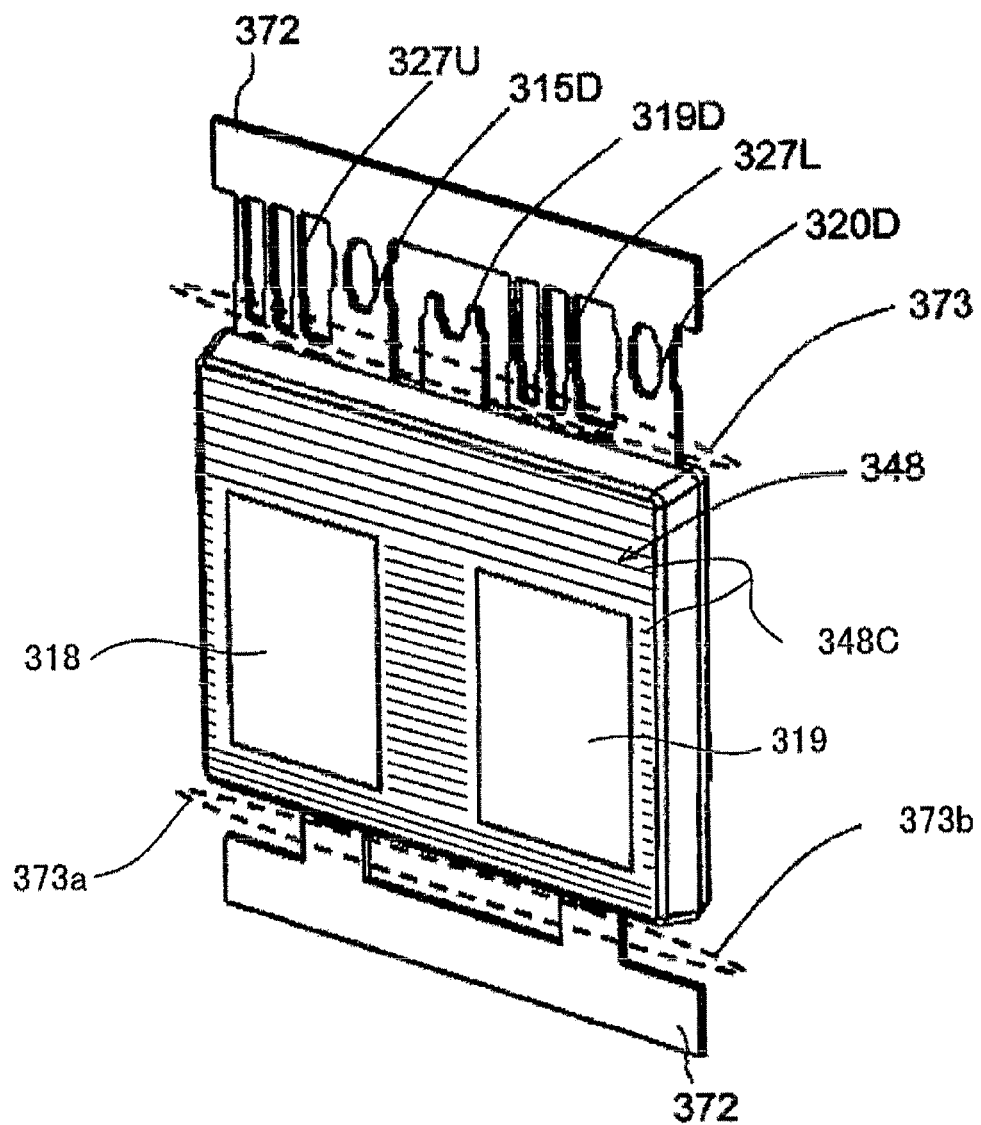
FIG. 8 is a perspective view for describing the step following the step in FIG. 7.
Figure 9:
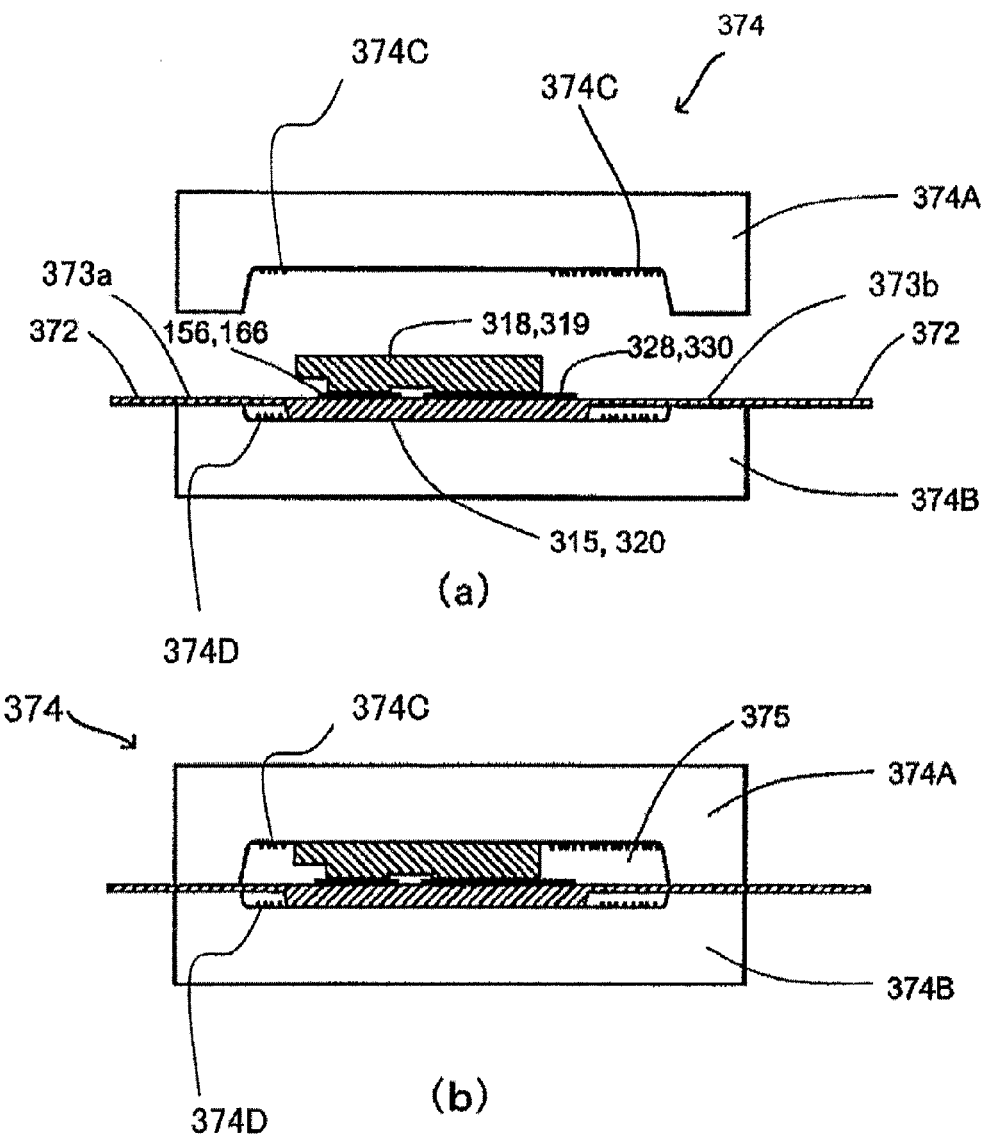
FIG. 9 describes a transfer mold step of shaping a sealing resin.

After the assembly shown in FIG. 7 is achieved, a portion including the semiconductor devices (IGBTs 328, 330, diodes 156, 166) and the bonding wires 371 is sealed with a resin sealer 348. The sealing is performed in a transfer mold process. As shown in FIG. 9, a transfer mold die 374 is pressed against portions labeled with reference characters 373a and 373b (die pressed surfaces) between the tie bars 372 from above and below, and a region between the die pressed surfaces 373a and 373b is filled with a sealing resin to form the resin sealer 348. The resin sealer 348 is so formed that the conductor plates 318 and 319 are exposed on the front side and part of the conductor plates 315 and 320 is exposed on the rear side. A plurality of groove-shaped recesses 348C, which extend in parallel to the tie bars 372, are formed in the front surface of the resin sealer 348, as shown in FIG. 8. Although described later in detail, ends of all the recesses 348C are set apart from the ends of the conductor plates 318 and 319 exposed through the resin sealer 348. Although described later, recesses 348D similar to the recesses 348C are formed in the rear surface of the resin sealer 348. Ends of the recesses 348D are set apart from the ends of the conductor plates 315 and 320 exposed through the resin sealer 348.

FIGS. 9(a) and 9(b) describe the transfer mold step of shaping a sealing resin. FIG. 9(a) is a cross-sectional view before the die is clamped, and FIG. 9(b) is a cross-sectional view after the die is clamped. The power semiconductor module 302 before the sealed shown in FIG. 7 is placed between an upper die 374A and a lower die 374B, as shown in FIG. 9(a). When the upper die 374A and the lower die 374B sandwich the power semiconductor module 302, specifically, the die pressed surfaces 373a and 373b from above and below and the die is clamped, a die space 375 is formed in the die as shown in FIG. 9(b). The die space 375 is filled with a sealing resin, followed by a molding process to manufacture the power semiconductor module 302, which is a primary sealed body. In the power semiconductor module 302, the front and rear surfaces of the IGBT 328 and the diode 156 are in intimate contact with the inner surfaces of the conductor plates 318 and 315, and the front and rear surfaces of the IGBT 330 and the diode 166 are in intimate contact with the inner surfaces of the conductor plates 319 and 320, as understood with reference to FIG. 5, and the side surfaces of the conductor plates 318, 315, 319, and 320 are sealed with the resin. The integrated structure of the power semiconductor module 302 is thus formed.

As shown in FIG. 9(a), protrusions 374C are formed on the inner surface of the upper die 374A, specifically, in a region to be filled with the sealing resin, and protrusions 374D are formed on the inner surface of the lower die 374B, specifically, in a region to be filled with the sealing resin. As shown in FIG. 9(b), the power semiconductor module 302 before sealed with the resin is placed in the die with the surfaces (upper surfaces) of the conductor plates 318 and 319 being in intimate contact with the inner surface of the upper die 374A and the surfaces (lower surfaces) of the conductor plates 315 and 320 being in intimate contact with the inner surface of the lower die 374B, followed by molding operation. As a result, the front surface of the resin sealer 348 is substantially flush with the surfaces of the conductor plates 318 and 319, and the surfaces of the conductor plates 318 and 319 are exposed through the resin sealer 348. Further, the rear surface of the resin sealer 348 is substantially flush with the surfaces of the conductor plates 315 and 320, and the surfaces of the conductor plates 315 and 320 are exposed through the resin sealer 348.

Since the protrusions 374C are formed on the inner surface of the upper die 374A and the protrusions 374D are formed on the inner surface of the lower die 374B, the plurality of groove-shaped recesses 348C and 348D are formed in the front and rear surfaces of the resin sealer 348 as shown in FIG. 8, as described above. In FIG. 8, the recesses 348C are shown in the form of a plurality of grooves parallel to each other but may instead have a grid-like shape. The recesses 348C may still instead be formed in the form of dots that are arranged linearly or in a matrix. The same holds true for the recesses 348D. The protrusions formed in the spaces between the recesses 348C only need to be strong enough not to cause breakage of the sealing resin and do not necessarily have a specific dimension. For example, the recesses 348C may be formed to leave protrusions having a width of about 200 μm, which is strong enough.

The sealing resin that forms the resin sealer 348 can, for example, be a resin based on a novolac-based, multifunctional-based, or biphenyl-based epoxy resin. Fillers made, for example, of $SiO_2$, $Al_2O_3$, AlN, BN, or any other ceramic material, a gel material, or a rubber material is added to any of the resins described above so that the coefficient of thermal expansion of the resin sealer 348 approaches that of the conductor plates 315, 320, 318, and 319 or the difference in coefficient of thermal expansion between the resin sealer 348 and the conductor plates 315, 320, 318, and 319 decreases.

Using the thus formulated resin significantly lowers the magnitude of thermal stress produced in association with an increase in temperature in the environment where the power semiconductor module 302 is used, whereby the life of the power semiconductor module 302 can be prolonged. The largest diameter of the ceramic fillers is desirably smaller than the planar size (area) of each of the protrusions in the spaces between the recesses 348C or 348D. When fillers having a diameter greater than the planar size (area) of each of the protrusions in the spaces between the recesses 348C or 348D are used, no-filler-filled portions are formed in the sealing resin 348, reducing the adhesion strength between the resin sealer 348 and a spray coated film 710.

As shown in FIGS. 9(a) and 9(b), the DC positive polarity connection terminal 315D, the DC negative polarity connection terminal 319D, the AC connection terminal 320D, the signal connection terminals 327U, and the signal connection terminals 327L are arranged in line. The terminal arrangement described above allows the upper die 374A and the lower die 374B to be clamped not only with no gap therebetween but also with no extra stress produced at portions where the terminals are connected to the semiconductor devices. As a result, the semiconductor devices can be sealed without breakage of the semiconductor devices or leakage of the sealing resin that forms the resin sealer 348 through a possible gap between the dies.

Figure 10:
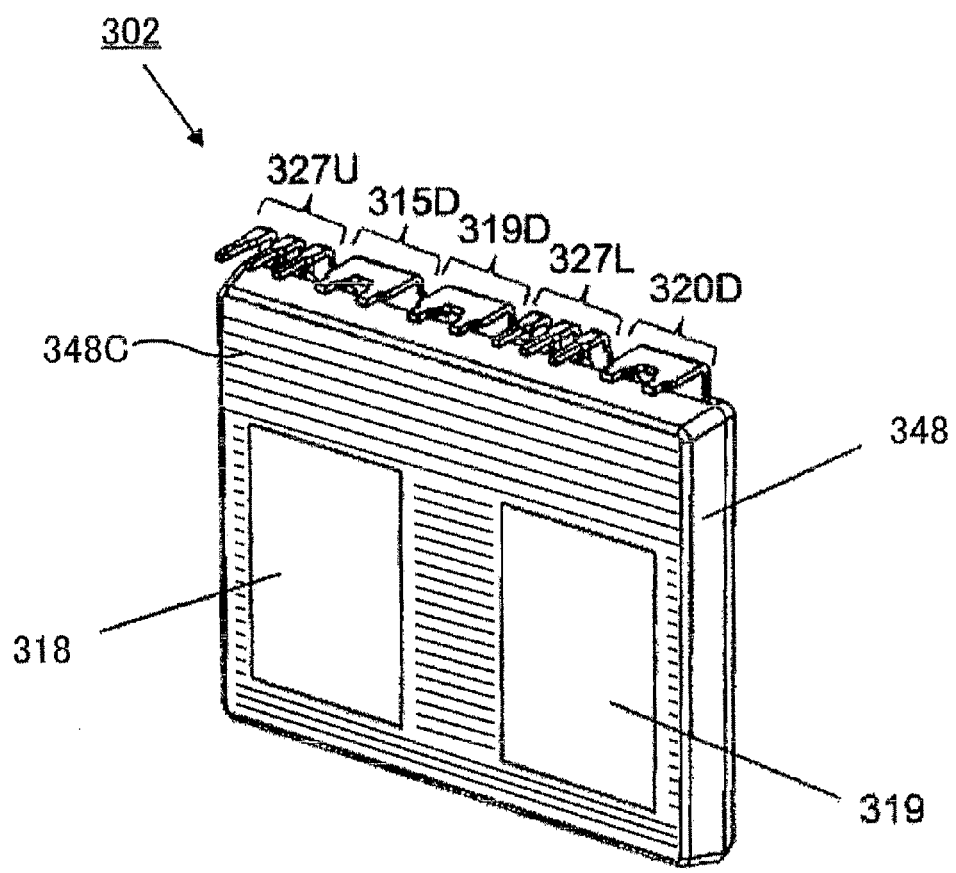
FIG. 10 is a perspective view for describing the step following the step in FIG. 8.
Figure 11:
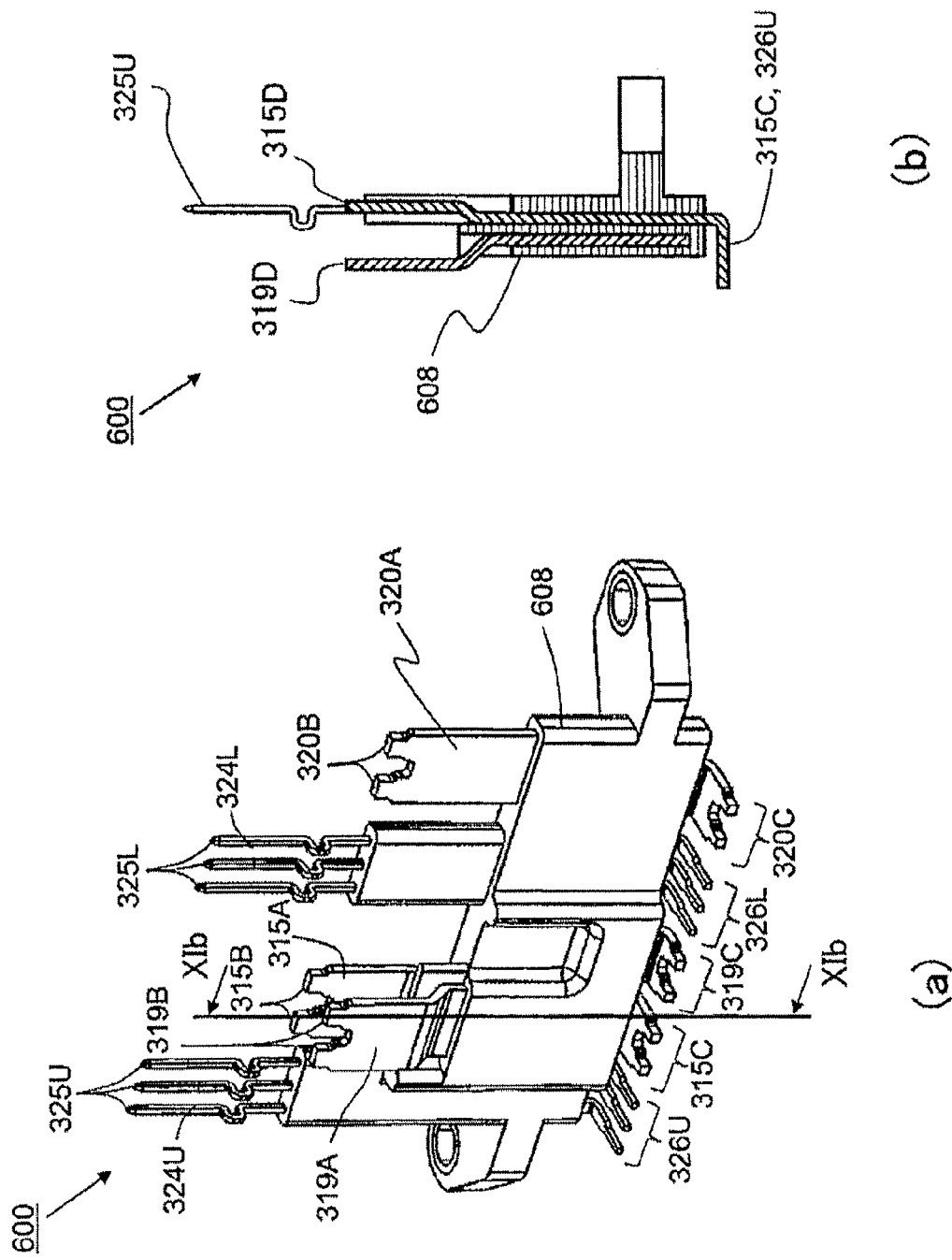
FIG. 11(a) is a perspective view of an auxiliary power module.
FIG. 11(b) is a cross-sectional view of the auxiliary power module taken along the line XIb-XIb in FIG. 11(a).

After the sealing by using the sealing resin as shown in FIGS. 9(a) and 9(b), the ties bar 372 are so cut off that the DC positive polarity connection terminal 315D, the AC connection terminal 320D, and the signal connection terminals 327U and 327L are separated from each other. End portions of the DC positive polarity connection terminal 315D, the DC negative polarity connection terminal 319D, the AC connection terminal 320D, and the signal connection terminals 327U and 327L, which are arranged in line along one side of the power semiconductor module 302, are bent in the same direction, as shown in FIG. 10. The bent end portions allow the power semiconductor module 302 and the auxiliary power module 600 to be readily bonded to each other at the connection portion 370 in the metal bonding process, whereby productivity of the power module and reliability of the metal bonding can be improved.

FIG. 11(a) is a perspective view of the auxiliary power module 600, and FIG. 11(b) is a cross-sectional view of the auxiliary power module 600 taken along the line XIb-XIb in FIG. 11(a). The auxiliary power module 600 includes a DC positive polarity wiring line 315A, a DC negative polarity wiring line 319A, an AC wiring line 320A, and signal wiring lines 324U and 324L. The DC positive polarity wiring line 315A, the DC negative polarity wiring line 319A, the AC wiring line 320A, and the signal wiring lines 324U and 324L are integrally formed in a molding process with the wiring lines insulated from each other by a molded wiring insulator 608 made of a resin material. The wiring insulator 608 also serves as a support member that supports the wiring lines, and an insulating thermoset or thermoplastic resin is suitable for a resin material that forms the wiring insulator 608. The thus formed wiring insulator 608 ensures insulation among the DC positive polarity wiring line 315A, the DC negative polarity wiring line 319A, the AC wiring line 320A, and the signal wiring line 324U and 324L for high-density wiring.

A DC positive polarity terminal 315B is formed at the upper end of the DC positive polarity wiring line 315A, and a DC positive polarity connection terminal 315C, which is bent by aright angle, is formed at the lower end thereof. A DC negative polarity terminal 319B is formed at the upper end of the DC negative polarity wiring line 319A, and a DC negative polarity connection terminal 319C, which is bent in the same direction as the DC positive polarity connection terminal 315C, is formed at the lower end thereof. An AC terminal 320B is formed at the upper end of the AC wiring line 320A, and an AC connection terminal 320C, which is bent in the same direction as the DC positive polarity connection terminal 315C, is formed at the lower end thereof. Signal terminals 325U and 325L are formed at the upper ends of the signal wiring lines 324U and 324L, respectively. On the other hand, signal connection terminals 326U and signal connection terminals 326L, which are bent in the same direction as the DC positive polarity connection terminals 315C, are formed at the lower ends of the signal wiring lines 324U and 324L, respectively.

As described above, the DC positive polarity connection terminal 315C, the DC negative polarity connection terminal 319C, the AC connection terminal 320C, the signal connection terminals 326U, and the signal connection terminals 326L, which form the connection portion 370 on the auxiliary power module 600, are arranged in line, as shown in FIG. 11(a). The connection portion 370 (326U, 315C, 319C, 326L, 320C) on the auxiliary power module 600 is connected to the connection portion 370 (327U, 315D, 319D, 327L, 320D), which has the in-line arrangement as shown in FIG. 10, on the power semiconductor module 302. The connection portions 370 can be connected to each other, for example, in a TIG welding process.

[Bonding Power Semiconductor Module to Module Case]

In the power module 300 shown in FIG. 2, an insulation layer 700 causes the power semiconductor module 302 to adhere to the module case 304. That is, the insulation layer 700 is interposed between the conductor plates 318, 319 in the power semiconductor module 302 and the heat dissipation portion 307A of the module case 304 and between the conductor plates 315, 320 in the power semiconductor module 302 and the heat dissipation portion 307B of the module case 304. The adhesion structure that causes the conductor plates 318 and 319 to adhere to the heat dissipation portion 307A and the adhesion structure that causes the conductor plates 315 and 320 to adhere to the heat dissipation portion 307B are the same, and the adhesion structure that causes the conductor plates 315 and 320 to adhere to the heat dissipation portion 307B will therefore be representatively described below.

Figure 12:
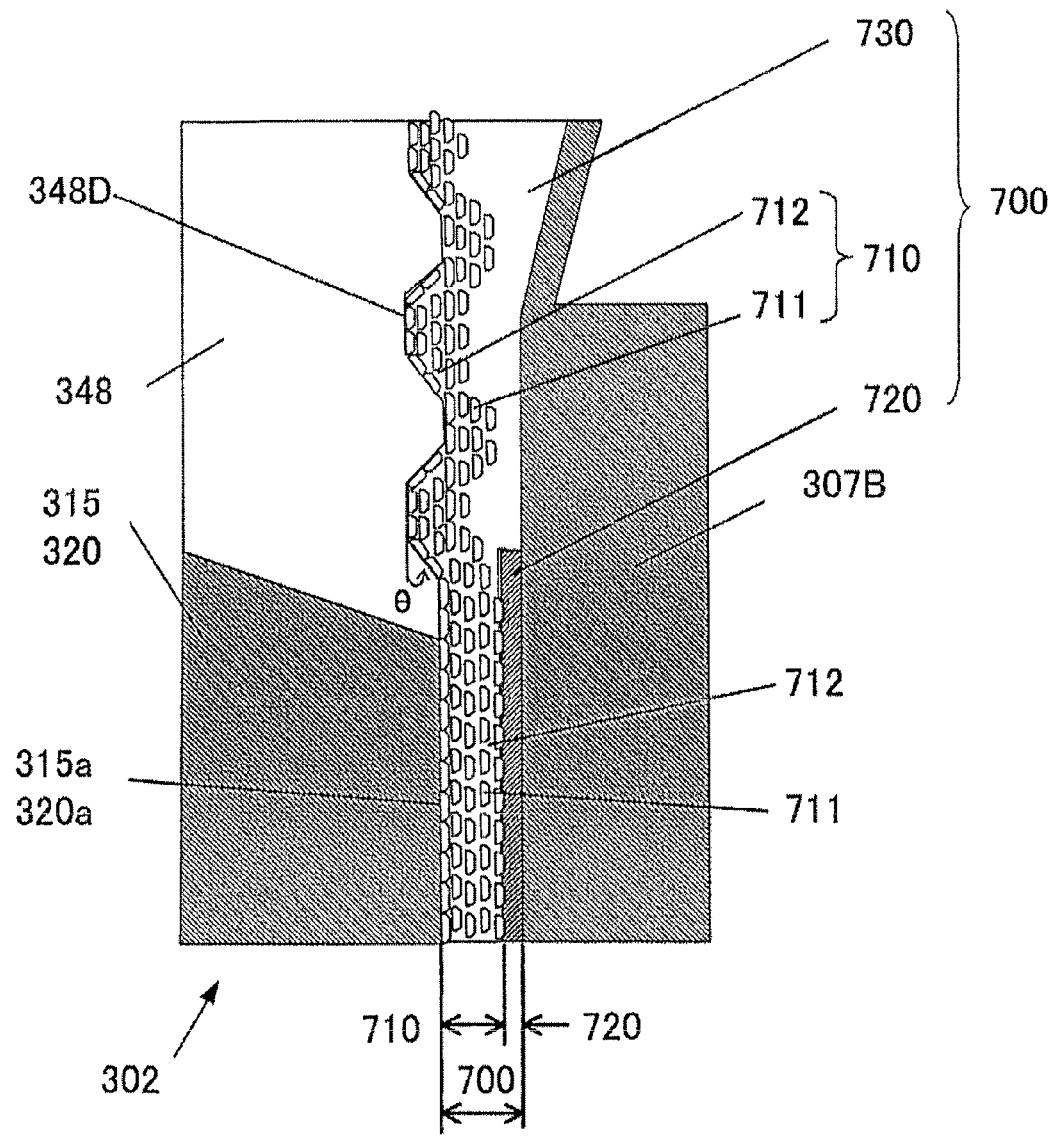
FIG. 12 is an enlarged cross-sectional view of a region XII in FIG. 2.

FIG. 12 is an enlarged cross-sectional view of a region XII in FIG. 2. The insulation layer 700 is provided between the power semiconductor module 302 and the heat dissipation portion 307B. The insulation layer 700 includes a layer formed of a spray coated film 710 formed by spray coating an insulating oxide or ceramic powder, an insulation film 720, which is made of a resin and layered on the spray coated film 710, and an insulating resin layer 730, which is provided on the circumferential side portion of the layered structure of the spray coated film 710 and the insulation film 720. The spray coated film 710 is formed on the surfaces 315a and 320a, which are heat dissipation surfaces, of the conductor plate 315 and 320 of the power semiconductor module 302 and on the surface of the resin sealer 348.

As described above, the plurality of recesses 348D are provided in the surface of the resin sealer 348 of the power semiconductor module 302. Each of the recesses 348D has an inverted trapezoidal cross-sectional shape having a smaller bottom and a smaller opening in terms of planar size (area). In other words, each of the recesses 348D has a side surface so inclined that the planar size of the recess increases in the direction from the bottom toward the opening. The spray coated film. 710 is so formed that the thickness thereof is greater than the depth of the recesses 348D, and the spray coated film 710 fills the recesses 348D to form a seamlessly flat surface on the surface of the resin sealer 348.

The spray coated film 710 is made of an insulating oxide or ceramic material having excellent thermal conductivity (hereinafter referred to as "ceramic or the like"). When partially or completely melted powder of the ceramic or the like is caused to impinge on the conductor plates 315, 320 and the resin sealer 348 (hereinafter referred to as "base"), the ceramic or the like is welded to the surface of the base and forms a flat-shaped portion. Onto a flat portion 711, which is the welded, solidified, flat-shaped portion, is welded another flat portion 711 made of the ceramic or the like. The flat portions 711, which form the spray coated film 710, are thus securely bonded to each other and to the base while forming three-dimensional holes 712 in the spray coated film 710. The largest size of the flat portions 711 is desirably smaller than the planar size (area) of the opening of each of the recesses 348C or 348D. When fillers having a diameter greater than the area of the opening of each of the recesses 348C or 348D are used, a void is created in each of the recesses 348C or 348D and lower the adhesion strength between the spray coated film 710 and the resin sealer 348.

The strength at which the spray coated film 710 adheres to a resin is smaller than the strength at which the spray coated film 710 adheres to aluminum, copper, or any other metal, specifically, the former is about $\frac{1}{100}$ the latter. Therefore, in a structure in which a spray coated film is formed on the metal portion and a resin portion of the power semiconductor module 302, which is the case with the invention, the spray coated film less securely adheres particularly to the resin portion. In contrast, in an embodiment of the invention, the plurality of recesses 348D are formed in the resin sealer 348 of the power semiconductor module 302, and the spray coated film 710 is formed to be thicker than the depth of the recesses 348D and fills the recesses 348D to form a seamlessly flat surface on the surface of the resin sealer 348. The spray coated film 710 is therefore securely bonded to the resin sealer 348 because the adhesion structure described above provides an anchor effect.

The holes 712 formed in the spray coated film 710 are impregnated with an insulating resin. The resin with which the spray coated film 710 is impregnated may be the same as or may differ from the resin of which the insulation film 720 is made. When the same resin of which the insulation film 720 is made is used, the working efficiency can be improved as will be described later.

The insulation film 720 is layered on the spray coated film 710. The insulation film 720 allows the heat dissipation portion 307B to adhere to the conductor plates 315, 320 and the resin sealer 348 of the power semiconductor module 302 via the spray coated film 710. The insulation film 720 is therefore required to be highly thermally conductive and adhesive. A highly adhesive resin material is therefore used to form the insulation film 720. On the other hand, the thermal conductivity can be further improved by using a resin having the ceramic or the like containing therein.

The resin layer 730 is disposed on a circumferential side portion of the layered structure of the spray coated film 710 and the insulation film 720. The power semiconductor module 302 has a structure in which members having a variety of coefficients of thermal expansion, such as the conductor plate 315 (320) made of a metal, the spray coated film 710 impregnated with a resin, the insulation film. 720, and the heat dissipation portion 307B made of a metal, are layered on each other, as shown in FIG. 12. When members having a variety of coefficients of thermal expansion are bonded and adhere to each other as described above, stress concentration occurs in an end portion of the layered structure, and separation occurs in the end portion and advances inward. For example, when the conductor plate 315 is made of Cu, the coefficient of thermal expansion a of which is about 17, and when the module case 304 is made of Al, the coefficient of thermal expansion a of which is about 23. The difference in the coefficient of thermal expansion is likely to cause separation, fracture, and other defects in the layered structure when the temperature of the overall power semiconductor module 302 increases. The resin layer 730 is formed as a stress relaxation member that reduces the magnitude of stress concentration that occurs in the end portion of the layered structure.

[Formation of Insulation Layer]

Figure 13:
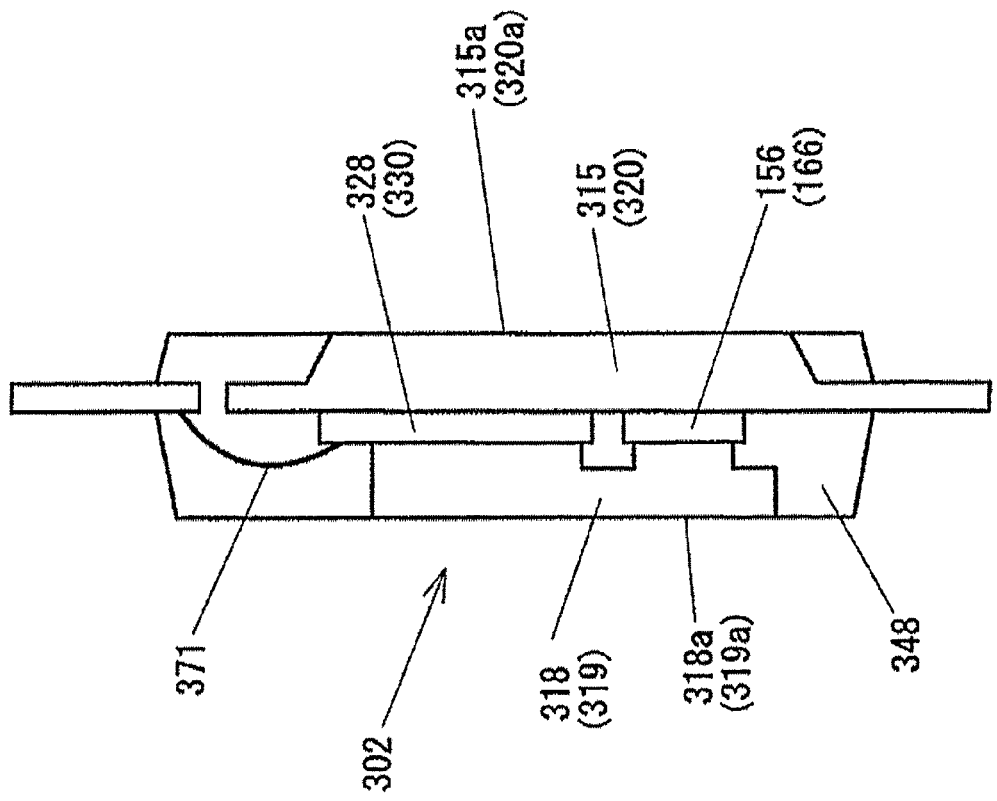
FIG. 13 is a cross-sectional view of the power semiconductor module before a spray coated film is formed.
Figure 14:
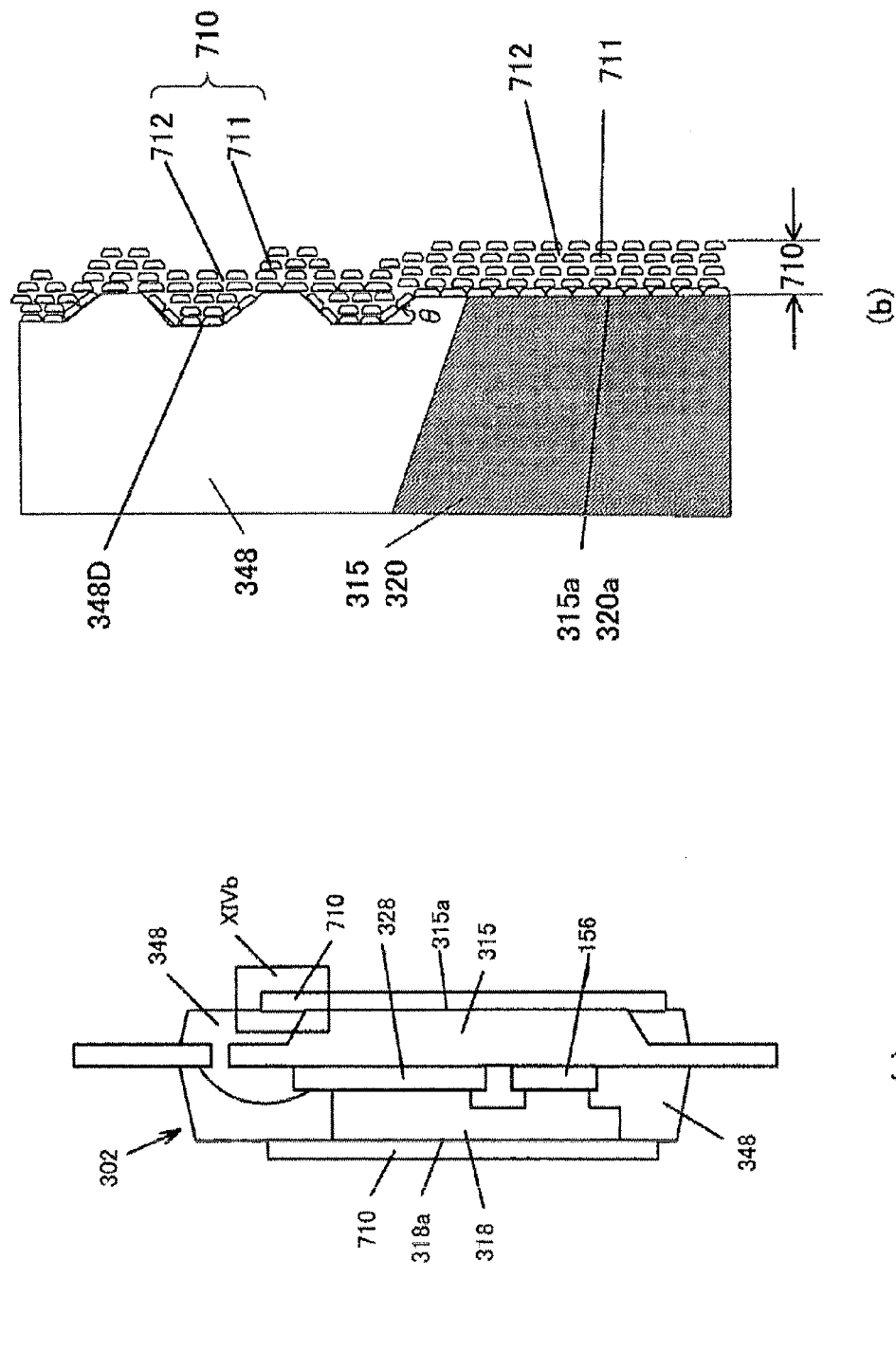
FIG. 14(a) is a cross-sectional view of the power semiconductor module after the spray coated film is formed.
FIG. 14(b) is an enlarged view of a region XIVb in FIG. 14(a).
Figure 15:
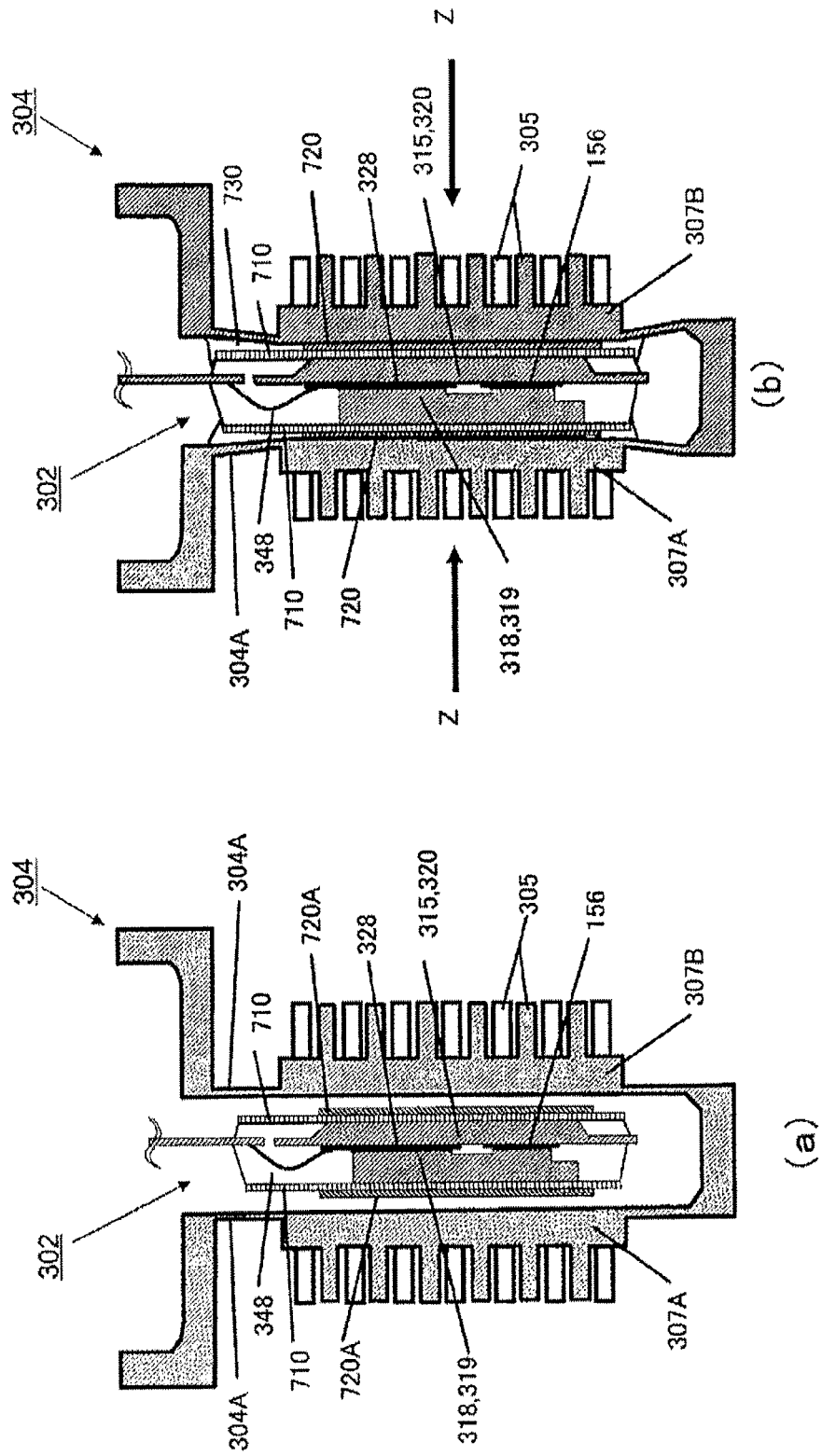
FIG. 15(a) is a cross-sectional view of the semiconductor module and the module case for describing the step of forming the insulation film, and FIG. 15(b) describes the step following the step shown in FIG. 15(a).

A method for forming the insulation layer 700 will next be described with reference to FIGS. 13 to 15. FIG. 13 is a cross-sectional view of the power semiconductor module 302 before the tie bars 732 are cut off and the spray coated film 710 is formed. FIG. 14(a) is a cross-sectional view of the power semiconductor module after the spray coated film is formed, and FIG. 14(b) is an enlarged view of a region XIVb in FIG. 14(a). The conductor plates 315, 320 and the conductor plates 318, 319 are so disposed that they are oriented in the direction perpendicular to the plane of view of FIG. 13. The IGBT 328 and the diode 156 are so disposed that they are sandwiched between the conductor plate 315 and the conductor plate 318, and the IGBT 330 and the diode 166 are so disposed that they are sandwiched between the conductor plate 320 and the conductor plate 319. The components described above are sealed with the resin sealer 348, but the surfaces 315a, 318a, 319a, and 320a of the conductor plates 315, 320, 318, and 319 (surfaces facing away from surfaces to which semiconductor devices are bonded) are exposed through the resin sealer 348. Further, the recesses 348C and 348D are formed in the resin sealer 348, which is substantially flush with the surfaces 315a, 318a, 319a, and 320a. FIG. 13 is a cross-sectional view showing the same portion taken along the line IIIb-IIIb in FIG. 3 and a partial cross-sectional view of the conductor plates 315 and 318.

(Formation of Spray Coated Film)

To form the insulation layer 700 shown in FIG. 12, the spray coated film 710 is first formed on both sides of the power semiconductor module 302, as shown in FIG. 14(a). FIG. 14(b) is an enlarged view of a region XIVb in FIG. 14(a). The spray coated films 710 are so formed that they cover the surfaces 315a, 318a, 319a, and 320a, and a side edge of each of the spray coated films 710 is formed on the resin sealer 348 at a level substantially flush with the corresponding ones of the surfaces described above. The spray coated film 710 is an insulator and is formed by spray coating of oxide or ceramic powder. In the present embodiment, the spray coated film 710 made of a ceramic material is formed in a plasma spray coating process, but any other spray coating process, such as an arc spray coating process or a high-speed frame spray coating process, may be used. At this point, since the power semiconductor module 302 is sealed with the resin sealer 348 as shown in FIG. 14(a), the resin sealer 348 can prevent any physical or chemical effect on the semiconductor devices (IGBTs 328, 330 and diodes 156, 166) and the bonding wires 371 in the spray coating process. It is therefore not necessary to prepare a complicated mask specifically for the spray coating process, whereby a large number of power semiconductor modules can be processed at the same time for high productivity.

An increase in temperature of the conductor plates 315, 320, 318, and 319 in the spray coating process is much smaller than a temperature increase, for example, in a case where the conductor plates 315, 320, 318, and 319 are bonded to a ceramic plate with a wax material, and hence the amounts of fusion, thermal degradation, and thermal deformation, such as warpage, are also smaller. For example, when the spray coated film 710 is formed in a plasma spray coating process, an increase in temperature of the power semiconductor module 302 ranges from about 100 to 180° C. The resin sealer 348, the metal bonding members 160, the IGBTs 328 and 330, or the diodes 156 and 166 are therefore not thermally degraded. Since the bonding of the semiconductor devices by using the metal bonding members 160 is performed in a temperature range from about 220 to 300° C., forming the spray coated films 710 after the bonding operation described above does not affect the bonded portions including the metal bonding members 160.

On the other hand, when the procedure described above is reversed, that is, when the spray coated film 710 is formed on the conductor plate 315 and then the semiconductor devices are bonded, the temperature at which the semiconductor devices are bonded ranges from about 220 to 300° C., which is higher than a temperature after the temperature increase in the spray coated film formation process, resulting in greater thermal stress produced in the layered structure formed of the spray coated film 710, which has a small coefficient of thermal expansion, and the conductor plates 315, 320, 318, and 319, which have a large coefficient of thermal expansion, than thermal stress produced in the spray coating process. That is, the procedure in which the semiconductor devices are bonded and then the spray coated films 710 are formed allows the thermal stress to decrease.

Further, chemically roughing the surfaces 315a, 318a, 319a, and 320a, on each of which the spray coated film 710 is formed, of the conductor plates 315, 320, 318, and 319 in an etching process allows an improvement in the bonding strength between each of the conductor plates 315, 320, 318, 319 and the spray coated film 710. In this case as well, since the power semiconductor module 302 is sealed with the resin sealer 348 as shown in FIG. 14(a), the resin sealer 348 can prevent any physical or chemical effect on the semiconductor devices (IGBTs 328, 330 and diodes 156, 166) and the bonding wires 371, whereby high productivity is achieved.

Powder used to form the spray coated film 710 is preferably ceramic powder having high thermal conductivity, such as alumina, silica, magnesia, beryllia, or any other oxide, an aluminum nitride, a silicon nitride, a boron nitride, or any other nitride, or a silicon carbide or any other carbide. Further, one of the single element compositions described above is not necessarily employed, and a complex composition that is a combination of a single element composition or an oxide and a nitride or a carbide may be employed, or powder of mixed materials may be employed.

Powder made of an oxide provides a large bonding force between the flat portions 711, each of which is a spray coated portion, because the oxidized layer on the surface of the powder particles functions as a binder. Powder made, for example, of a nitride provides a large bonding force between the flat portions 711 because when melted powder is spray coated, an oxide is formed on the surface of the powder particles and the oxide increases the bonding force.

The spray coated film 710 formed on the conductor plates 315, 320, 318, and 319 and the resin sealer 348 is an assembly of the flat portions 711, which are formed when the ceramic material described above solidifies, as shown in FIG. 14(b), and in the assembly, the flat portions 711 are deposited to form layers. When partially or completely melted ceramic powder is caused to impinge on the base, for example, in a plasma spray coating process, the ceramic is welded to the surface of the base and forms flat-shaped portions. Onto each of the flat portions 711, which is the welded, solidified, flat-shaped portion, is welded another flat portion 711.

The interface between the flat portions 711, the interface between the flat portions 711 and the conductor plates 315, 320, 318, and 319, and the interface between the flat portions 711 and the resin sealer 348, in which the recesses 348C and 348D are formed, form three-dimensional spray coated surfaces and are strongly bonded to each other. Therefore, after the spray coated film 710 is formed on the power semiconductor module 302, separation, chipping, and other defects are unlikely to occur in the spray coated film. 710 when the power semiconductor module 302 and the auxiliary power module 600 are bonded to each other in the metal bonding process, such as a TIG welding process, via the connection portion 370 as described above (see FIG. 3).

The planar size (area) of each of the flat portions 711, which form the spray coated film 710, needs to be smaller than the planar size of each of the recesses 348C and 348D, as shown in FIG. 12, in order to prevent creation of gaps between the flat portions 711 and the recesses 348C, 348D of the resin sealer 348 in the spray coating process to increase the bonding strength between the spray coated film. 710 and the resin sealer 348. In other words, the planar size of each of the recesses 348C and 348D of the resin sealer 348 is desirably greater than the planar size of each of the flat portions 711, which form the spray coated film 710.

Since masking allows partial formation of the spray coated film 710, the spray coated film 710 may be formed after the power semiconductor module 302 and the auxiliary power module 600 are bonded to each other in the metal bonding process. In this case, however, to avoid the separation due to thermal stress produced during use of the power module, the recesses 348C and 348D are also preferably provided in the surface of the resin sealer 348, on which the spray coated film 710 is formed, to increase the adhesion strength between the spray coated film 710 and the resin sealer 348. Further, as shown in FIG. 14(b), to increase the proportion of the flat portions 711 or spray coated portions that successfully adhere to the resin sealer 348 in the spray coating process so that the first layer formed of flat portions 711 is not defective, the inclination angle of the surface on which the spray coated film is deposited needs to be greater than 45° but smaller than 135°. To this end, the inclination angle θ of the recesses 348C and 348D to the surface on which the spray coated film is deposited is preferably greater than 0° but smaller than 45° (or greater than 135° but smaller than 180°). Further, setting the depth of the recesses 348C and 348D to be smaller than the thickness of the spray coated film 710 to be formed therein can prevent fracture of the spray coated film 710 along the recessed and protruding portion of the resin sealer 348.

(Formation of Insulation Film and Resin Layer)

A method for forming the insulation film 720 and the resin layer 730, which form the insulation layer, will next be described. FIG. 15(a) describes the step of forming the insulation film, and FIG. 15(b) describes the step following the step shown in FIG. 15(a). As shown in FIG. 14, after the spray coated film 710 is formed on both sides of the power semiconductor module 302, the insulation film 720 is formed on each of the spray coated films 710, the spray coated film 710 is impregnated with a resin, and the resin layer 730 is formed in a portion outside the spray coated film 710 and the insulation film 720, as shown in FIG. 12. The layers described above can be formed in a single process. A method of the formation will be described below.

The spray coated film 710 is formed on both sides of the power semiconductor module 302, and then an insulation sheet 720A is placed on each of the spray coated films 710, as shown in FIG. 15(a). The insulation sheet 720A is a sheet-shaped member formed of a resin base containing fillers made of the ceramic or the like, and the volume of insulation sheet 720A is set to be greater than the volume of insulation film 720 to be formed. That is, the insulation sheet 720A is formed to be thicker than the insulation film 720. The power semiconductor module 302 on which the insulation sheets 720A are formed is inserted into the module case 304. When the power semiconductor module 302 is inserted into the module case 304, the power semiconductor module 302 can be positioned by fixing the wiring insulator 608 (see FIG. 3) of the auxiliary power module 600, to which the power semiconductor module 302 has been bonded via the connection portion 370, to the flange 304B of the module case 304.

Pressure is then applied to the heat dissipation portions 307A and 307B in Z directions as indicated by the arrows in FIG. 15(b) to deform the thin-walled portions 304A toward the interior of the case so that the heat dissipation portions 307A and 307B come into intimate contact with the power semiconductor module 302. In this process, the insulation sheets 720A in contact with the power semiconductor module 302 under the pressure form the insulation films 720. In the process during the contact under the pressure, since each of the insulation sheets 720A is compressed under the pressure to the thickness of the insulation film 720, the resin component of the insulation sheet 720A impregnates the holes 712 in the spray coated film 710 and leaks out of the circumferential side portion of the spray coated film 710. The resin component of the insulation sheet 720A having leaked out of the circumferential side portion of the spray coated film 710 forms the resin layer 730.

For example, assume that the amount of fillers contained in the insulation sheet 720A is 20 vol %. It is also assumed that the size of each of the fillers is smaller than the size of each of the recesses in the surface of the spray coated film 710 but greater than each of the holes 712 in the spray coated film 710. It is further assumed that the resin component of the insulation sheet 720A impregnates the holes 712 in the spray coated film 710 and that the insulation sheet 720A is so compressed under the pressure that the resin flows out of the circumferential side portion and the amount of resin component in the insulation sheet 720A is halved. In this case, assuming that only the resin component of the insulation sheet 720A flows out of the circumferential side portion, no filler is present in the resin layer 730, and the proportion of the fillers contained in the insulation film 720 increases to about 40 vol %. On the other hand, assuming that part of the fillers contained in the insulation sheet 720A flows out of the circumferential end portion along with the resin component of the insulation sheet 720A, the fillers are present also in the resin layer 730. The method for forming the resin layer 730 is not limited to the method using the insulation sheet 720A but may be a method in which a resin containing fillers is deposited on the spray coated film 710, for example, in an application or dip process.

The resin that forms the insulation film 720 may, for example, be a resin based on a highly adhesive phenol-based, acryl-based, polyimide-based, polyamide-imide-based, epoxy-based, silicon-based, bismaleimide-triazine-based, or cyanate-ester-based resin. In particular, a highly adhesive bismaleimide-triazine-based, polyamide-imide-based, polyimide-based, cyanate-ester-based, epoxy-based, or phenol-based resin is preferably used. In this case, separation is unlikely to occur after the adhesion of the insulation film 720, whereby the life of the power semiconductor module 302 is prolonged.

Further, to efficiently transfer heat generated by the semiconductor devices (IGBTs 328, 330 and diodes 156, 166) to the heat dissipation portions 307A and 307B of the module case 304, the insulation films 720 need to have high thermal conductivity. To this end, any of the resins described above with highly thermally conductive fillers contained therein is used to form the insulation film. 720 for improvement in thermal conductivity. The fillers contained in the insulation film 720 preferably provide insulation and are preferably made of a highly thermally conductive ceramic material, such as alumina, silica, magnesia, beryllia, or any other oxide, an aluminum nitride, a silicon nitride, a boron nitride, or any other nitride, a silicon carbide or any other carbide. However, since the insulation sheet 320A 720A, which is impregnated with a resin, functions as an insulation film, the insulation film 720 may instead contain fillers having electric conductivity, such as silver, copper, a soldering material, and carbon.

The range over which the insulation films 720 are formed is preferably broader than the areas of the surfaces 315a and 318a of the conductor plates 315 and 318 (see FIG. 14) to maximize the heat dissipation performance. However, since the thermal conductivity of the resin sealer 348 is much smaller than the thermal conductivity of the conductor plates 315, 320, 318, and 319, the range over which the insulation films 720, which have high thermal conductivity, are formed only needs to be slightly broader than the conductor plates 315, 320, 318, and 319, as shown in FIG. 15(a).

A description will next be made of the impregnation of the spray coated film 710 with a resin. The spray coated film 710 can be filled with a ceramic material up to a filling factor of about 95%. It is, however, noted that since the three-dimensional holes 712 are formed in the spray coated film 710 as shown in FIG. 12, the spray coated film 710 before it is impregnated with a resin has a significantly poor insulation characteristic and low thermal conductivity due to an effect of the holes 712. To address the problem, a hole sealing process needs to be carried out by using an insulating material. Further, three-dimensional through holes formed in the spray coated film 710 cause a problem of high fracture sensitivity to thermal stress produced in association with an increase in temperature if no measures are taken. In view of the facts described above, the problems can be solved by impregnating the spray coated film 710 with a resin having thermal conductivity higher than that of air and having a coefficient of thermal expansion greater than that of the ceramic material that forms the spray coated film 710.

Impregnating the holes 712 in the spray coated film 710 with a resin allows improvement in insulation, heat dissipation, and heat cycle resistance. The resin with which the holes are impregnated is preferably the same as the resin used to form the insulation film 720 because high affinity is achieved when the resin cures and an improved adhesive characteristic is achieved accordingly. Further, when the impregnation is performed, the holes 712 in the spray coated film 710 preferably undergo an etching or coupling process for more intimate contact between the holes 712 and the resin with which the holes 712 are impregnated.

As described above, the resin layer 730 has a function of lowering the magnitude of stress produced in the layered structure formed of the insulation layer 700, which has a layered film structure, the conductor plate 315, and the heat dissipation portion 307B. In the example shown in FIG. 12, the resin layer 730 covers the ends of the insulation film 720 and the spray coated film 710 and extends along the outer circumferences of the films. In the present embodiment, the resin layer 730 is made of the same resin as that of the insulation film 720. However, lowering the content of the fillers in the resin layer 730 as compared to that of the insulation film 720 allows the thermal conductivity of the resin layer 730 to be lower than, the modulus of elasticity thereof smaller than, or the adhesion strength thereof greater than those of the spray coated film 710 impregnated with a resin and the insulation film 720 containing the fillers.

Since the resin layer 730 is disposed between the resin sealer 348 and a peripheral portion of the heat dissipation portion 307B, the low thermal conductivity of the resin layer 730 in the insulation layer 700 hardly affects the heat dissipation characteristic of the power semiconductor module 302. Providing the recesses 348C and 348D in the resin sealer 348 and forming the spray coated film 710 in such a way that the spray coated film 710 reflects the recessed and protruding shape of the recesses 348C and 348D allow an increase in the area where the resin layer 730 adheres to the spray coated film 710. Further, increasing the thickness of the resin layer 730 allows enhancement in the stress relaxation effect.

After the insulation layer 700 is formed, filling and sealing the module case 304 with a sealing resin 351 (see FIG. 2) can ensure an insulation distance necessary between the connection portion 370 and the module case 304 in a stable manner. The sealing resin 351 can, for example, be a resin based on a novolac-based, multifunctional-based, or biphenyl-based epoxy-based resin. The epoxy resin may contain, for example, $SiO_2$, $Al_2O_3$, AlN, BN, or any other ceramic material, a gel material, or a rubber material so that the coefficient of thermal expansion of the epoxy resin approaches those of the module case 304 and the conductor plates 315, 320, 318, and 319. As a result, the differences in the coefficient of thermal expansion between the members described above decrease, and hence the magnitude of thermal stress produced in association with an increase in temperature in an environment where the power module 300 is used significantly decreases, whereby the life of the power module 300 can be prolonged.

Figure 16:
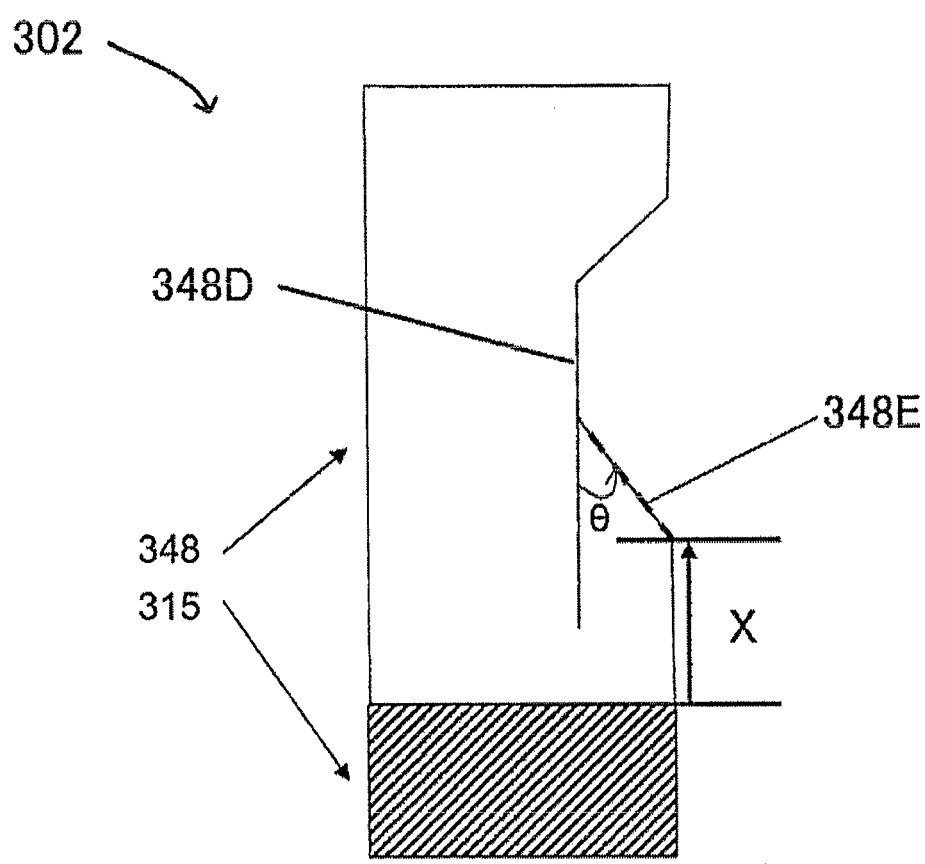
FIG. 16 is an enlarged cross-sectional view showing the shape of a recess of a resin sealer.
Figure 17:
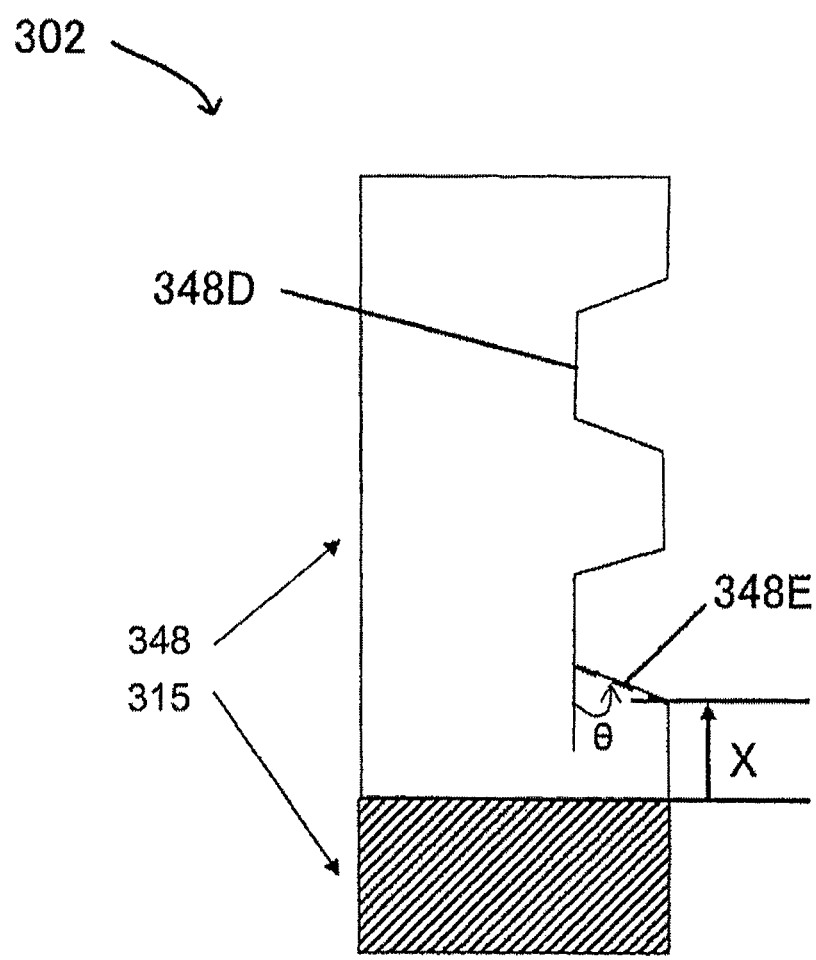
FIG. 17 is an enlarged cross-sectional view showing the shape of the recess having an inclination angle of the surface where the spray coated film is deposited different from the inclination angle shown in FIG. 16.

A description will next be made of a distance X between the recesses 348C, 348D formed in the resin sealer 348 and the ends of the conductor plates 315, 320, 318, 319, where the magnitude of an electric field is maximized. FIG. 16 is an enlarged cross-sectional view of the ends of the conductor plates 315, 320, 318, and 319 and the resin sealer 348 in the power module according to the first embodiment. A description has been made of the necessity of setting the inclination angle θ of a side surface 348E of each of the recesses 348C and 348D where the spray coated film is deposited to be greater than 0° but smaller than 45° in order to prevent the spray coated film 710 from failing to adhere to the side surface. However, to further increase the adhesion strength between the spray coated film 710 and the resin sealer 348, the inclination angle θ of the side surface 348E where the spray coated film is deposited is preferably greater than 45°, as shown in FIG. 17. In this case, the number of recesses 348C and 348D per unit area of the resin sealer 348 can be increased, and the resultant stronger anchor effect can increase the magnitude of a shear force that prevents advance of the separation. In this case, however, voids are more likely to be formed due to failure of adhesion of the spray coated film 710 to the side surface 348E, as described above.

Since formation of voids in the vicinity of the conductor plates 315, 320, 318, and 319 where electric field concentration occurs causes partial discharge to be produced by the operating voltage of the power module, and the partial discharge degrades the resin sealer 348, resulting in dielectric breakdown. It is therefore necessary to prevent the formation of the voids. Let now X be the distance from the conductor plates 315, 320, 318, and 319 to the side surface 348E, that is, the distance from the ends of the conductor plates 315, 320, 318, and 319 to the ends of the recesses 348C and 348D.

Figure 18:
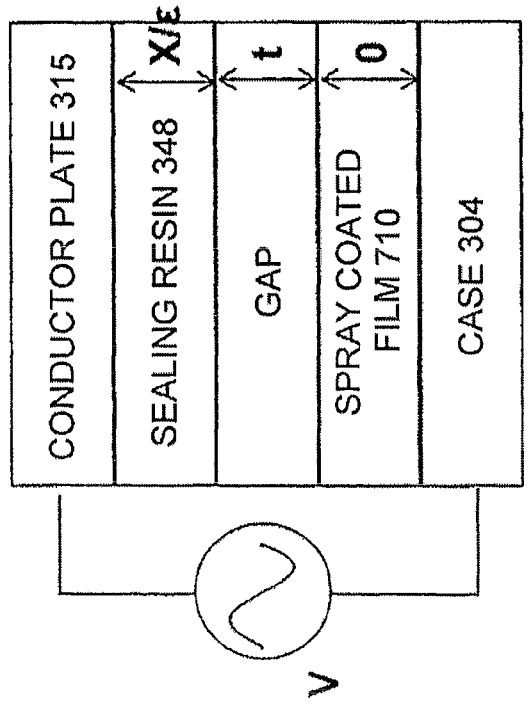
FIG. 18 shows a partial discharge initiation model for estimating the distance from the end of a conductor plate to the end of the recess.

FIG. 18 shows a partial discharge initiation model for estimating a safest distance (length) X. The worst case of a partial discharge initiation mechanism is a case where a maximum voltage (maximum rating) V is applied to the power module 300, a gap having a size t is formed at the end of the recess 348C or 348D closest from the ends of the conductor plates 315, 320, 318, and 319 or in a position separated therefrom by the distance X, and the thickness of the insulation layer 700 is zero (no discharge occurs irrespective of thickness of insulation layer). Now, lets be the dielectric constant of the sealing resin, and Ui be a discharge initiation voltage at which discharge is initiated in the gap. A partial discharge initiation voltage Vi at which partial discharge occurs is expressed by the following Expression (1):

$$Vi = Ui(1 + X/t\in)$$  Expression (1)

Expression (1) can be rewritten to Expression (2):

$$X = t\in\{(V_i/-U_i) - 1\}$$  Expression (2)

Figure 19:
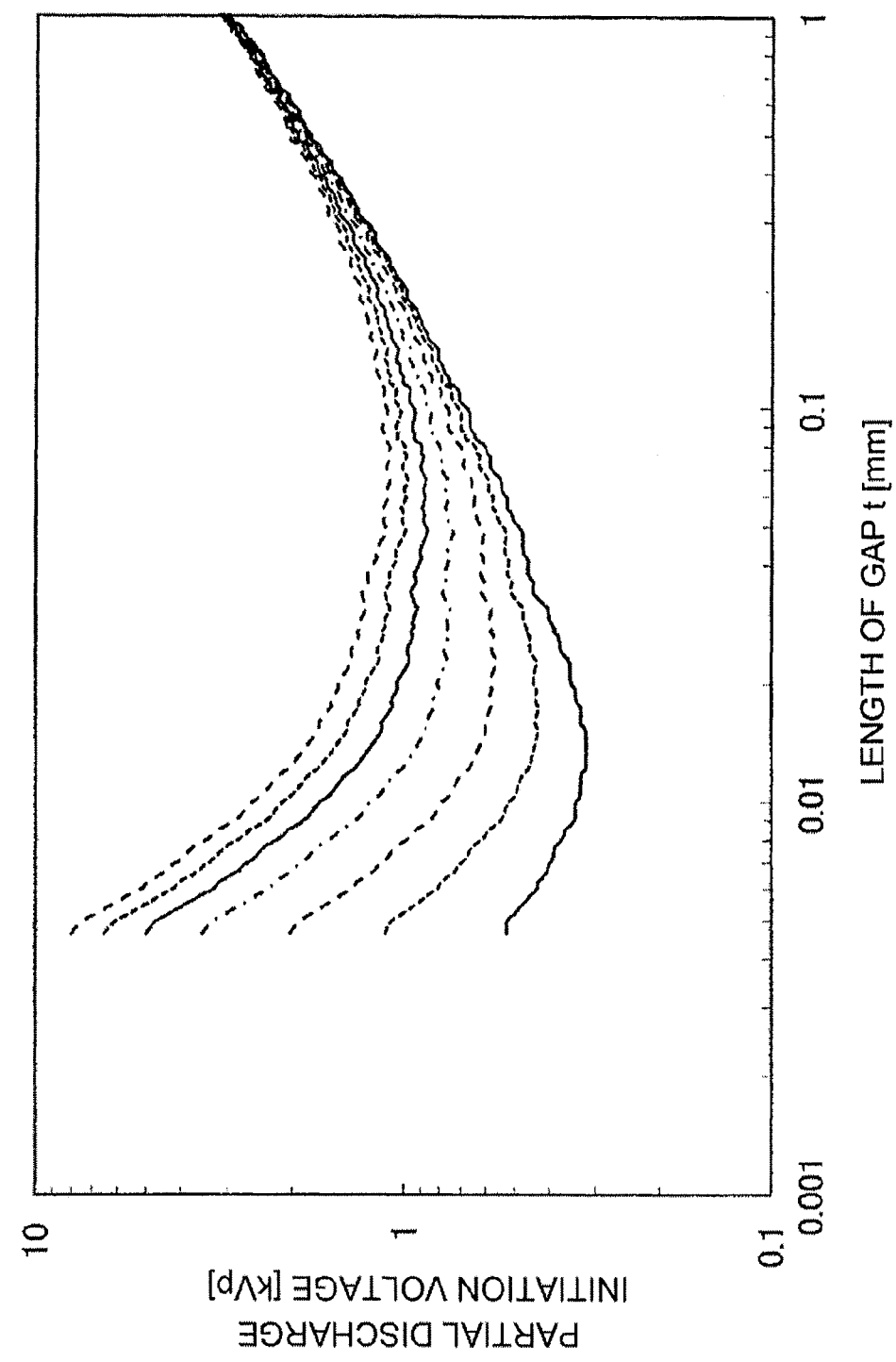
FIG. 19 shows Paschen's curves under the following conditions: a pressure of 0.685 atm; a temperature of 120° C.; and a dielectric constant $\in$ of 3.8.
Figure 20:
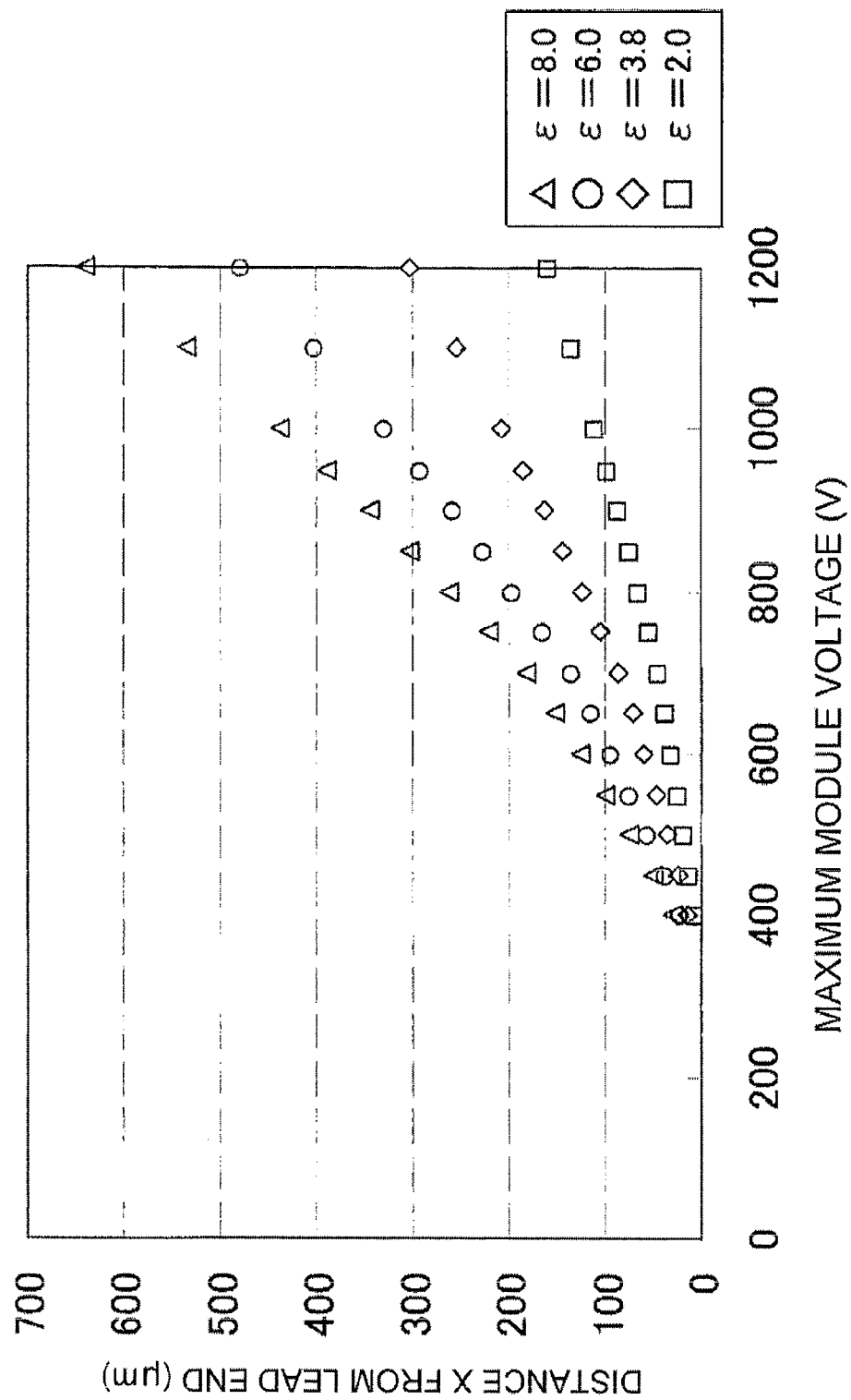
FIG. 20 shows characteristic graphs illustrating the relationship of the distance from the end of the conductor plate to the end of the recess versus a maximum voltage applied to the power semiconductor module.

$U_i$ changes with the atmospheric pressure and the temperature, and a pressure of 0.685 atm and a temperature of 125° C. are estimated to be a vehicle operation environment that is most likely to cause discharge. Under the condition described above, FIG. 19 shows Paschen's curves for a variety of distances X from the ends of the conductor plates 315, 318, and 319 (hereinafter "318" is representatively used) to the ends of the recesses 348C and 348D of the resin sealer 348 (ends closest to conductor plate 318) assuming that the dielectric constant $\in$ of the resin sealer 348 is 3.8 and the gas present in the gap is air. The horizontal axis of FIG. 19 represents the size t of the gap, and the vertical axis represents the partial discharge initiation voltage. It is found from the curves that the partial discharge initiation voltage increases with X although the size t that is likely to cause discharge varies when the distance X changes. The relationship described above can be used to derive a relationship of the distance X that causes no discharge irrespective of the size of the gap and the thickness of the insulation layer 700 versus a module maximum voltage. FIG. 20 shows cases where the dielectric constant $\in$ of the resin sealer 348 is set at 2.0, 3.8, 6.0, and 8.0. As shown in FIG. 20, when the dielectric constant $\in$ of the resin sealer 348 is 3.8 by way of example, the adhesion strength can be increased and the life of the power module 300 can therefore be prolonged without degradation in insulation characteristic thereof by setting X at 50 µm or greater in a case where an expected voltage is 500 V or 150 µm or greater when an expected voltage is 800 V.

In FIG. 20, when the dielectric constant of the resin sealer 348 is smaller than 3.8, the correlation curve shifts downward, resulting in a decrease in X. On the other hand, when the dielectric constant $\in$ of the resin sealer 348 is greater than 3.8, the correlation curve shifts upward, resulting in an increase in X. Using a resin having a dielectric constant $\in$ smaller than 3.8 therefore allows the distance X to be smaller than that in the example described above.

Further, in the power semiconductor module 302, which needs a higher insulation characteristic, heat dissipation characteristic, and heat cycle resistance, separation of the spray coated film 710 from the side surface 348E at the time of formation of the spray coated film 710 is corrected by the following resin impregnation. However, when the spray coated film having adhered to the side surface before the impregnation separates from the side surface after the impregnation, corona discharge occurs and cause degradation. Setting the distance X based on the results shown in FIG. 20 therefore improves reliability of the power semiconductor module even when resin impregnation is performed.

The embodiment of the power semiconductor module according to the invention provides the following advantageous effects: (1) A plurality of recesses 348C and 348D are provided in the resin sealer 348, which surrounds and seals the conductor plates 315, 320, 318, and 319, on which the semiconductor devices are mounted, and the spray coated film 710 is formed on the surface of the resin sealer 348 including the recesses 348C and 348D. The adhesion strength between the spray coated film 710 and the resin sealer 348 can therefore be improved.

(2) The planar size of each of the recesses 348C and 348D formed in the resin sealer 348 is set to be greater than the planar size of each of the flat portions 711, which form the spray coated film 710. The flat portions 711 therefore do not partially or completely block the recesses 348C or 348D in the spray coated process, and no large gap is created between the flat portions 711 and the resin sealer 348, whereby the bonding strength between the spray coated film. 710 and the resin sealer 348 can be further improved.

(3) Each of the recesses 348C and 348D formed in the resin sealer 348 is so shaped that the cross-sectional shape thereof is an inverted trapezoid having a smaller bottom and a larger opening in terms of planar size. As a result, the probability of creation of voids between the flat portions 711 and the resin sealer 348 in the spray coating process can be lowered.

(4) Since the insulation film 720, which has a small content of the ceramic or the like, is formed on the spray coated film 710, the thermal conductivity between the power semiconductor module 302 and the heat dissipation portions 307A and 307B of the module case 304 can be increased. Further, since a resin base material that provides high adhesion is used to form the insulation film 720, the adhesion strength between the insulation film 720 and the heat dissipation portions 307A, 307B can be increased.

(5) The insulation sheet 720A containing the ceramic or the like is attached under pressure, and the holes 712 in the spray coated film 710 are impregnated with the resin component that leaks out of the insulation sheet 720A. The insulation characteristic and thermal conductivity of the spray coated film 710 can therefore be improved. The strength of the spray coated film 710 against cracks and other defects can also be improved. Further, since the insulation sheet 720A is attached under pressure to form the insulation film 720, the impregnation of the holes 712 in the spray coated film 710 and the formation of the insulation film 720 are performed at increased working efficiency.

(6) Since the resin layer 730 containing no filler or a very small amount of filler is formed on the circumferential side portion of the insulation film 720 and the spray coated film 710, stress produced in the layered structure formed of the insulation layer 700, the conductor plate 315, and the heat dissipation portion 307B can be reduced. In this case, providing the recesses 348C and 348D in the resin sealer 348 and forming the spray coated film 710 in such a way that the spray coated film 710 reflects the recessed and protruding shape of the recesses 348C and 348D allow an increase in the area where the resin layer 730 adheres to the spray coated film 710. Further, increasing the thickness of the resin layer 730 enhances the stress relaxation effect.

(7) The recesses 348C and 348D formed in the resin sealer 348 are set apart by a predetermined distance from the ends of the conductor plates 315, 320, 318, and 319. As a result, partial discharge will not occur even when voids are created in the recesses 348C and 348D of the resin sealer 348. In particular, setting the length from the end of the conductor plate 318 to the ends of the recesses 348C and 348D to be greater than the distance X calculated by using Expression (2) reliably suppress partial discharge even when voids having a worst-case size in partial discharge conditions are formed.

(8) The inclination angle θ of the side surface 348E, where the spray coated film is deposited, of each of the recesses 348C and 348D formed in the resin sealer 348 is set at 45° or greater to increase the number of recesses 348C and 348D per unit area. As a result, the adhesion strength between the spray coated film 710 and the resin sealer 348 can be further increased. It is noted that the power semiconductor module 302 according to the invention can be formed differently from the embodiment described above.

Other embodiments of the invention will be described below.

Second Embodiment

Figure 21:
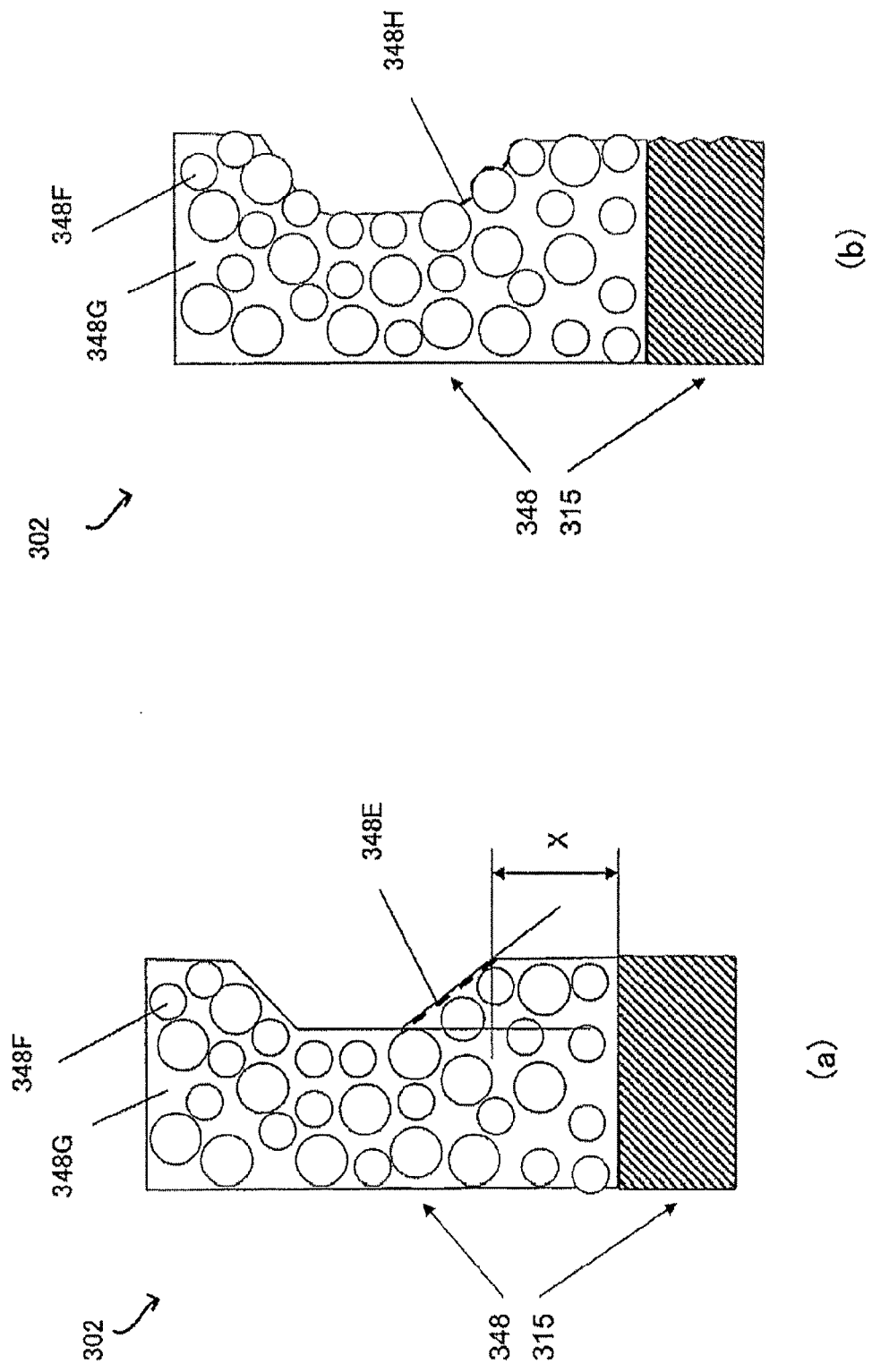
FIG. 21(a) is a cross-sectional view of a structure in which fillers contained in the resin sealer are not exposed through the surface of the recess.
FIG. 21(b) is a cross-sectional view of a structure according a second embodiment of the invention in which the fillers contained in the resin sealer are exposed through the surface of the recess.

FIG. 21(a) is a cross-sectional view of a structure in which the fillers contained in the resin sealer are not exposed through the surface of each of the recesses, and FIG. 21(b) is a cross-sectional view of a structure according a second embodiment of the invention in which the fillers contained in the resin sealer are exposed through the surface of each of the recesses. As shown in FIG. 21(a), the resin sealer 348 is made of a resin 348G based on a novolac-based, multifunctional-based, biphenyl-based epoxy resin containing ceramic fillers 348F made, for example, of $SiO_2$, $Al_2O_3$, AlN, and BN in order to lower the magnitude of thermal stress produced when the semiconductor devices (IGBTs 328, 330 and diodes 156, 166), the conductor plates 315, 320, 318, and 319, and the module case 304, and other components having different coefficients of thermal expansion are connected to each other. The overall coefficient of thermal expansion is thus controlled. In the resin sealer 348, the resin 348G called a skin layer is present along the surface of the resin sealer 348 and the interfaces between the resin sealer 348 and the conductor plates 315, 320, 318, and 319.

When the spray coated film 710 is formed on the surface of the resin 348G, the interface between the spray coated film 710 and the resin sealer 348 is the skin layer made of the resin 348G. The adhesion strength between the resin sealer 348 and the spray coated film 710 therefore reflects the adhesion strength between the resin 348G and the spray coated film 710. In contrast, performing blasting preferentially removes the resin 348G, and the ceramic fillers 348F made, for example, of $SiO_2$, $Al_2O_3$, AlN, and BN are exposed through the surface of the resin sealer 348, as shown in FIG. 21(b). As a result, the area where the fillers 348F adhere to the spray coated film 710 increases and the adhesion strength between the spray coated film 710 and the resin sealer 348 increases accordingly. In general, the adhesion strength between the spray coated film 710 and a ceramic material is 10 to 20 times greater than the adhesion strength between the spray coated film 710 and a resin material, and the exposed ceramic fillers 348F achieve the adhesion strength in the latter case.

On the other hand, to increase the proportion of the flat portions 711 or spray coated portions that successfully adhere to the resin sealer 348 in the spray coating process so that the first layer formed of flat portions 711 is not defective as described above, the inclination angle θ of the side surface 348E where the spray coated film is deposited is preferably set at an angle greater than 0° but smaller than 45°. However, the blasting produces a region where the inclination angle does not fall within the range greater than 0° but smaller than 45° in a sidewall surface 348H of each of the recesses 348C and 348D, as shown in FIG. 21(b). At the sidewall surface 348H, the adhesion strength increases but voids are likely to be produced. To address the problem, using the predetermined distance X shown in FIG. 20 can prevent degradation in insulation characteristic. Further, depending on conditions in the blasting process, the resin sealer 348 is more likely to be scraped than the conductor plates 315, 320, 318, and 319, resulting in a stepped portion in some cases. In such cases, fracture due to the stepped portion can be avoided by setting the amount of recess in the resin sealer 348 to be smaller than the thickness of the spray coated film 710, which is formed after the blasting. Further, the corners of each of the conductor plates 315, 320, 318, and 319 are preferably tapered or rounded to avoid fracture and electric field concentration.

Third Embodiment

Figure 22:
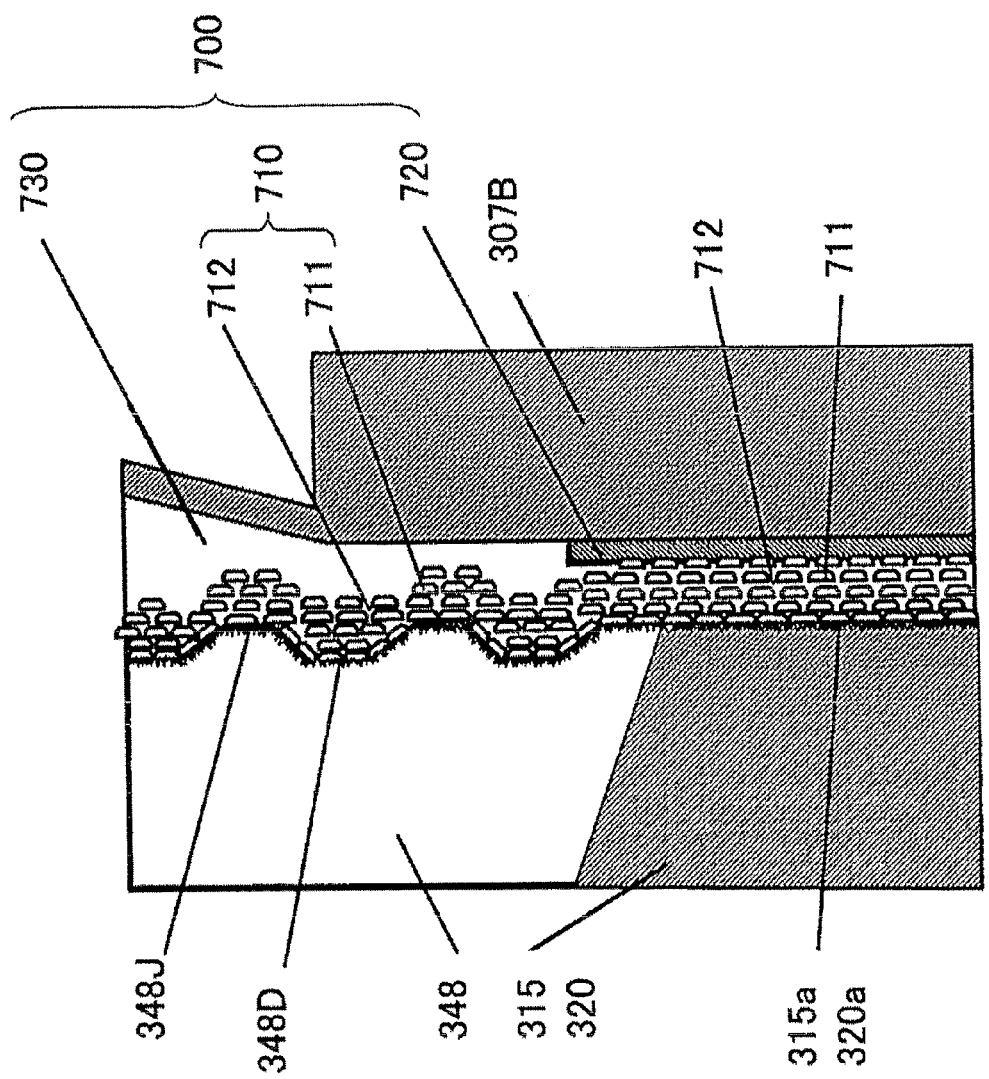
FIG. 22 shows a third embodiment of the invention and is an enlarged cross-sectional view showing a key portion of a power semiconductor module.

FIG. 22 shows a third embodiment of the invention and is an enlarged cross-sectional view showing a key portion of a power semiconductor module. FIG. 22 shows the portion of the power semiconductor module 302 that corresponds to the portion shown in FIG. 12 in the first embodiment. The third embodiment differs from the first embodiment in that minute recesses and protrusions are formed in the surfaces 315a and 320a of the conductor plates 315 and 320 and a surface 348J of the resin sealer 348.

The minute recesses and protrusions are so formed that the planar size of each of them is smaller than the planar size of each of the flat portions 711, which form the spray coated film 710. This means that each of the minute recesses and protrusions has a smaller planar size than the recesses 348C and 348D formed in the spray coated film 710. The minute recesses and protrusions are formed, for example, in a blasting process, a dry etching process using a CVD apparatus, or a wet etching process using an etchant. Forming the minute recesses and protrusions in the surfaces 318a and 319a, which are heat generating surfaces, of the conductor plates 318 and 319 and the surface 348J of the resin sealer 348 can increase the adhesion strength between the surfaces described above and the spray coated film 710. Further, resin burrs and other unnecessary portions left after the formation of the resin sealer 348, for example, in the transfer mold process can be removed. In the above description, the structure in which the minute recesses and protrusions are provided in the surfaces 315a and 320a of the conductor plates 315 and 320 and the surface 348J of the resin sealer 348 is presented by way of example. The minute recesses and protrusions may instead be provided only in the surfaces 315a, 320a of the conductor plates 315 and 320 or in the surface 348J of the resin sealer 348.

Fourth Embodiment

Figure 23:
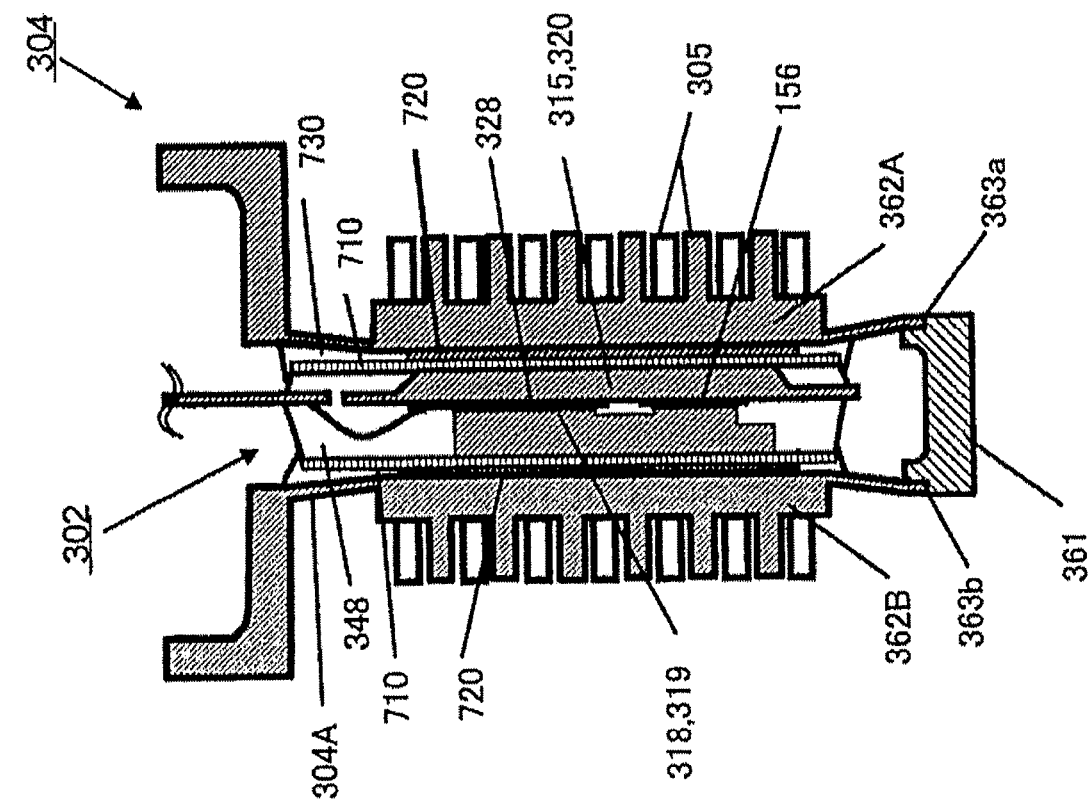
FIG. 23 shows a fourth embodiment of the invention and is a cross-sectional view showing a state in which the power semiconductor module is accommodated in the module case.

FIG. 23 shows a fourth embodiment of the invention and is a cross-sectional view showing a state in which the power semiconductor module 302 is accommodated in the module case 304. FIG. 23 shows a state corresponding to the state shown in FIG. 15(b) in the first embodiment. The fourth embodiment is characterized in that the module case 304 is formed of a case body (connection section) 361 and heat dissipation portions 362A and 362B formed separately from the case body 361 and having a large number of fins 305. The case body 361 of the module case 304 has openings 363a and 363b, which are formed on the front and rear sides respectively and into which the heat dissipation portions 362A and 362B are fit respectively. The heat dissipation portions 362A and 362B are bonded to the edges of the openings 363a and 363b of the case body 361, for example, in an ultrasonic welding process or a TIG welding process. The other components are the same as those in the first embodiment, and the corresponding members and portions have the same reference characters and will not be described.

Fifth Embodiment

Each of the embodiments described above has been described with reference to the power module 300, in which the power semiconductor module 302 is inserted into the CAN-type module case 304. The fifth embodiment shows a case where the power semiconductor module according to the invention is used in a power module having a different structure.

Figure 24:
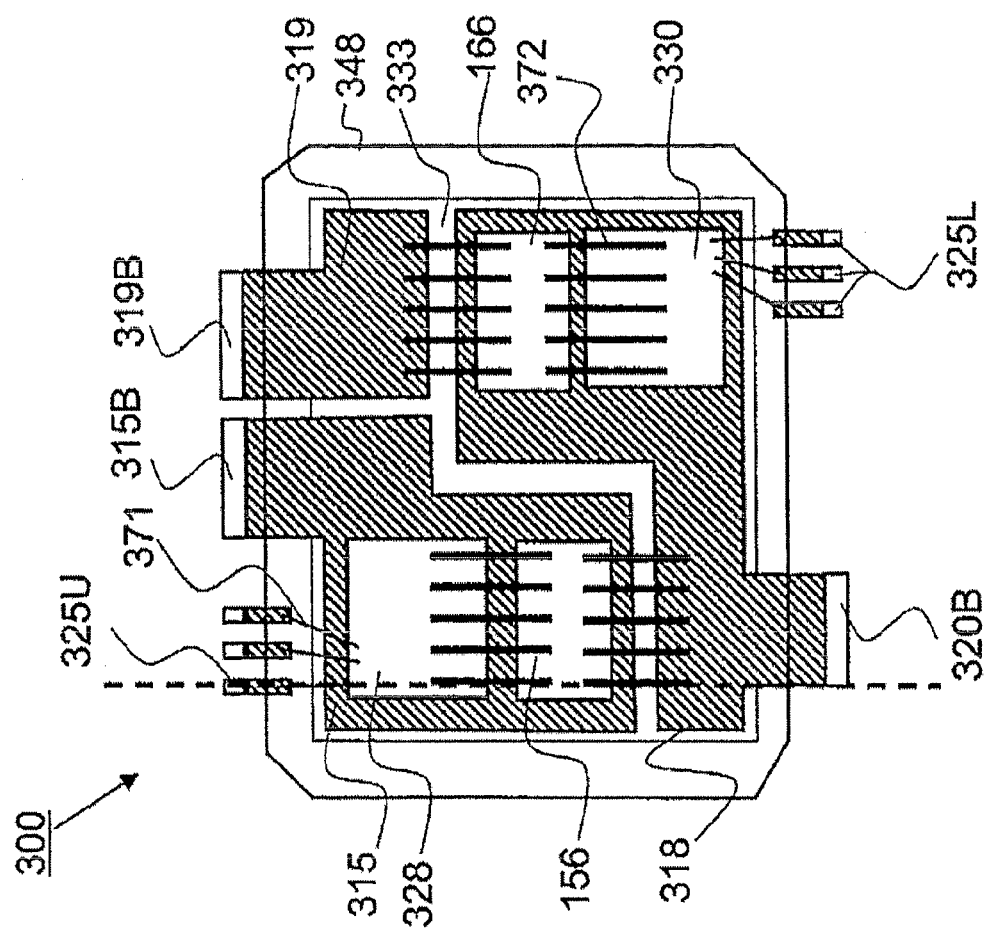
FIG. 24 describes a fifth embodiment of the invention and is a plan view of a resin-sealed-type, single-side-cooled power semiconductor module.
Figure 25:
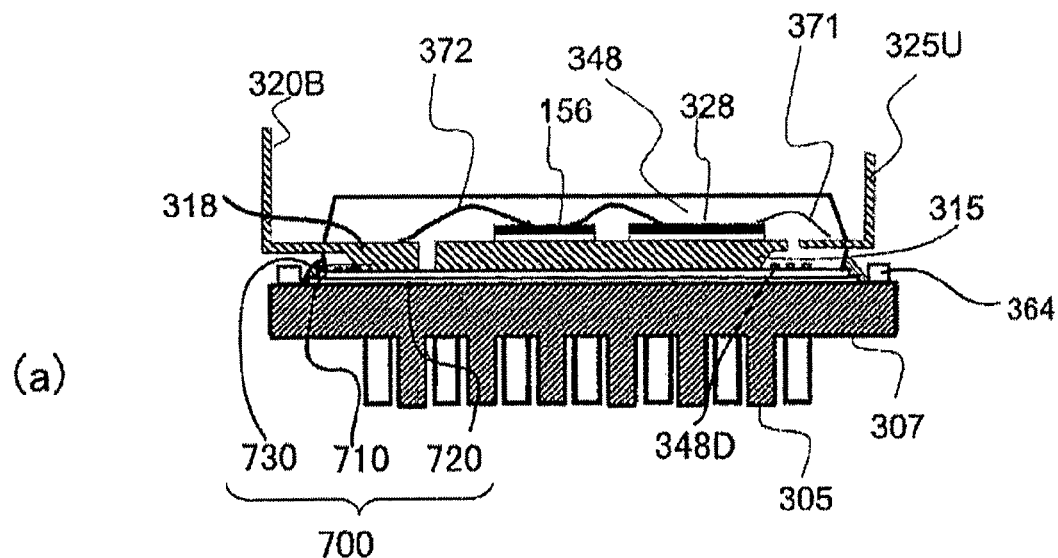
FIGS. 25(a) and 25(b) are cross-sectional views of the power semiconductor module shown in FIG. 24.
Figure 25:
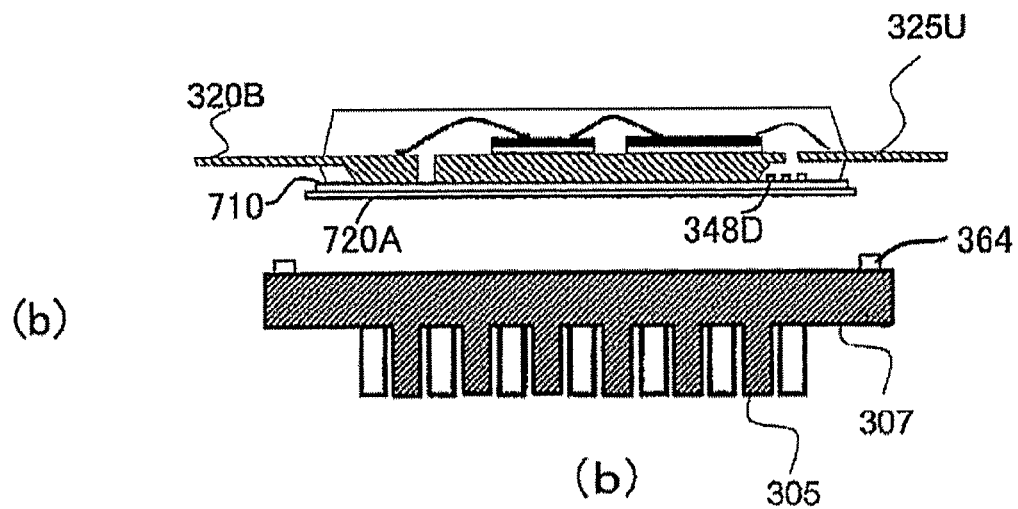

The configuration of a single-side-cooled power module 300 will be described with reference to FIGS. 24 and 25. FIG. 24 shows the arrangement of the semiconductor devices and the conductor plates that form the circuit shown in FIG. 4. In the arrangement, the conductor plates 318 and 320 have the same potential and hence can be formed of a single conductor plate. Front surface principal electrodes of the IGBTs 328 and 330 and the diodes 156 and 166 are connected to each other and then further connected to the conductor plates 318 and 319 with a plurality of metal wires or metal ribbons. The wires or the ribbons are made of Al, an Al alloy, Cu, or a Cu alloy alone or a composite material thereof. Rear surface electrodes of the IGBT 328 and the diode 156 are bonded to the conductor plate 315 with a metal bonding member (not shown) in a metal bonding process. The conductor plates 315, 318 are bonded to a heat dissipation portion 307 with the insulation layer 700 therebetween. Rear surface electrodes of the IGBT 330 and the diode 166 are bonded to the conductor plate 318 with a metal bonding member (not shown) in a metal bonding process. The conductor plates 315, 318, and 319 are bonded to the heat dissipation portion 307 with the insulation layer 700 therebetween.

FIGS. 25(a) and 25(b) are cross-sectional views of hatched portions in FIG. 24. Heat generated by the semiconductor devices is transferred through the conductor plate 315, the insulation layer 700, and a heat dissipation portion 307 and efficiently dissipated out of the power semiconductor module. The recesses 348D are formed in the resin sealer 348. The spray coated film 710 is formed on the surfaces of the resin sealer 348 and the conductor plates 315, 318, and 319 including the recesses 348D.

The insulation film 720 having highly conductive fillers dispersed therein is formed on the upper surface of the spray coated film 710. The holes (not shown) in the spray coated film 710 are impregnated with the resin component of the insulation film 720. In this embodiment as well, resin impregnation is so performed that the resin layer 730 is formed on the circumferential end of the layered structure. A frame 364, which prevents the resin layer 730 from flowing out, is formed on the upper surface of the heat dissipation portion 307. After the impregnation, the upper portion and the lower portion shown in FIG. 25(b) are attached to each other under pressure to form an integrated structure, as shown in FIG. 25(a).

After the bonding of the rear surfaces of the power semiconductor devices to the conductor plates and the bonding of the wires or ribbons to the front surface electrodes, the entire structure is sealed with the resin sealer 348, whereby mechanical damage due to the force applied to the heat dissipation portion against the conductor plates to allow them to adhere to each other can be avoided.

As described above, in the single-side-cooled power module 300 as well, formation of the recesses 348D in the resin sealer 348 and formation of the spray coated film 710 on the surface of the resin sealer 348 including the recesses 348D provide the anchor effect, which can increase the adhesion strength between the spray coated film 710 and the resin sealer 348. Since the configuration of the insulation layer 700 disposed between the conductor plates and the heat dissipation portions 307 is the layered structure of the spray coated film 710 impregnated with a resin and the insulation film 720 containing fillers, the performance in dissipation of heat from the power semiconductor devices to the heat dissipation portion 307 can be improved. Further, since the resin layer 730 is provided on the circumferential end of the layered structure, the magnitude of stress produced at the end of the layered structure can be lowered.

Sixth Embodiment

Figure 26:
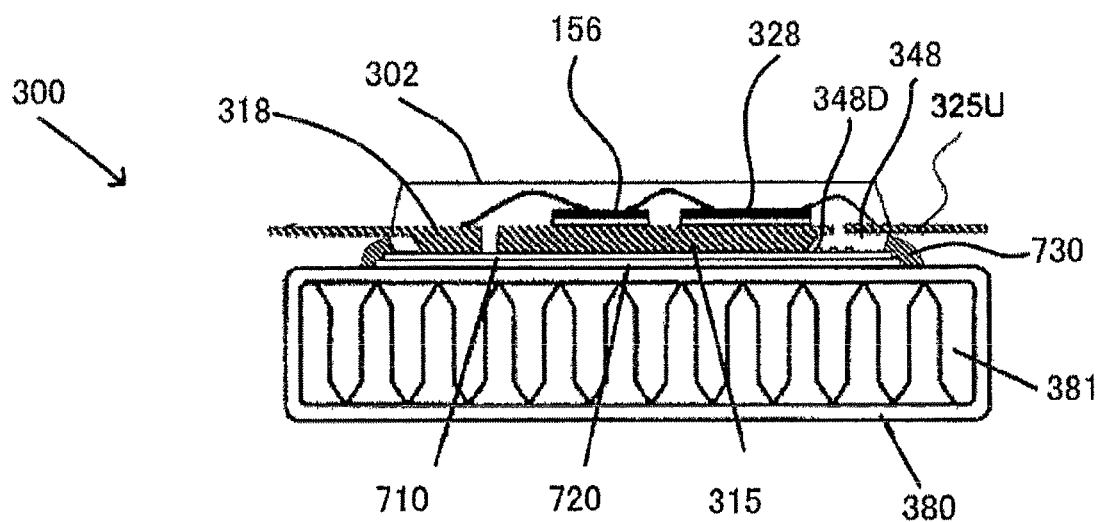
FIG. 26 describes a sixth embodiment of the invention and is a cross-sectional view of a power module including a cooler that cools a power semiconductor module.

In each of the embodiments described above, the power semiconductor module 302 is cooled by the heat dissipation portions 307A and 307B having a large number of fins 305. Another cooler can instead be used to cool the power semiconductor module 302. FIG. 26 describes a sixth embodiment of the invention and is a cross-sectional view of a power module 300 including a cooler. The power semiconductor module 302 has the same structure as that shown in the fifth embodiment except that the frame 364, which prevents the resin layer 730 from flowing out, is not provided. A cooler 380 is so disposed on the insulation film 720 of the insulation layer 700 that the cooler 380 is in intimate contact with the insulation film 720. The cooler 380 has a coolant channel 381 formed therein, and a coolant flowing through the coolant channel 318 cools the power semiconductor module 302. The other components are the same as those in the fifth embodiment, and the corresponding components have the same reference characters and will not be described.

FIG. 26 shows a structure in which the cooler 380 is disposed only on one side of the power semiconductor module 302 by way of example. The cooler 380 can instead be disposed on both sides of the power semiconductor module 302. Further, in the power module 300 shown in each of the first to fifth embodiments as well, the heat dissipation portions 307A and 307B, which cool the power semiconductor module 302, can be replaced with the cooler 380 shown in FIG. 26.

[Insulation Performance of Insulation Layer]

Figure 27:
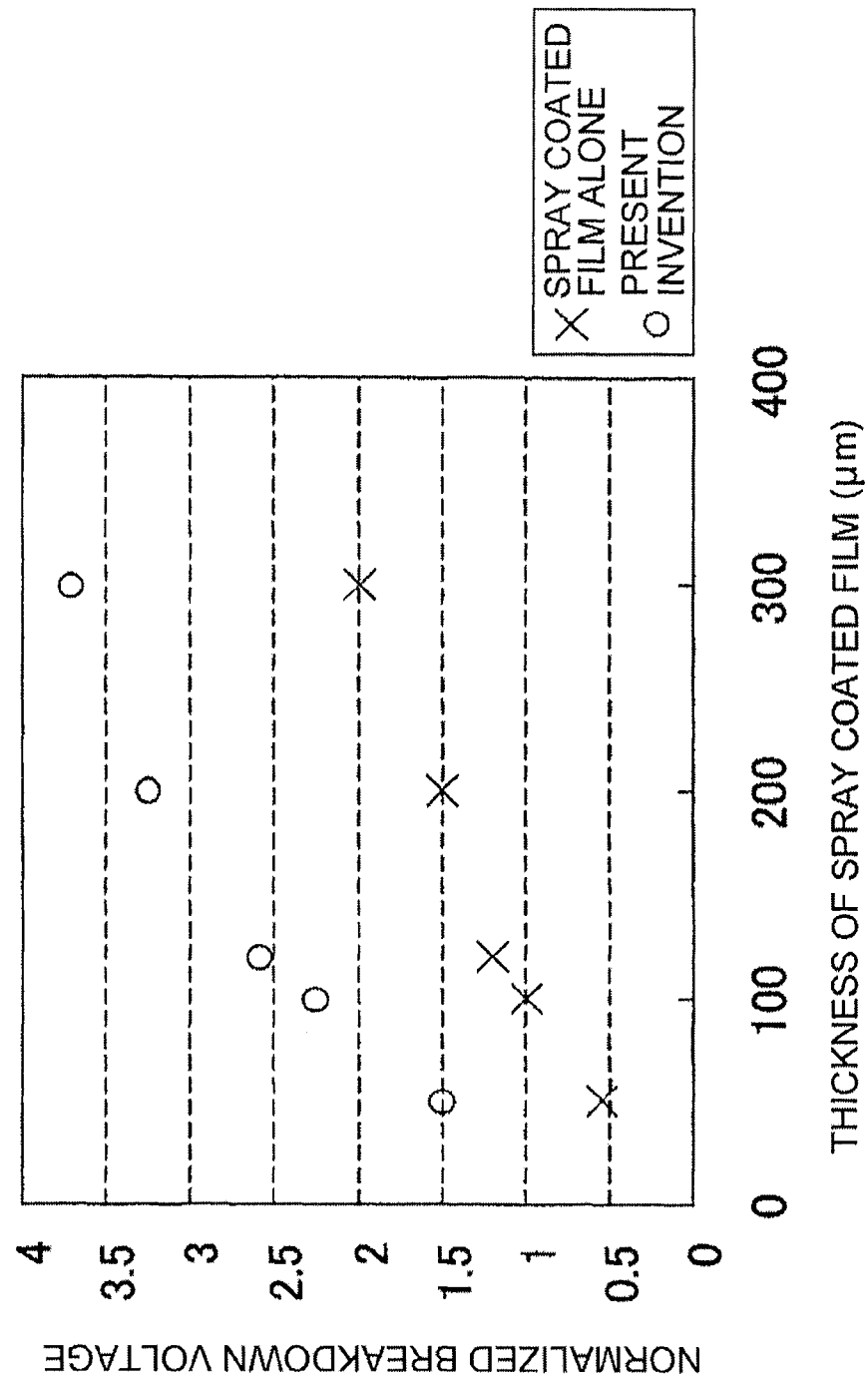
FIG. 27 describes insulation performance (breakdown voltage) of a spray coated film.
Figure 28:
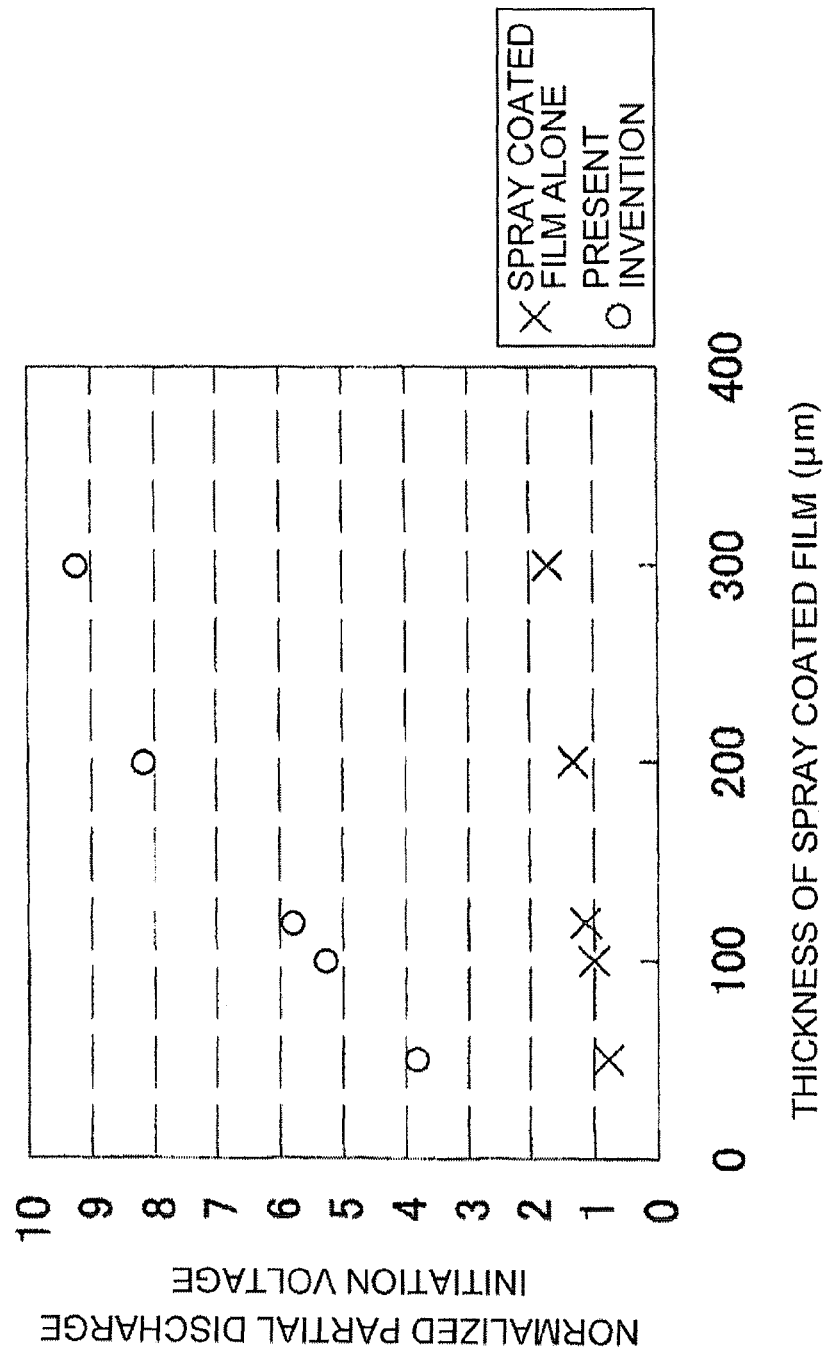
FIG. 28 describes insulation performance (partial discharge voltage) of a spray coated film.

The insulation performance of the insulation layer 700 used in the invention will be described with reference to FIGS. 27 and 28. The horizontal axis in FIG. 27 represents the film thickness of the spray coated film 710 formed on the base, and the vertical axis represents a breakdown voltage normalized by a breakdown voltage of a spray coated film alone having a thickness of 100 µm. The horizontal axis in FIG. 28 represents the film thickness of the spray coated film 710 formed on the base, and the vertical axis represents a partial discharge initiation voltage normalized by a corona discharge initiation voltage associated with a spray coated film alone having a thickness of 100 The partial discharge initiation voltage was measured by using a partial discharge measurement system as follows: An Al electrode was provided on a spray coated film alone on an Al plate or the spray coated film 710 impregnated with a resin and formed on an Al plate; an AC voltage of 0 V was applied to the spray coated film; the voltage was increased at a rate of 100 V/s; and the voltage at which partial discharge was initiated was measured. The threshold for partial discharge initiation was set at 2 pc.

As shown in FIGS. 27 and 28, the spray coated film alone, which has holes therein, is inferior to the spray coated film 710 in terms of insulation performance, but impregnating the spray coated film with a resin increases the breakdown voltage and the corona discharge initiation voltage. In particular, the corona discharge initiation voltage is significantly increased. As shown in the figures, the insulation layer 700, which is the layered structure formed of the spray coated film 710 impregnated with a resin and the insulation film 720 containing fillers, is superior to the spray coated film alone in terms of insulation performance, whereby when the insulation layer 700 is used in a power module, the thickness of the insulation layer 700 necessary for insulation can be thinner than that of the spray coated film alone. A thin insulation layer 700 results in low thermal resistance of the insulation layer 700, whereby the heat dissipation performance of the power module can be improved.

(Comparative Example 1)

Figure 29:
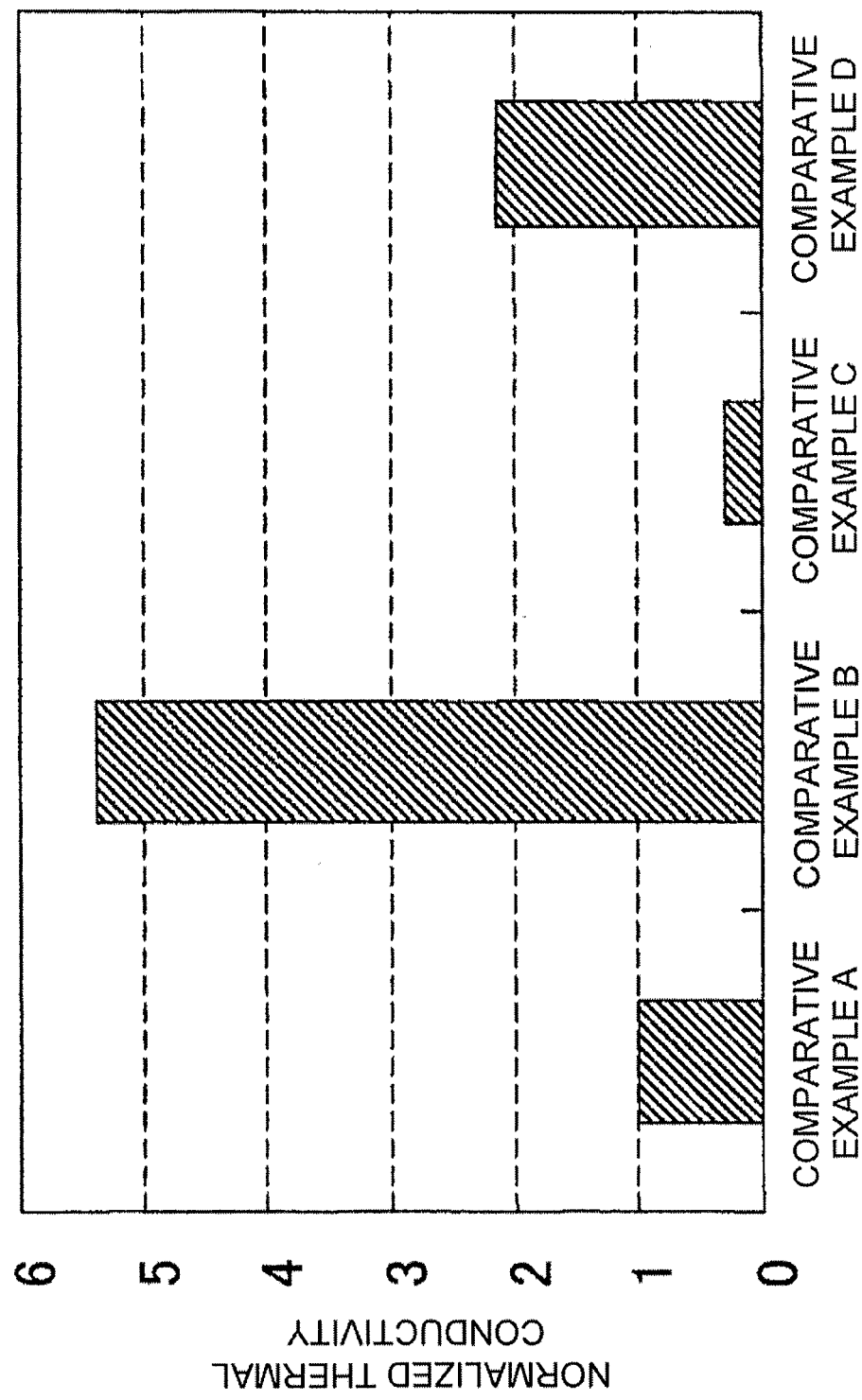
FIG. 29 shows Comparative Examples on the configuration of an insulation layer.

FIG. 29 shows Comparative Examples on the configuration of the insulation layer. In Comparative Examples, an Al plate having a thickness of 2 mm and a square shape of 150×150 mm was sand blasted by using alumina, and alumina particles having diameters ranging from 10 to 30 µm were then plasma spray coated at a power of 40 kW to forma spray coated film. In this process, to lower the proportion of holes in the spray coated film formed on the Al plate so as to prevent fracture of the spray coated film at the time of cooling, the Al plate was preheated to 180° C. before the spray coating process.

Insulation layers to be compared with each other are configured as follows: an alumina spray coated film alone without resin impregnation (Comparative Example A); and an alumina spray coated film having holes impregnated with an epoxy resin (Comparative Example B). The manufactured spray coated films have a hole content of 10% and a thickness of 1 mm. In Comparative Examples A and B, the Al plates were etched away and the alumina spray coated films alone were obtained. Density measurement by using a density meter, thermal diffusivity measurement by using a laser flash method, and specific heat capacity measurement by using differential scanning calorimetry were performed to calculate the thermal conductivity of each of the alumina spray coated films alone.

In addition to Comparative Examples A and B, Comparative Example C was prepared as follows: An Al plate having a thickness of 2 mm and a square shape of 150×150 mm was sand blasted by using alumina and preheated to 180° C., and alumina particles having diameters ranging from 10 to 30 µm were plasma spray coated to form a spray coated film having a thickness of 100 µm. The alumina spray coated film was then impregnated with an epoxy resin and caused to adhere to an Al plate having a thickness of 2 mm and a square shape of 100×100 mm.

On the other hand, Comparative Example D is basically the same as Comparative Example C but differs therefrom in that the adhesion of the spray coated film to the Al plate having a thickness of 2 mm and a square shape of 100×100 mm was performed by using an epoxy resin layer containing alumina fillers. In Comparative Example D, the diameter of the fillers was set to be greater than the recesses and protrusions of the alumina spray coated film so that the fillers do not enter the recesses of the spray coated film.

In either of Comparative Example C or D, the adhesion was performed with a spacer inserted between the Al plates so that the thickness of the resin for adhesion was 25 µm. After the adhesion, a 10 mm×10 mm squire region having no voids in the resin layer for adhesion or non-bonded portions was selected in ultrasonic flaw detection, and the selected region was cut off for thermal resistance measurement. Further, the actual thickness of each of the Al plates, the spray coated film in the insulation layer, and the resin layer for adhesion was measured and checked by observing a cross section cut in the direction perpendicular to the insulation layer after the thermal resistance measurement under a scanning electron microscope. The measured thermal resistance of the entire bonded structure was used to calculate the thermal conductivity of the insulation layer alone. The vertical axis in FIG. 30 represents the thermal conductivity (W/m×K) normalized by the thermal conductivity of the spray coated film alone without resin impregnation as 1, and the hole content in each of the spray coated films is 10%.

A description will be made of the heat dissipation characteristic of the insulation layer 700 according to the present embodiment with reference to FIG. 30. As in Comparative Examples described above, an Al plate having a thickness of 2 mm and a square shape of 150×150 mm was sand blasted by using alumina, and alumina particles having diameters ranging from 10 to 30 µm were plasma spray coated to form a spray coated film having a thickness of 100 µm. An epoxy insulation sheet having a thickness of 30 µm and containing alumina fillers by 40 vol % was then temporarily attached to the spray coated film under a pressure of 2 MPa for 1 minute. The alumina spray coated film was then impregnated with the epoxy resin under a reduced pressure. An Al plate having a thickness of 2 mm and a square shape of 100×100 mm was then caused to adhere to the spray coated film with a spacer inserted therebetween. The fillers were set to have diameters ranging from 1 to 5 µm so that the fillers were allowed to be placed in the recesses of the spray coated film. Further, pressure was so applied to the Al plates when they are caused to adhere to each other that the thickness of the resin layer was 25 µm. After the adhesion, a 10 mm×10 mm squire region having no voids in the resin layer for adhesion or non-bonded portions was selected in ultrasonic flaw detection, and the selected region was cut off for thermal resistance measurement. Further, the actual thickness of each of the Al plates, the spray coated film in the insulation layer, and the resin layer for adhesion was measured and checked by observing a cross section cut in the direction perpendicular to the insulation layer after the thermal resistance measurement under a scanning electron microscope. The measured thermal resistance of the entire bonded structure was used to calculate the thermal conductivity of the insulation layer alone.

Figure 30:
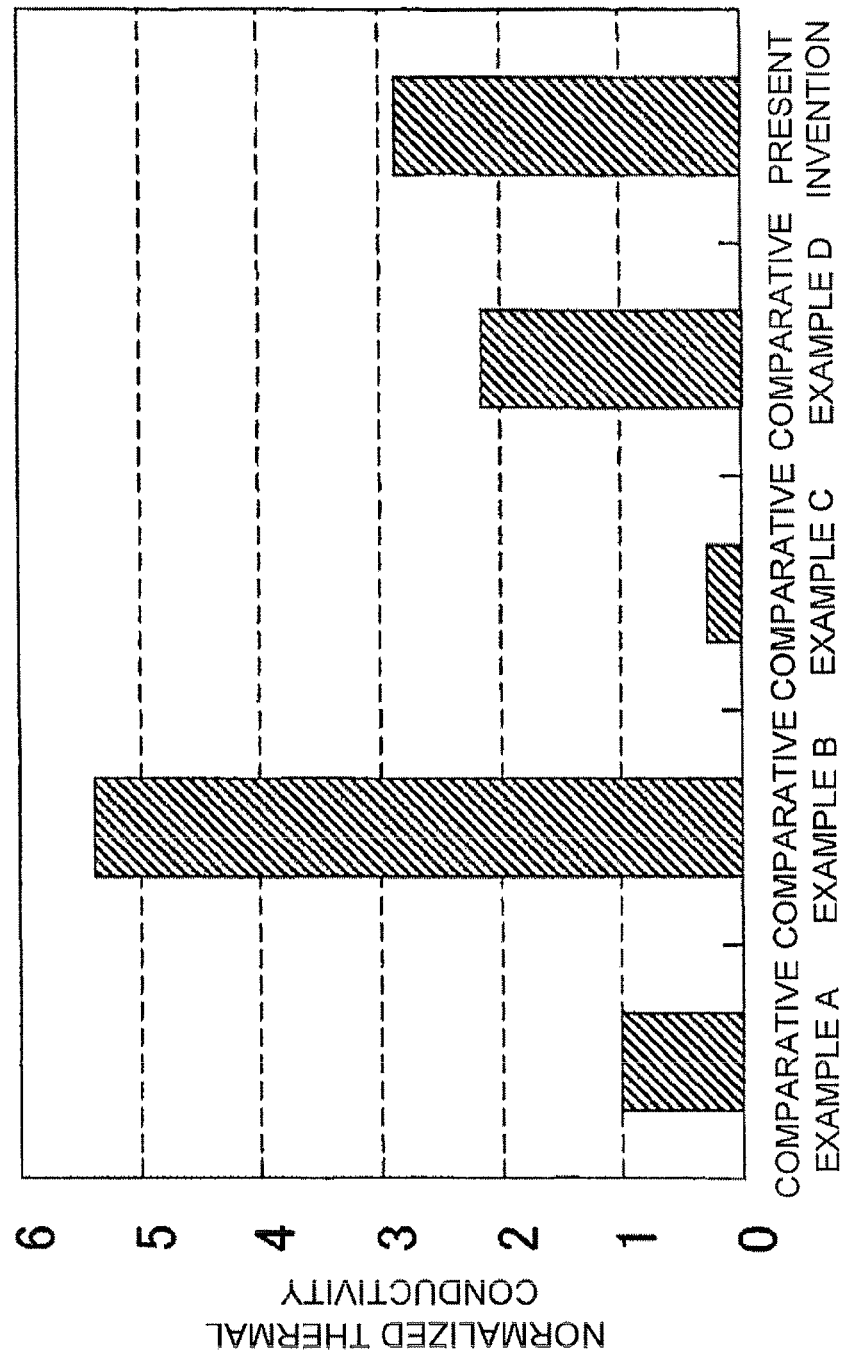
FIG. 30 describes thermal conductivities provided in Comparative Examples and the invention.

As shown in FIG. 30, comparison between Comparative Example A and Comparative Example B indicates that the spray coated film alone impregnated with a resin shows improvement in thermal conductivity by a factor of at least 5. The reason for this is that the epoxy resin with which the spray coated film was impregnated has higher thermal conductivity than air present in the holes in the spray coated film. Comparative Example C, however, indicates that when resin layers containing no fillers are layered on each other to form a composite insulation layer, the thermal conductivity of the insulation layer greatly decreases. Further, Comparative Example D indicates that even when a resin concentrated layer is formed in an island shape but when no fillers are placed in the recesses of the spray coated film, the thermal conductivity decreases. As described above, when a spray coated film impregnated with a resin is bonded, it is important to reduce the area of the resin region involved in the adhesion.

In contrast, it is found that when the fillers are placed in the recesses of the spray coated film, the area of the resin region can be reduced and hence thermal conductivity higher than those in Comparative Examples C and D is provided. The thickness of the insulation film 720 was set at 25 μm for ease of comparison, but the thickness can be reduced by performing the bonding with no spacer to a value close to the greatest diameter of the fillers to be contained. Further, as the composition of the spray coated film, when raw material powder to be spray coated is mixed with an aluminum nitride or any other material having thermal conductivity higher than that of alumina, the thermal conductivity of the spray coated film after the resin impregnation can be increased. Similarly, when the fillers to be contained in the resin layer for adhesion are made of a ceramic material having thermal conductivity higher than that of alumina, the thermal conductivity of the insulation layer 700 can be improved.

The above description is presented only by way of example, and the invention is not at all limited to the configuration of any of the embodiments. For example, the insulation film 720 may be replaced with a highly thermally conductive grease or non-adhesive elastic sheet. Instead of impregnating the spray coated film 710 with a resin, the spray coated film 710 may be impregnated with a glass material. Further, the modulus of elasticity used in the above description means Young's modulus after curing or a storage elastic modulus measured in a dynamic viscoelasticity test under the following conditions: a frequency of 10 Hz; and a temperature rising speed of 3° C./min. The adhesive force is a value measured in accordance with JIS K6850.

[Application to on-Vehicle Electric System]

The power module described above can be used, for example, as an electric power converter accommodated in a hybrid automobile and an electric automobile, and an electric power converter for a train, a ship, an airplane, and other vehicles as well as an industrial electric power converter used as a controller of an electric motor that drives a facility in a factory, and a household electric power converter used as a controller of an electric motor that drives a solar power generation system and an appliance in a house. The following description will be made of a case where the power module is used as an electric power converter for a hybrid automobile by way of example with reference to FIGS. 31 to 42.

(Control Block)

Figure 31:
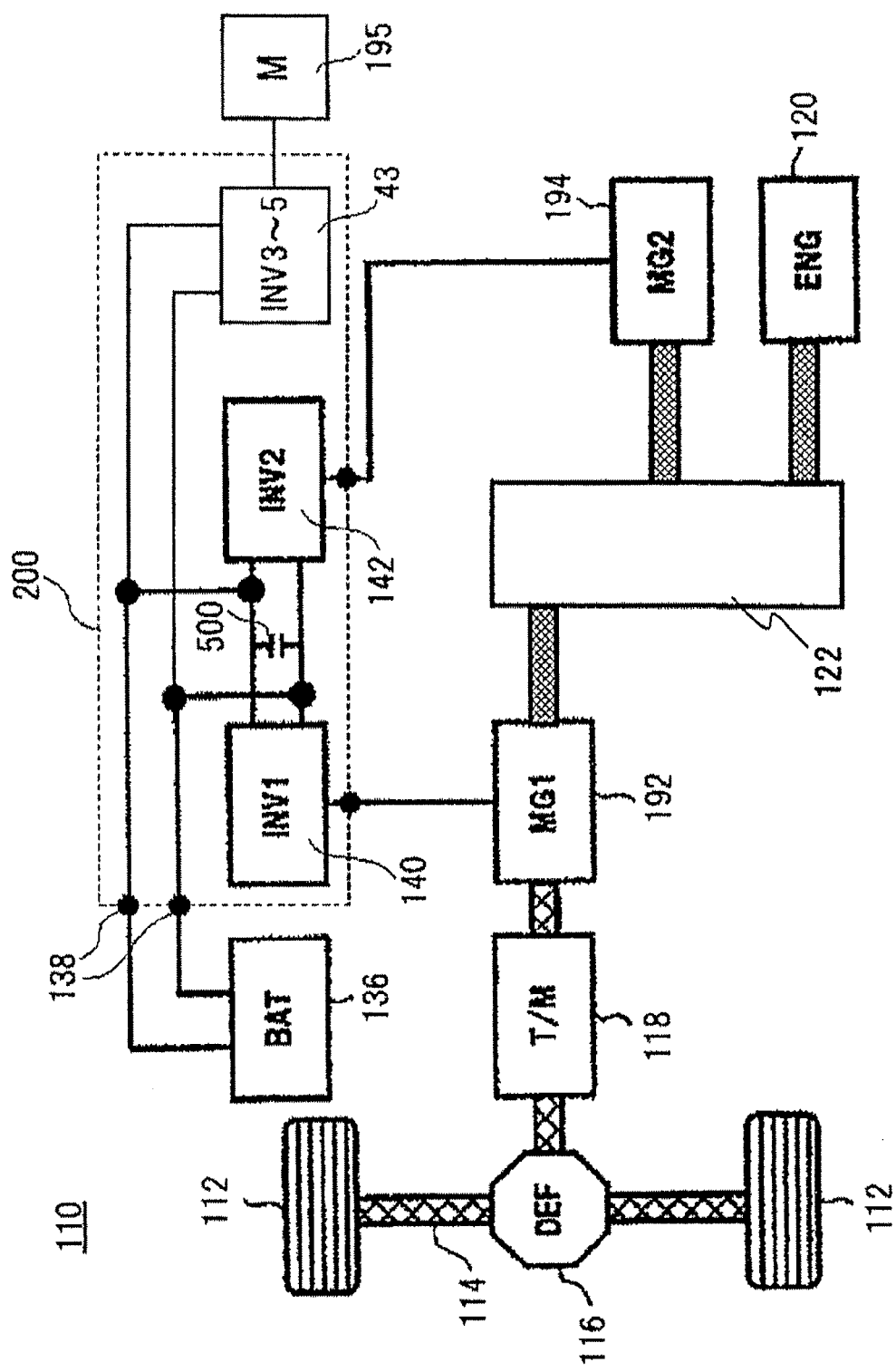
FIG. 31 shows a control block that controls a hybrid automobile.

FIG. 31 shows a control block that controls a hybrid electric vehicle. In FIG. 31, a hybrid electric vehicle (hereinafter referred to as "HEV") 110 is a single electrically driven vehicle and includes two vehicle driving systems. One of them is an engine system using an engine 120, which is an internal combustion engine, as a power source. The engine system is primarily used as an HEV drive source. The other is an on-vehicle electric system using motor generators 192 and 194 as power sources. The on-vehicle electric system is primarily used as another HEV drive source and an HEV electric power generation source. Each of the motor generators 192 and 194 is, for example, a synchronous machine or an induction machine and operates as not only a motor but also a generator depending on a drive method. Each of the motor generators 192 and 194 is therefore called a motor generator in the following description.

A front wheel shaft 114 is rotatably supported in a front portion of a vehicle body, and a pair of front wheels 112 are provided on opposite sides of the front wheel shaft 114. A rear wheel shaft is rotatably supported in a rear portion of the vehicle body, and a pair of rear wheels are provided on opposite sides of the rear wheel shaft (not shown). In the HEV according to the present embodiment, what is called a front-wheel-drive method is employed. Conversely, a rear-wheel-drive method may be employed. A front-wheel-side differential gear (hereinafter referred to as "front-wheel-side DEF") 116 is provided at the center of the front wheel shaft 114. An output shaft of a transmission 118 is mechanically connected to the input side of the front-wheel-side DEF 116. The output side of the motor generator 192 is mechanically connected to the input side of the transmission 118. The output side of the engine 120 and the output side of the motor generator 194 are mechanically connected to the input side of the motor generator 192 via a power distribution mechanism 122.

Inverters 140 and 142 are electrically connected to a battery 136 via a DC connector 138. Electric power can be bidirectionally transferred between the battery 136 and the inverters 140, 142. In the present embodiment, the following two electrically driving/electric power generating units are provided: a first electrically driving/electric power generating unit formed of the motor generator 192 and the inverter 140; and a second electrically driving/electric power generating unit formed of the motor generator 194 and the inverter 142, and one of the two units is used in accordance with an operating situation. In the present embodiment, the vehicle can be driven only with the power from the motor generator 192 by operating the first electrically driving/electric power generating unit as an electrically driving unit using the electric power from the battery 136. Further, in the present embodiment, the battery 136 can be charged by operating the first or second electrically driving/electric power generating unit as an electric power generating unit using the power from the engine 120 or the power from the wheels to generate electric power.

The battery 136 is also used as an electric power source for driving a motor 195 for an accessory component. The motor 195 for an accessory component is, for example, a motor that drives a compressor of an air conditioner or a motor that drives a hydraulic pump for control purposes. DC electric power is supplied from the battery 136 to an inverter 43, which converts the DC electric power into AC electric power, which is supplied to the motor 195. The inverter 43 functions in the same manner as the inverters 140 and 142 and controls the phase, frequency, and magnitude of the AC electric power supplied to the motor 195. The inverter 43, maximum converted electric power from which is smaller than those from the motor generators 192 and 194 because the capacity of the motor 195 is smaller than the capacities of the motor generators 192 and 194, has a circuit configuration that is basically the same as the circuit configuration of each of the inverters 140 and 142. An electric power converter 200 includes a capacitor module 500, which smoothens DC currents supplied to the inverter 140, the inverter 142, and the inverter 43.

(Control Circuit in Electric Power Converter)

Figure 32:
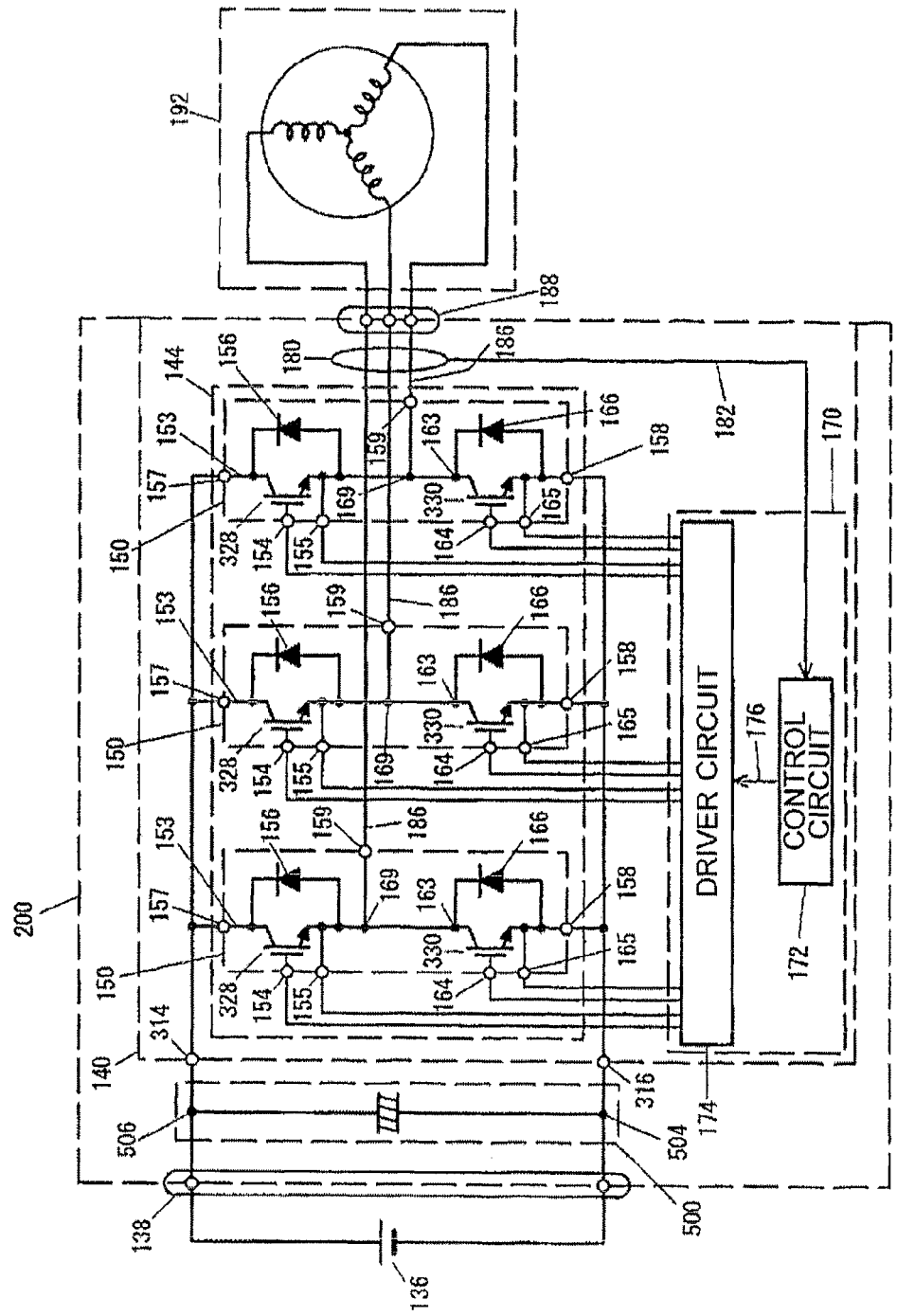
FIG. 32 describes the electric circuit configuration of an inverter.

The electric circuit configuration of the inverter 140, the inverter 142, or the inverter 43 will be described with reference to FIG. 32. In FIG. 32, the inverter 140 will be representatively described.

An inverter circuit 144 includes three upper/lower arm series circuits 150, each of which is formed of the IGBT 328 and the diode 156, which operate as the upper arm, and the IGBT 330 and the diode 166, which operate as the lower arm, for three phases (U phase, V phase, and W phase) corresponding to the phase windings of the armature of the motor generator 192. Each of the upper/lower arm series circuits 150, specifically, an intermediate portion (intermediate electrode 169) thereof is connected via an AC terminal 159 and an AC connector 188 to a corresponding AC electric power line (AC bus bar) 186, which is connected to the motor generator 192.

The collector electrode 153 of the IGBT 328 in each of the upper arms is electrically connected to an electrode of a capacitor on the positive polarity side in the capacitor module 500 via a positive polarity terminal (P terminal) 157, and the emitter electrode of the IGBT 330 in each of the lower arms is electrically connected to an electrode of a capacitor on the negative polarity side in the capacitor module 500 via a negative polarity terminal (N terminal) 158.

A control unit 170 includes a driver circuit 174, which drives and controls the inverter circuit 144, and a control circuit 172, which supplies the driver circuit 174 with a control signal via a signal line 176. Each of the IGBTs 328 and 330 receives a drive signal outputted from the control unit 170 and operates accordingly to convert the DC electric power supplied from the battery 136 into three-phase AC electric power. The converted electric power is supplied to the armature windings of the motor generator 192.

Each of the IGBTs 328 has the collector electrode 153, an emitter electrode 155 for signaling purposes, and a gate electrode 154. Similarly, each of the IGBTs 330 has a collector electrode 163, an emitter electrode 165 for signaling purposes, and a gate electrode 164. Each of the diodes 156 is electrically connected to the corresponding IGBT 328 in parallel thereto. Similarly, each of the diodes 166 is electrically connected to the corresponding IGBT 330 in parallel thereto. The switching power semiconductor device may be a MOSFET (metal oxide semiconductor field effect transistor). In this case, the diodes 156 and 166 are unnecessary. The capacitor module 500 is electrically connected to a positive polarity capacitor terminal 506 and a negative polarity capacitor terminal 504 via the DC connector 138. The inverter 140 is connected to the positive polarity capacitor terminal 506 via a DC positive polarity terminal 314 and connected also to the negative polarity capacitor terminal 504 via a DC negative polarity terminal 316.

The control circuit 172 includes a microcomputer for computing switching timings at which the IGBTs 328 and 330 are switched. The microcomputer receives, as input information, a target torque value necessary for the motor generator 192, the values of currents supplied from the upper/lower arm series circuits 150 to the armature windings of the motor generator 192, and a pole position of the rotor of the motor generator 192. The target torque value is based on an instruction signal outputted from a higher-level controller (not shown). The current values are detected based on detection signals outputted from a current sensor 180 via a signal line 182. The pole position is detected based on a detection signal outputted from a rotating pole sensor (not shown) provided in the motor generator 192. The present embodiment is described with reference to a case where three-phase current values are detected, but current values for two phases may instead be detected.

The microcomputer in the control circuit 172 computes current instruction values for d and q axes of the motor generator 192 based on the target torque value, computes voltage instruction values for the d and q axes based on the difference between the computed current instruction values for the d and q axes and the detected current values for the d and q axes, and converts the computed voltage instruction values for the d and q axes into voltage instruction values for the U, V, and W phases based on the detected pole position. The microcomputer then produces a modulated wave in the form of pulses based on comparison between a fundamental wave (sinusoidal wave) based on the voltage instruction values for the U, V, and W phases and a carrier wave (triangular wave) and outputs the produced modulated wave as a PWM (pulse width modulation) signal to the driver circuit 174 via the signal line 176.

The driver circuit 174, when it drives any of the lower arms, outputs the PWM signal after amplified, as a drive signal, to the gate electrode of the IGBT 330 in the corresponding lower arm. On the other hand, the driver circuit 174, when it drives any of the upper arm, shifts the reference potential level of the PWM signal to the reference potential level in the upper arm, amplifies the resultant PWM signal, and outputs the amplified PWM signal as a drive signal to the gate electrode of the IGBT 328 in the corresponding upper arm.

Further, the control unit 170 senses abnormalities (such as overcurrent, overvoltage, and overtemperature) to protect the upper/lower arm series circuits 150. To this end, the control unit 170 receives sensing information as an input. For example, the emitter electrodes 155 and 165 for signaling purposes in each of the arms input information on the currents flowing to the emitter electrodes of the IGBTs 328 and 330 to corresponding drive sections (ICs). Each of the drive sections (ICs) then senses whether or not an overcurrent is present, and when an overcurrent is sensed, terminates the switching operation of the corresponding IGBTs 328 and 330 to protect the IGBTs 328 and 330 from the overcurrent. A temperature sensor (not shown) provided in each of the upper/lower arm series circuits 150 inputs information on the temperature of the upper/lower arm series circuit 150 to the microcomputer. Further, the microcomputer receives information, as an input, on the voltage on the DC positive polarity side of each of the upper/lower arm series circuits 150. The microcomputer senses whether or not an overtemperature or an overvoltage is present based on the information. When an overtemperature or an overvoltage is sensed, the microcomputer terminates switching operation of all the IGBTs 328 and 330.

The gate electrodes 154 and the emitter electrodes 155 for signaling purposes in FIG. 32 correspond to the signal terminals 325U in FIG. 1, and the gate electrodes 164 and the emitter electrodes 165 in FIG. 32 correspond to the signal terminals 325L in FIG. 1. Further, positive polarity terminals 157 correspond to the DC positive polarity terminal 315B in FIG. 1, and negative polarity terminals 158 correspond to the DC negative polarity terminal 319B in FIG. 1. The AC terminals 159 correspond to the AC terminal 320B in FIG. 1.

(Electric Power Converter Placement Structure)

Figure 33:
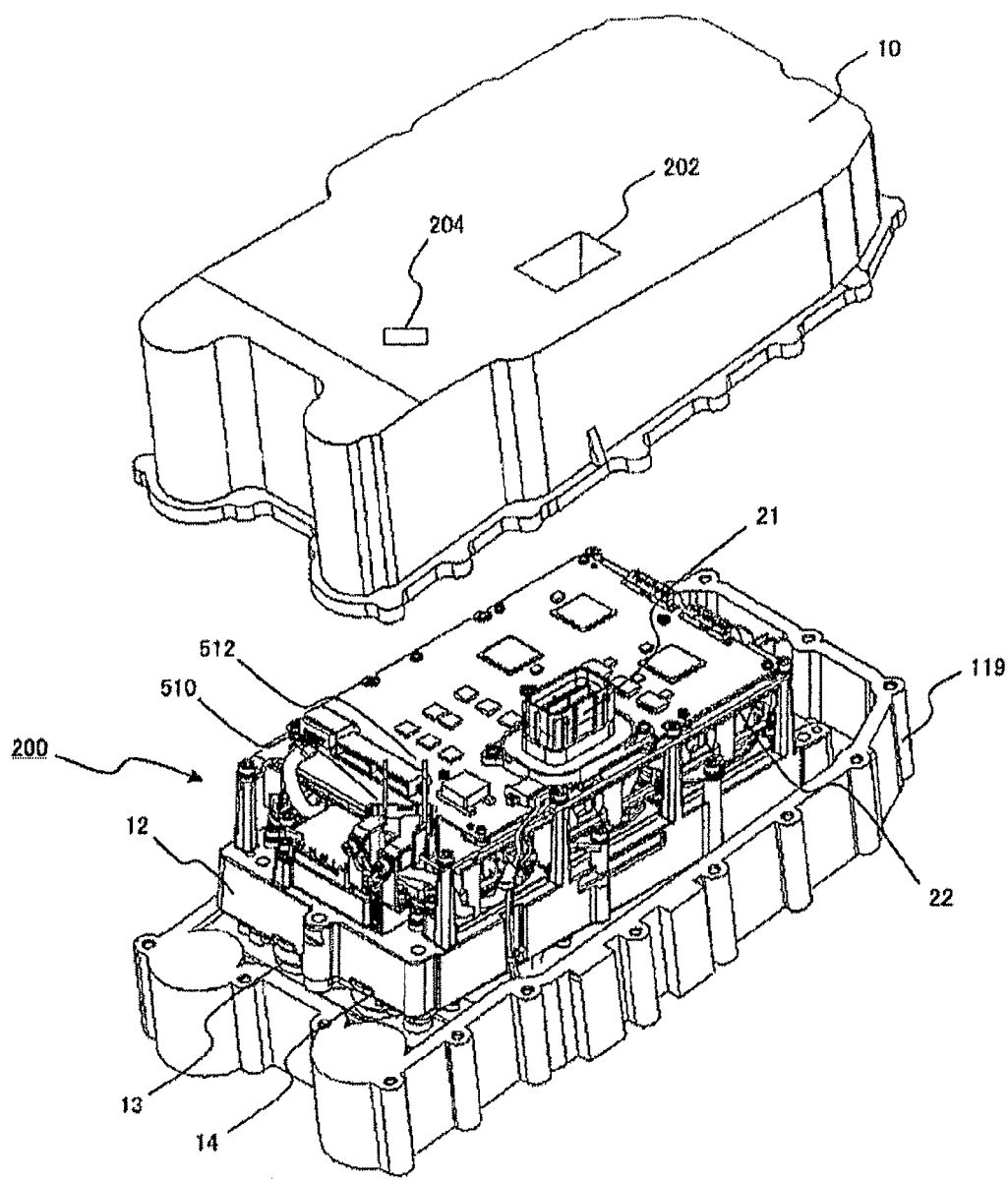
FIG. 33 is an exploded perspective view for describing the location where an electric power converter is placed.

FIG. 33 is an exploded perspective view for describing the location where the electric power converter 200 is placed. The electric power converter 200 is fixed to an enclosure 119, which is made of Al or an Al alloy and accommodates the transmission 118. The electric power converter 200, each of the bottom and upper surfaces of which has a substantially rectangular shape, is readily attached to a vehicle and readily manufactured. A cooling jacket 12 holds power modules 300a to 300f, which will be described later, and the capacitor module 500 and cools them with a coolant. The cooling jacket 12 is fixed to the enclosure 119 and has an inlet tube 13 and an outlet tube 14 formed on the side facing the enclosure 119. The inlet tube 13 and the outlet tube 14 are connected to tubes formed in the enclosure 119, and the coolant for cooling the transmission 118 flows into and out of the cooling jacket 12.

A case 10 covers the electric power converter 200 and is fixed to the enclosure 119. The bottom of the case 10 is configured to face a control circuit substrate 20, on which the control circuit 172 is mounted. The case 10 has a first opening 202 and a second opening 204, through which the interior of the case 10 communicate with the outside atmosphere through the bottom of the case 10, formed in the bottom of the case 10. A connector 21 is connected to the control circuit substrate 20 and transmits a variety of external signals to the control circuit substrate 20. A battery negative polarity side connection terminal 510 and a battery positive polarity side connection terminal 512 electrically connect the battery 136 to the capacitor module 500.

The connector 21, the battery negative polarity side connection terminal 510, and the battery positive polarity side connection terminal 512 are configured to extend toward the bottom surface of the case 10. The connector 21 protrudes through the first opening 202, and the battery negative polarity side connection terminal 510 and the battery positive polarity side connection terminal 512 protrude through the second opening 204. The case 10 has a sealing member (not shown) provided on the inner wall thereof and around each of the first opening 202 and the second opening 204.

Fitting surfaces of the terminals of the connector 21 and other components are oriented in a variety of directions depending on the type of vehicle. In particular, when the connector 21 and other components are accommodated in a compact vehicle, the fitting surfaces are preferably oriented upward in consideration of a constraint in the size of the interior of an engine room and ease of assembly. In particular, when the electric power converter 200 is disposed above the transmission 118, which is the case with the present embodiment, orienting the fitting surfaces in such a way that they protrude in the direction facing away from the side where the transmission 118 is disposed allows improvement in workability. Further, assembling the case 10 to the enclosure 119 from above toward the connector 21, which needs to be sealed from the outside atmosphere, allows the sealing members, which come into contact with the case 10, to be pressed against the connector 21 for improvement in air-tightness.

(Exploded Structure of Electric Power Converter)

Figure 34:
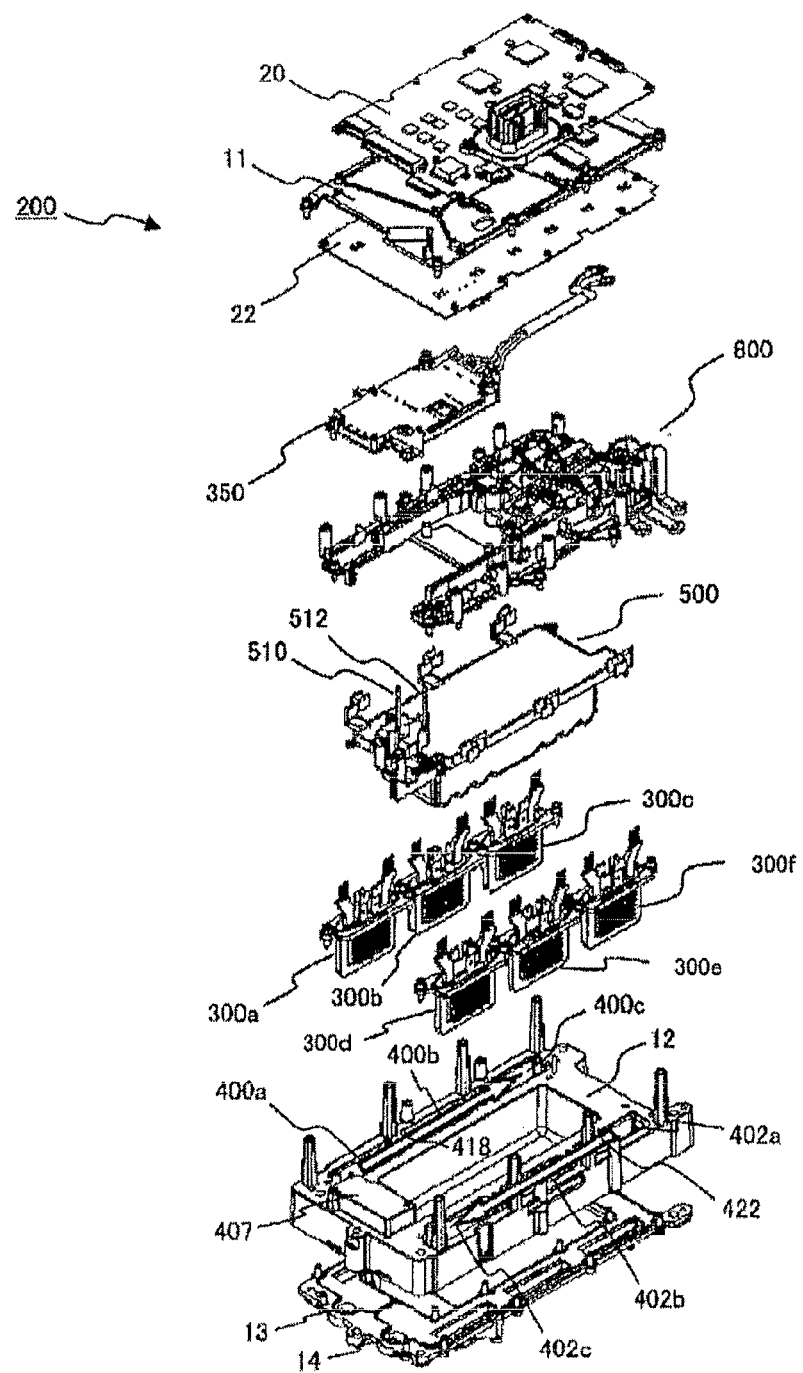
FIG. 34 is an exploded perspective view of the electric power converter.

FIG. 34 is an exploded perspective view of the electric power converter 200. The cooling jacket 12 has a channel 19 provided therein, and in the upper surface of the channel 19 are formed openings 400a to 400c along a flow direction 418 of the coolant and openings 402a to 402c along a flow direction 422 of the coolant. The power modules 300a to 330c block the openings 400a to 400c, and the power modules 300d to 330f block the openings 402a to 402c.

Further, the cooling jacket 12 has an accommodation space 405 formed therein, which accommodates the capacitor module 500. The capacitor module 500, which is accommodated in the accommodation space 405, is cooled with the coolant flowing through the channel 19. The capacitor module 500, which is sandwiched between a segment of the channel 19 through which the coolant flows in the coolant flow direction 418 and a segment the channel 19 through which the coolant flows in the coolant flow direction 422, can be efficiently cooled.

The cooling jacket 12 has a protruding portion 407 formed in a position facing the inlet tube 13 and the outlet tube 14. The protruding portion 407 is formed integrally with the cooling jacket 12. A power semiconductor module 350 for an accessary component is fixed to the protruding portion 407 and cooled with the coolant flowing through the channel 19. A bus bar module 800 is disposed next to the power semiconductor module 350 for an accessary component. The bus bar module 800 is formed, for example, of an AC bus bar 186 and the current sensor 180.

As described above, providing the accommodation space 405, which accommodates the capacitor module 500, in a central portion of the cooling jacket 12, providing the channel 19 in such a way that it surrounds the accommodation space 405, disposing the power modules 300a to 300c and the power modules 300d to 300f for driving the vehicle in the respective channel segments 19, and disposing the power semiconductor module 350 for an accessary component on the upper surface of the cooling jacket 12 allow efficient cooling in a small space and reduction in size of the entire electric power converter. Further, forming a primary structure of the channels 19 in the cooling jacket 12 integrally with the cooling jacket 12 in a casting process using Al or an Al alloy desirably allows enhancement of the cooling effect of the channel 19 and increase in the mechanical strength thereof. Further, the Al casting process allows an integrated structure of the cooling jacket 12 and the channels 19, whereby heat is satisfactorily transferred and cooling efficiency is improved accordingly.

The power modules 300a to 300c and the power modules 300d to 300f are fixed to the channel 19 to complete the assembly of the channel 19, followed by a water leakage test of the water channel. After the channel 19 passes the water leakage test, the capacitor module 500, the power semiconductor module 350 for an accessary component, and a variety of substrates can be attached to the cooling jacket 12. As described above, the cooling jacket 12 is disposed at the bottom of the electric power converter 200, and the capacitor module 500, the power semiconductor module 350 for an accessory component, the bus bar module 800, the substrates, and other necessary parts can then be sequentially fixed to the cooling jacket 12 from above, whereby productivity and reliability are improved.

A driver circuit substrate 22 is disposed above the power semiconductor module 350 for an accessory component and the bus bar module 800. A metal base plate 11 is disposed between the driver circuit substrate 22 and the control circuit substrate 20. The metal base plate 11 not only has a function of electromagnetically shielding a group of circuits mounted on the driver circuit substrate 22 and those mounted on the control circuit substrate 20 from each other but also provides an effect of dissipating heat generated by the driver circuit substrate 22 and the control circuit substrate 20 to cool them.

(Cooling Jacket)

Figure 35:
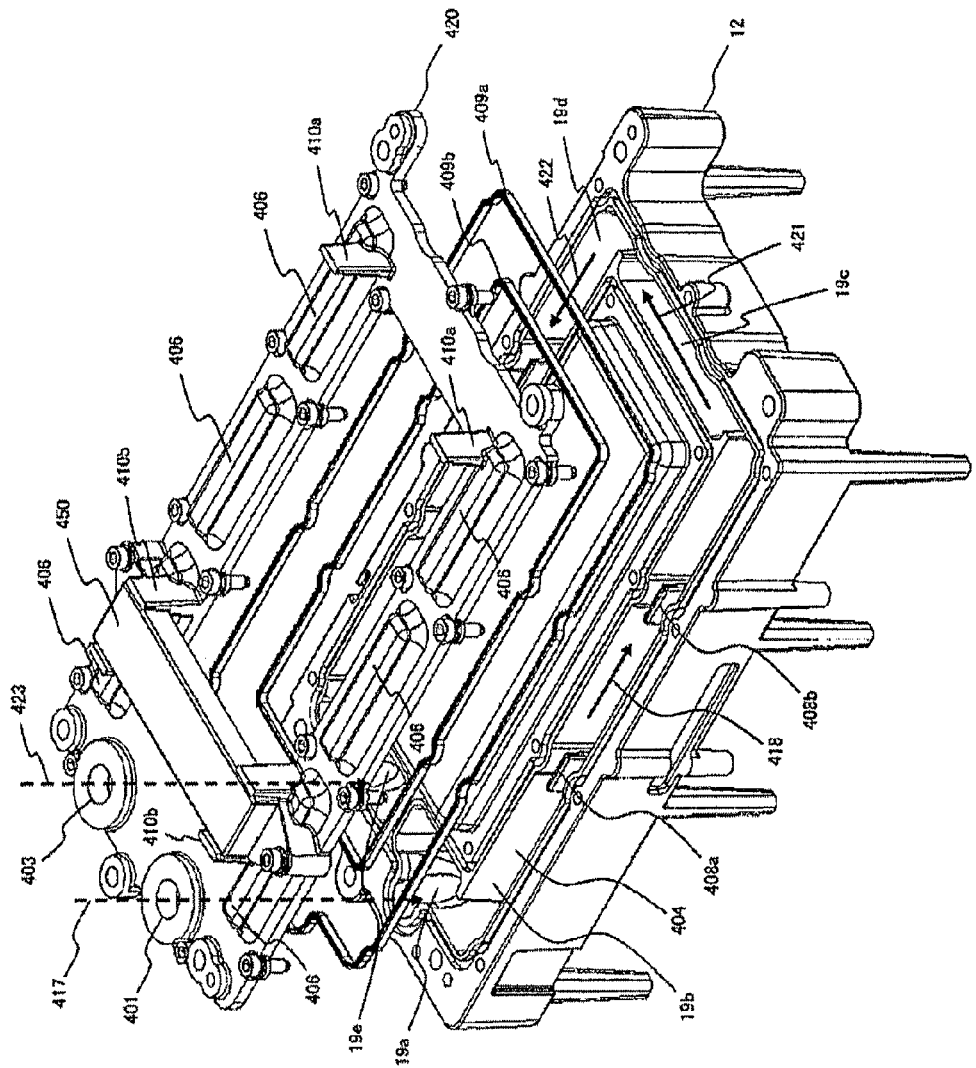
FIG. 35 is a bottom view of a cooling jacket 12 having a channel 19.

FIG. 35 is a bottom view of the cooling jacket 12 with the channel 19. The cooling jacket 12 and the channel 19 provided in the cooling jacket 12 are cast integrally with each other. An opening 404, which is formed of openings connected to each other to form a single opening, is formed in the lower surface of the cooling jacket 12. The opening 404 is blocked with a lower cover 420 having an opening in a central portion thereof. A sealing member 409a and a sealing member 409b are provided between the lower cover 420 and the cooling jacket 12 and maintain airtightness.

The lower cover 420 has an inlet hole 401, through which the inlet tube 13 is inserted, and an outlet hole 403, through which the outlet tube 14 is inserted. The inlet hole 401 and the outlet hole 403 are formed in a portion in the vicinity of one end side of the lower cover 420 and along the end side. The lower cover 402 further has a protrusion 406 formed thereon, which protrudes toward the side where the transmission 118 is disposed. The protrusion 406 is provided for each of the power modules 300a to 300c and the power modules 300d to 300f.

The coolant passes through the inlet hole 401 in a flow direction 417 and flows toward a first channel segment 19a, which is formed along one shorter side of the cooling jacket 12. The coolant then flows through a second channel segment 19b, which is formed along one longer side of the cooling jacket 12, in the flow direction 418. The coolant further flows through a third channel segment 19c, which is formed along the other shorter side of the cooling jacket 12, in a flow direction 421. The third channel segment 19c forms a return channel. The coolant still further flows through a fourth channel segment 19d, which is formed along the other longer side of the cooling jacket 12, in the flow direction 422. The fourth channel segment 19d is provided on the opposite side of the capacitor module 500 to the second channel segment 19b. The coolant further flows through a fifth channel segment 19e, which is formed along the one shorter side of the cooling jacket 12, in a flow direction 423, passes through the outlet hole 403, and flows into the outlet tube 14.

Each of the first channel segment 19a, the second channel segment 19b, the third channel segment 19c, the fourth channel segment 19d, and the fifth channel segment 19e is so formed that the depth dimension thereof is greater than the width dimension thereof. The power modules 300a to 300c are inserted through the openings 400a to 400c formed in the upper surface of the cooling jacket 12 (see FIG. 34) and accommodated in accommodation spaces in the second channel segment 19b. An intermediate member 408a, which prevents the coolant flow from stagnating, is formed between the accommodation space that accommodates the power module 300a and the accommodation space that accommodates the power module 300b. Similarly, an intermediate member 408b, which prevents the coolant flow from stagnating, is formed between the accommodation space that accommodates the power module 300b and the accommodation space that accommodates the power module 300c. Each of the intermediate members 408a and 408b is so formed that the principal plane thereof extends along the flow direction of the coolant. The fourth channel segment 19d similarly has accommodation spaces and intermediate members formed therein for the power modules 300d to 300f, as the second channel segment 19b does. The cooling jacket 12, in which the opening 404 is formed to face away from the openings 400a to 400c and the openings 402a to 402c, can be readily manufactured in an aluminum casting process.

The lower cover 420 has supports 410a and supports 410b provided thereon, which come into contact with the enclosure 119 and support the electric power converter 200. The supports 410a are disposed in positions in the vicinity of one end side of the lower cover 420, and the supports 410b are disposed in positions in the vicinity of the other end side of the lower cover 420. The electric power converter 200 can thus be securely fixed to a sidewall of the enclosure 119, which is formed to conform to cylindrical shapes of the transmission 118 and the motor generator 192.

The supports 410b are configured to further support a resistor 450. The resistor 450 discharges charge accumulated in a capacitor cell in consideration of protection of passengers and safety during maintenance. The resistor 450, which is configured to keep discharging high-voltage electricity, needs to be configured in consideration of minimizing damage to the vehicle even in case the resistor or a discharge mechanism experiences an abnormal even of some kind. That is, when the resistor 450 is disposed in a position, for example, next to the power modules, the capacitor module, or the driver circuit substrate, it is conceivable that the resistor 450 may fire in the vicinity of any of the primary components described above in case the resistor 450 generates heat, ignites, or otherwise causes failure.

To avoid such a situation described above, the power modules 300a to 300c, the power modules 300d to 300f, and the capacitor module 500 are disposed on the opposite side of the cooling jacket 12 to the enclosure 119, which accommodates the transmission 118, and the resistor 450 is disposed in the space between the cooling jacket 12 and the enclosure 119. The arrangement allows the resistor 450 to be disposed in a closed space surrounded by the cooling jacket 12 and the enclosure 119, each of which is made of a metal. Charge accumulated in a capacitor cell in the capacitor module 500 is controlled to be discharged to the resistor 450 via a wiring line passing through a side portion of the cooling jacket 12 in response to switching operation of switching means mounted on the driver circuit substrate 22 shown in FIG. 34. In the present embodiment, the charge is quickly discharged by the switching means. Since the cooling jacket 12 is disposed between the driver circuit substrate 22, which controls the discharge, and the resistor 450, the driver circuit substrate 22 can be protected from the resistor 450. Further, since the resistor 450 is fixed to the lower cover 420, which means that the resistor 450 is disposed in a position thermally very close to the channel 19, the resistor 450 will not generate heat in an abnormal manner.

(Capacitor Module)

Figure 36:
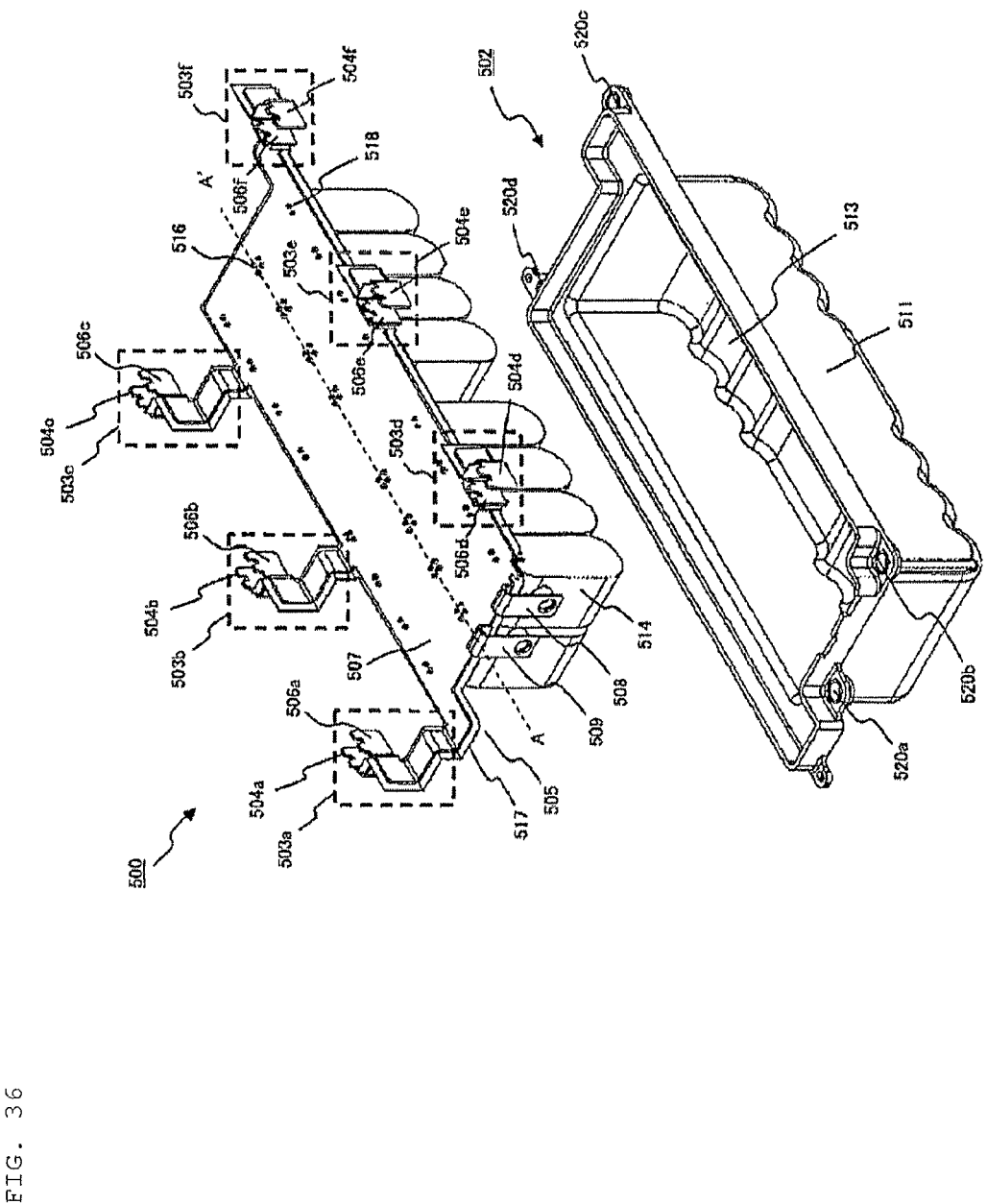
FIG. 36 is an exploded perspective view of a capacitor module 500.
Figure 37:
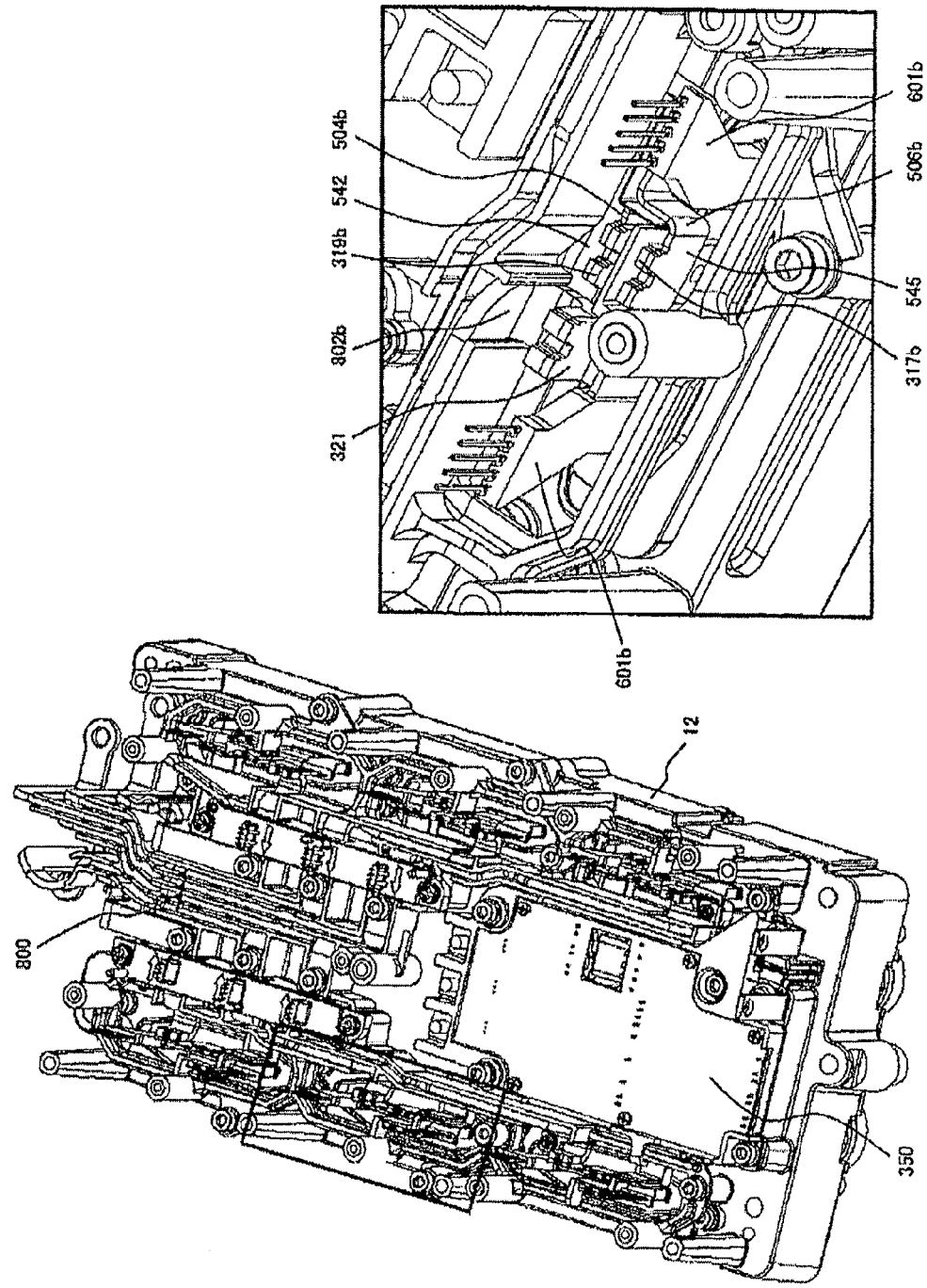
FIG. 37(a) is a perspective view of the exterior appearance showing power modules, the capacitor module, and a bus bar module assembled into the cooling jacket 12.
FIG. 37(b) is an enlarged view of a portion surrounded by the rectangle shown in FIG. 37(a).

FIG. 36 is an exploded perspective view of the capacitor module 500. A laminate conductor plate 501 is formed of a negative polarity conductor plate 505 and a positive polarity conductor plate 507, each of which is formed of a thin-plate-shaped, wide-width conductor, and an insulation sheet 517, which is sandwiched between the negative polarity conductor plate 505 and the positive polarity conductor plate 507. The laminate conductor plate 501 is therefore has low inductance. The laminate conductor plate 501 has a substantially rectangular shape. A battery negative polarity terminal 508 and a battery negative polarity terminal 509 are so formed that they stand upward from one shorter side of the laminate conductor plate 501.

Capacitor terminals 503a to 503c are so formed that they stand upward from one longer side of the laminate conductor plate 501. Capacitor terminals 503d to 503f are so formed that they stand upward from the other longer side of the laminate conductor plate 501. The capacitor terminals 503a to 503f stand upward in a direction crossing the principal plane of the laminate conductor plate 501. The capacitor terminals 503a to 503c are connected to the power modules 300a to 300c, respectively. The capacitor terminals 503d to 503f are connected to the power modules 300d to 300f, respectively. Part of the insulation sheet 517 is disposed and ensures insulation between a negative polarity capacitor terminal 504a and a positive polarity capacitor terminal 506a, which form the capacitor terminal 503a. The same holds true for the other capacitor terminals 503b to 503f. In the present embodiment, the negative polarity conductor plate 505, the positive polarity conductor plate 507, the battery negative polarity terminal 508, the battery negative polarity terminal 509, and the capacitor terminals 503a to 503f form an integrally molded metal plate for reduction in inductance and improvement in productivity.

A plurality of capacitor cells 514 are provided below the laminate conductor plate 501. In the present embodiment, eight capacitor cells 514 are arranged in line along one longer side of the laminate conductor plate 501, and another eight capacitor cells 514 are arranged in line along the other longer side of the laminate conductor plate 501. Sixteen capacitor cells in total are therefore provided. The capacitor cells 514 arranged along the longer sides of the laminate conductor plate 501 are symmetrically arranged with respect to the broken line A-A' shown in FIG. 36. As a result, when a DC current smoothened by the capacitor cells 514 is supplied to the power modules 300a to 300c and the power modules 300d to 300f, uniform current balance is achieved between the capacitor terminals 503a to 503c and the capacitor terminals 503d to 503f, whereby the inductance of the laminate conductor plate 501 can be lowered. Further, the arrangement descried above prevents any local current from flowing through the laminate conductor plate 501, whereby uniform thermal balance is achieved and heat resistance can be improved accordingly.

The battery negative polarity terminal 508 and the battery negative polarity terminal 509 are also symmetrically arranged with respect to the broken line A-A' shown in FIG. 36. Similarly, uniform current balanced is achieved between the capacitor terminals 503a to 503c and the capacitor terminals 503d to 503f, whereby the inductance of the laminate conductor plate 501 can be lowered. Further, uniform thermal balance is achieved, and heat resistance can be improved accordingly.

Each of the capacitor cells 514 in the present embodiment is a charge accumulator unit structure in the capacitor module 500 and is a film capacitor formed by providing two films on one side of each of which Al or any other metal is deposited, layering the two films on each other, and winding them in such a way that the two metals serve as positive and negative electrodes. The surfaces of films wound in a shaft shape form the positive and negative electrodes of the capacitor cell 514, and Sn or any other conductor is sprayed on the surfaces in a manufacturing process. A cell terminal 516 and a cell terminal 518 are connected to the positive and negative electrodes respectively, pass through openings in the laminate conductor plate 501, extend to the side facing away from the side where the capacitor cell 514 is disposed, and are connected to the positive conductor plate 507 and the negative conductor plate 505 respectively in a soldering or welding process.

Each of the capacitor cells 514 in the present embodiment is a charge accumulator unit structure in the capacitor module 500 and is a film capacitor formed by providing two films on one side of each of which Al or any other metal is deposited, layering the two films on each other, and winding them in such a way that the two metals serve as positive and negative electrodes. The surfaces of films wound in a shaft shape form the positive and negative electrodes of the capacitor cell 514, and Sn or any other conductor is sprayed on the surfaces in a manufacturing process. A cell terminal 516 and a cell terminal 518 are connected to the positive and negative electrodes respectively, pass through openings in the laminate conductor plate 501, extend to the side facing away from the side where the capacitor cell 514 is disposed, and are connected to the positive conductor plate 507 and the negative conductor plate 505 respectively in a soldering or welding process.

A bottom surface 513 of an accommodation portion 511 has a smooth recessed and protruding shape or a corrugate shape that conforms to the surface shape of the arranged cylindrical capacitor cells 514. The shape allows a module formed of the laminate conductor plate 501 and the capacitor cells 514 connected thereto to be readily positioned in a capacitor case 502. Further, after the laminate conductor plate 501 and the capacitor cells 514 are accommodated in the capacitor case 502, the capacitor case 502 is so filled with a filling material (not shown) that the filling material covers the laminate conductor plate 501 except the capacitor terminals 503a to 503f and the battery negative polarity terminals 508 and 509. The corrugate shape of the bottom surface 513 that conforms to the shape of the arranged capacitor cells 514 prevents the capacitor cells 514 from shifting from their predetermined positions when the capacitor case 502 is filled with the filling material.

Each of the capacitor cells 514, specifically, the electric resistance of the metal thin layers deposited on the internal films and internal conductors generates heat due to a ripple current produced at the time of switching. To allow the heat from the capacitor cells 514 to be readily dissipated to the capacitor case 502, the capacitor cells 514 are covered with a filling material in a molding process. Using a resin as the filling material improves moisture resistance of the capacitor cells 514 as well.

Further, in the present embodiment, sidewalls that form the longer sides of the accommodation portion 511, in which the capacitor module 500 is disposed, are surrounded by the channel 19, whereby the capacitor module 500 can be efficiently cooled. Moreover, the capacitor cells 514 are so disposed that one electrode surface of each of the capacitor cells 514 faces the inner wall that forms the corresponding longer side of the accommodation portion 511. Since heat generated in each of the capacitor cells 514 tends to be transferred in the direction of the axis around which the films are wound, the configuration described above allows the heat to be readily dissipated to the capacitor case 502 via the electrode surface of the capacitor cell 514.

(Power Module Attachment Structure)

FIG. 37(a) is a perspective view of the exterior appearance showing the power modules, the capacitor module, and the bus bar module assembled into the cooling jacket 12. FIG. 37(b) is an enlarged view of a portion surrounded by the rectangle shown in FIG. 37(a).

A DC negative polarity terminal 315B, a DC positive polarity terminal 319b, an AC terminal 321, and a second sealed portion 601b pass through a through hole 519 of the capacitor case 502 and extend to a portion above a flange 515a, as shown in FIG. 37(b). The area of the current path of each of a DC negative polarity terminal 317b and the DC positive polarity terminal 319b is much smaller than the area of the current path of the laminate conductor plate 501. Therefore, when a current flows through the laminate conductor plate 501 to the DC negative polarity terminal 317b and the DC positive polarity terminal 319b, the area of the current path greatly changes. That is, the current is concentrated in the DC negative polarity terminal 317b and the DC positive polarity terminal 319b. Further, when the DC negative polarity terminal 317b and the DC positive polarity terminal 319b are configured to protrude in a direction crossing the laminate conductor plate 501, in other words, when the DC negative polarity terminal 317b and the DC positive polarity terminal 319b are skewed with respect to the laminate conductor plate 501, a new connection conductor is necessary, which produces problems of a decrease in productivity and an increase in cost.

To address the problem described above, the negative polarity capacitor terminal 504a is formed of a raised portion 540, which is raised from the laminate conductor plate 501, a folded portion 541, which is connected to the raised portion 540 and bent in a U-like shape, and a connection portion 542, which is connected to the folded portion 541 and having a surface facing away from the raised portion 540 but facing the principal plane of the DC positive polarity terminal 319b. The positive polarity capacitor terminal 506a is formed of a raised portion 543, which is raised from the laminate conductor plate 501, a folded portion 544, and a connection portion 545, which is connected to the folded portion 544 and having a surface facing away from the raised portion 543 but facing the principal plane of the DC negative polarity terminal 317b. In particular, the folded portion 544 is so formed that the folded portion 544 is connected to the raised portion 543 substantially at a right angle and that the folded portion 544 extends along side portions of the negative polarity capacitor terminal 504a, the DC negative polarity terminal 317b, and the DC positive polarity terminal 319b. Further, the principal plane of the raised portion 540 and the principal plane of the raised portion 543 are present on the opposite sides of the insulation sheet 517. Similarly, the principal plane of the folded portion 541 and the principal plane of the folded portion 544 are present on opposite sides of the insulation sheet 517.

Since the capacitor terminal 503a has the layered structure, which has the interposed insulation sheet 517, immediately before the connection portion 542 as described above, wiring inductance of the capacitor terminal 503a, where current concentration occurs, can be lowered. Further, the folded portion 544 is configured to extend along side portions of the negative polarity capacitor terminal 504a, the DC negative polarity terminal 317b, and the DC positive polarity terminal 319b. Moreover, the front end of the DC positive polarity terminal 319b is connected to a lateral side of the connection portion 542 in a welding process. Similarly, the front end of the DC negative polarity terminal 317b is connected to a lateral side of the connection portion 545 in a welding process.

As a result, the folded portion 544 does not obstruct the operation direction of welding and connecting the DC positive polarity terminal 319b and the DC negative polarity terminal 317b to each other, the productivity can be improved with the inductance lowered.

The front end of the AC terminal 321 and the front end of an AC bus bar 802a are connected to each other in a welding process. In a production facility for a welding process, designing a welding machine to be movable in a plurality of directions with respect to a workpiece to be welded complicates the production facility, which is not preferable from viewpoints of productivity and cost. In view of the fact described above, in the present embodiment, the welded portion of the AC terminal 321 and the welded portion of the DC positive polarity terminal 319b are arranged in line along one longer side of the cooling jacket 12. The arrangement allows a plurality of portions to be welded while the welding machine is moved in one direction, whereby the productivity is improved.

Further, the plurality of power modules 300a to 300c and 300d to 300f are arranged in line along the respective longer sides of the cooling jacket 12, as shown in FIGS. 34 and 37(a). The arrangement allows further improvement in the productivity in the operation of welding the plurality of power modules 300a to 300f.

(Assembly of Bus Bar Module to Cooling Jacket)

Figure 38:
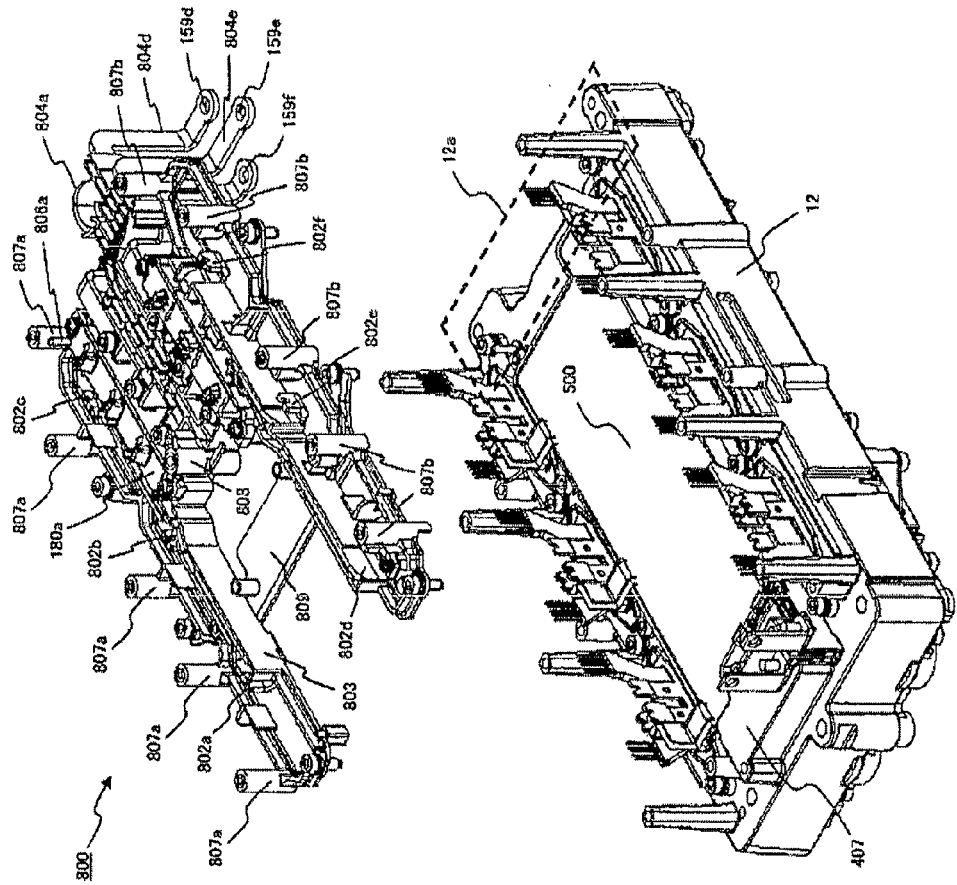
FIG. 38 is an exploded perspective view of the cooling jacket 12 to which the power modules and the capacitor module are assembled and the bus bar module 800.
Figure 39:
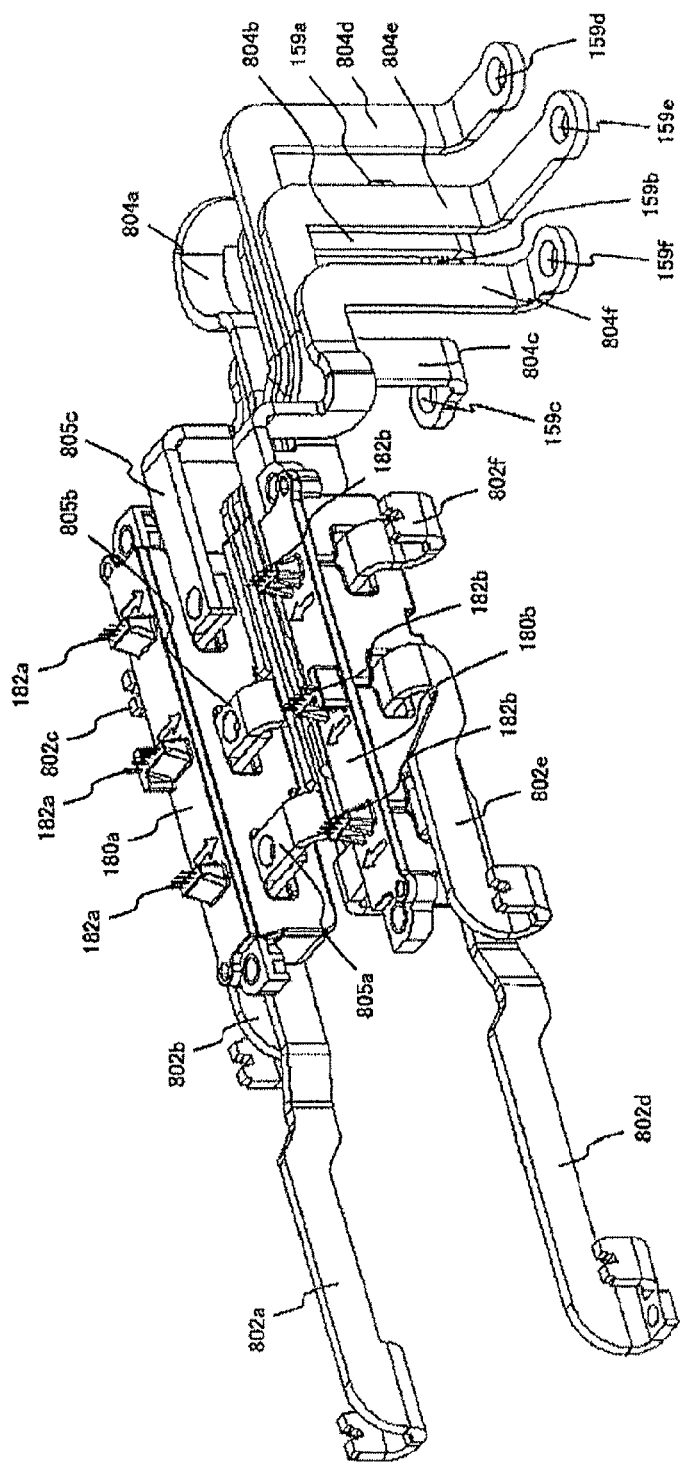
FIG. 39 is a perspective view of the exterior appearance of the bus bar module 800 from which a holding member 803 is removed.

FIG. 38 is an exploded perspective view of the cooling jacket 12 to which the power modules and the capacitor module are assembled and the bus bar module 800. FIG. 39 is a perspective view of the exterior appearance of the bus bar module 800 from which a holding member 803 is removed.

First AC bus bars 802a to 802f are formed in a region extending to a portion where a current sensor 180a or a current sensor 180b is disposed, and the first AC bus bars 802a to 802f are so formed that the principal planes thereof are substantially perpendicular to the principal plane of the laminate conductor plate 501 in the capacitor module 500, as shown in FIGS. 38 and 39. Further, the first AC bus bars 802a to 802f are bent by a substantially right angle immediately before a through hole of the current sensor 180a or a through hole of the current sensor 180b. As a result, the principal planes of the portions of the first AC bus bars 802a to 802f that pass through the current sensor 180a or the current sensor 180b are substantially parallel to the principal plane of the laminate conductor plate 501. Connection portions 805a to 805f, which connect the first AC bus bars 802a to 802f to second AC bus bars 804a to 804f, are formed at the ends of the first AC bus bars 802a to 802f (connection portions 805d to 805f are not shown).

The second AC bus bars 804a to 804f are bent by a substantially right angle in the vicinity of the connection portions 805a to 805f toward the capacitor module 500. As a result, the second AC bus bars 804a to 804f are so formed that the principal planes thereof are substantially perpendicular to the principal plane of the laminate conductor plate 501 in the capacitor module 500. The second AC bus bars 804a to 804f are further so formed that they extend from positions in the vicinity of the current sensor 180a or the current sensor 180b toward one shorter side 12a of the cooling jacket 12 shown in FIG. 38 and cross the side 12a. That is, the plurality of second AC bus bars 804a to 804f are so formed that they cross the side 12a with the principal planes thereof facing each other.

The plurality of plate-shaped AC bus bars are therefore allowed to cross the shorter side of the cooling jacket 12 and protrude out thereof without any increase in the size of the entire electric power converter. The configuration in which the plurality of AC bus bars are allowed to cross one side of the cooling jacket 12 and protrude out thereof allows wiring lines outside the electric power converter 200 to be readily handled, whereby the productivity is improved.

The first AC bus bars 802a to 802f, the current sensors 180a to 180b, and the second AC bus bars 804a to 804f are held and insulated by a holding member 803 made of a resin, as shown in FIG. 38. The holding member 803 allows the second AC bus bars 804a to 804f to be insulated in an improved manner from the cooling jacket 12 and the enclosure 119, each of which is made of a metal. Further, the holding member 803, which is thermally in contact with or in direct contact with the cooling jacket 12, allows heat transferred from the transmission 118 to the second AC bus bars 804a to 804f to be dissipated to the cooling jacket 12, whereby the reliability of the current sensors 180a to 180b can be improved.

As shown in FIG. 38, the holding member 803 has a support member 807a and a support member 807b for supporting the driver circuit substrate 22 shown in FIG. 33. The support member 807a is provided at a plurality of locations, and the support member 807a are so formed that they are arranged in line along one longer side of the cooling jacket 12. Similarly, the support member 807*b* is provided at a plurality of locations, and the support member 807*b* are so formed that they are arranged in line along the other longer side of the cooling jacket 12. A treaded hole used to fix the driver circuit substrate 22 is formed through the front end of each of the support members 807*a* and the support members 807*b*.

Further, the holding member 803 has a protrusion 806*a* and a protrusion 806*b*, which protrude upward from the portions where the current sensor 180*a* and the current sensor 180*b* are disposed. The protrusion 806*a* and the protrusion 806*b* are configured to pass through the current sensor 180*a* and the current sensor 180*b*, respectively. The current sensor 180*a* and the current sensor 180*b* have signal lines 182*a* and signal lines 182*b*, which extend toward the portion where the driver circuit substrate 22 is disposed, as shown in FIG. 39. The signal lines 182*a* and the signal lines 182*b* are bonded to a wiring pattern in the driver circuit substrate 22 in a soldering process. In the present embodiment, the holding member 803, the support members 807*a* to 807*b*, and the protrusions 806*a* to 806*b* are made of a resin and formed integrally with one another.

Since the thus configured holding member 803 has a function of positioning the current sensors 180 and the driver circuit substrate 22 with respect to each other, the signal lines 182*a* and 182*b* are readily assembled and soldered to the driver circuit substrate 22. Further, since the holding member 803 is provided with the mechanism of holding the current sensors 180 and the driver circuit substrate 22, the number of parts of the entire electric power converter can be reduced.

Since the electric power converter 200 is fixed to the enclosure 119, which accommodates the transmission 118, the vibration of the transmission 118 greatly affects the electric power converter 200. To address the problem, the holding member 803 has a support member 808 for supporting a portion in the vicinity of the center of the driver circuit substrate 22 to reduce the effect of the vibration acting on the driver circuit substrate 22. The holding member 803 is fixed to the cooling jacket 12 with screws.

Further, the holding member 803 has a bracket 809 for fixing one end portion of the power semiconductor module 350 for an accessary component. The other end portion of the power semiconductor module 350 for an accessary component, which is disposed on the protruding portion 407, is fixed to the protruding portion 407, as shown in FIG. 34. The effect of the vibration acting on the power semiconductor module 350 for an accessary component can therefore be reduced, and the number of parts for fixing purposes can be reduced.

(Electric Power Converter Assembly Structure)

Figure 40:
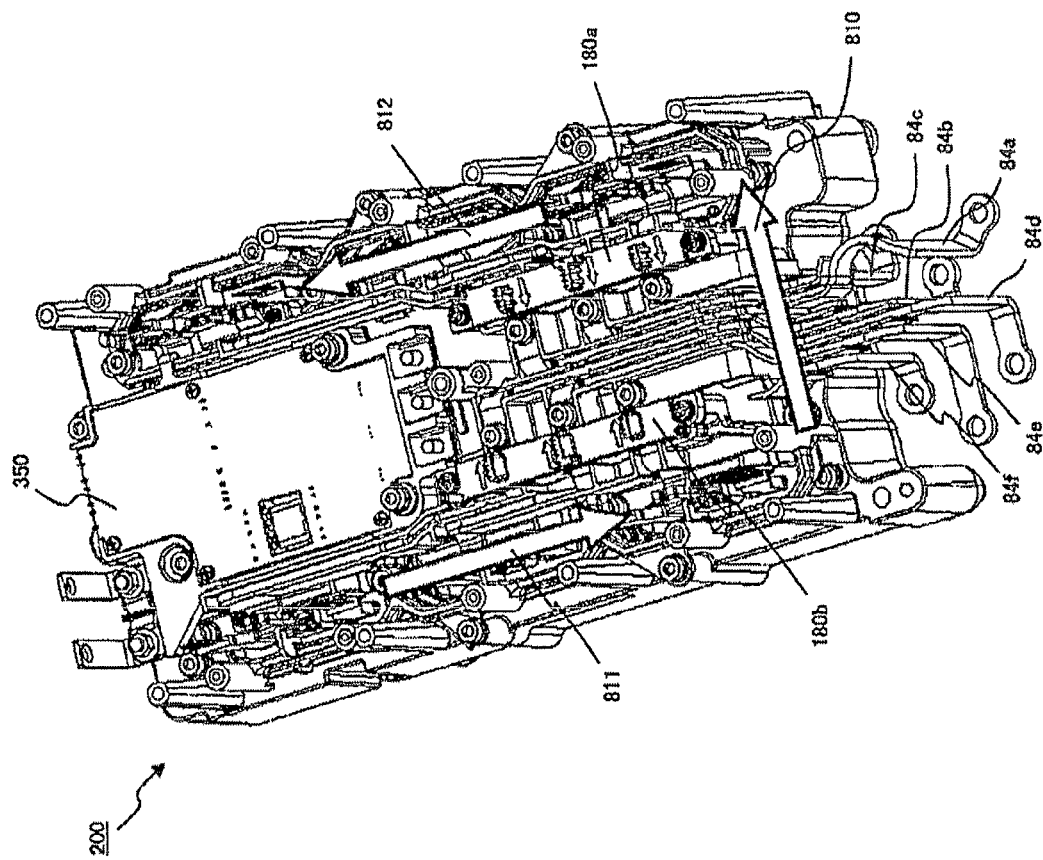
FIG. 40 is a perspective view of the exterior appearance of the cooling jacket 12 to which the power modules, the capacitor module, the bus bar module 800, and a power semiconductor module 350 for an accessary component are assembled.

FIG. 40 is a perspective view of the exterior appearance of the cooling jacket 12 to which the power modules, the capacitor module, the bus bar module 800, and the power semiconductor module 350 for an accessary component are assembled. The current sensors 180 can be broken when heated to a temperature higher than or equal to its heat resistance temperature of about 100° C. In an on-vehicle electric power converter, in particular, it is important to protect the current sensors 180 from heat because the electric power converter is used in a very high temperature environment. In particular, since the electric power converter 200 according to the present embodiment is mounted on the transmission 118, it is important to protect the electric power converter 200 from heat generated by the transmission 118.

To this end, the current sensors 180*a* and 180*b* are disposed on the opposite side of the cooling jacket 12 to the transmission 118. In this configuration, heat generated by the transmission 118 is unlikely to be transferred to the current sensors, and an increase in the temperature of the current sensors is suppressed accordingly. Further, the second AC bus bars 804*a* to 804*f* are so formed that they cross a flow direction 810 of the coolant flowing through the third channel segment 19*c* shown in FIG. 35. The current sensors 180*a* and 180*b* are disposed on the side closer to the AC terminals 321 of the power modules than the second AC bus bars 804*a* to 804*f*, which cross the third channel segment 19*c*. As a result, the second AC bus bars 804*a* to 804*f* are indirectly cooled by the coolant, and the amount of heat transferred from the AC bus bars to the current sensors and further the semiconductor devices in the power modules can therefore be reduced, whereby the reliability is improved.

A flow direction 811 shown in FIG. 40 indicates the flow direction of the coolant flowing through the fourth channel segment 19*d* shown in FIG. 35. Similarly, a flow direction 812 indicates the flow direction of the coolant flowing through the second channel segment 19*b* shown in FIG. 35. The current sensors 180*a* and 180*b* according to the present embodiment, when the electric power converter 200 is projected from above, are so disposed that the projected current sensors 180*a* and 180*b* are surrounded by the projected channel 19. The current sensors can therefore be further protected from the heat from the transmission 118.

Figure 41:
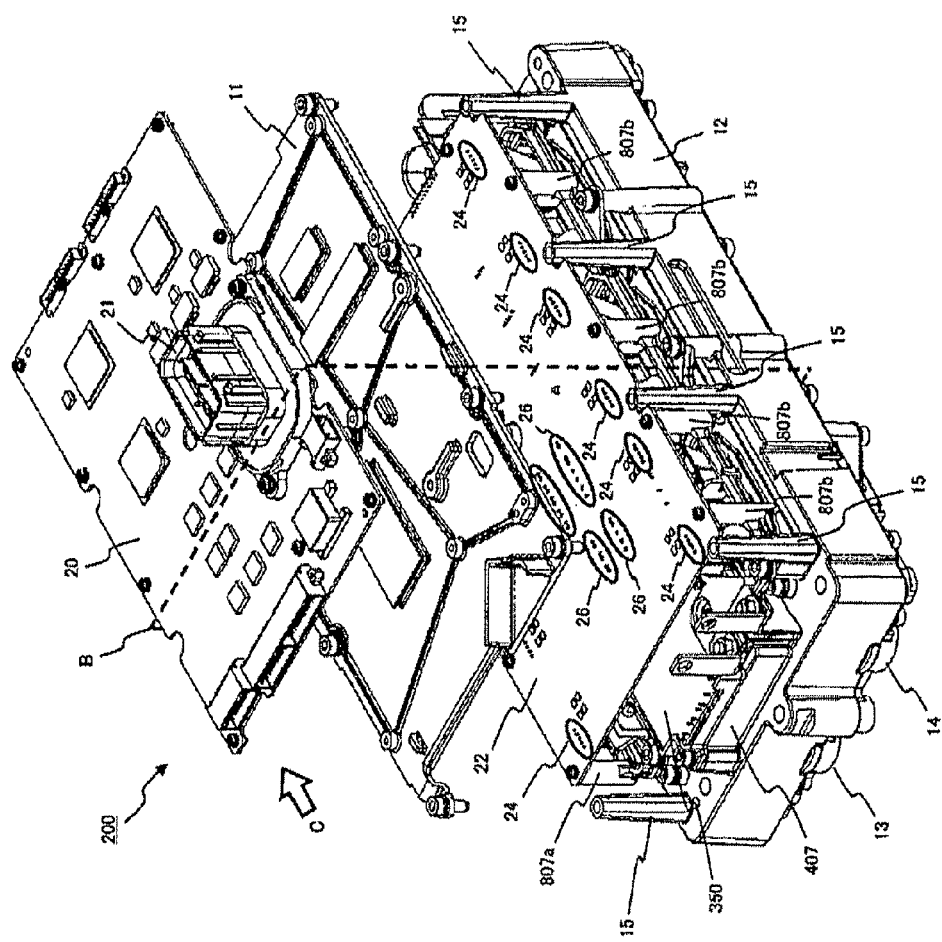
FIG. 41 is an exploded perspective view of the electric power converter 200 from which a control circuit substrate 20 and a metal base plate 11 are separated.

FIG. 41 is an exploded perspective view of the electric power converter 200 from which the control circuit substrate 20 and the metal base plate 11 are separated. The current sensors 180 are disposed above the capacitor module 500, as shown in FIG. 40. The driver circuit substrate 22 is disposed above the current sensors 180 and supported by the support members 807*a* and 807*b* provided in the bus bar module 800 shown in FIG. 38. The metal base plate 11 is disposed above the driver circuit substrate 22 and supported by a plurality of support members 15, which stand upward from the cooling jacket 12. The control circuit substrate 20 is disposed above the metal base plate 11 and fixed to the metal base plate 11.

Since the current sensors 180, the driver circuit substrate 22, and the control circuit substrate 20 are hierarchically disposed in a single row in the height direction, and the control circuit substrate 20 is disposed at a location remotest from the power modules 300*a* to 300*f*, which are power components, whereby the amount of switching noise and other types of noise detected by the control circuit substrate 20 can be reduced. Further, the metal base plate 11 is electrically connected to the cooling jacket 12, which is electrically grounded. The metal base plate 11 reduces the amount of noise that comes from the driver circuit substrate 22 and enters the control circuit substrate 20.

Since the coolant flowing through the channel 19 is intended to primarily cool the power modules 300*a* to 300*f* for drive purposes, the power modules 300*a* to 300*f* are accommodated in the channel 19 and in direct contact with the coolant, which cools the power modules 300*a* to 300*f*. On the other hand, the power semiconductor module 350 for an accessary component is also required to be cooled although the necessity of cooling is lower than that for the power modules for drive purposes.

To this end, a heat dissipation surface of the power semiconductor module 350 for an accessary component is made primarily of a metal and formed to face the inlet tube 13 and the outlet tube 14 via the channel 19. In particular, since the protruding portion 407, which fixes the power semiconductor module 350 for an accessary component, is formed above the inlet tube 13, the coolant flowing from below into the protruding portion 407 impinges on the inner wall thereof and can efficiently absorb heat from the power semiconductor module 350 for an accessary component. Further, a space that communicates with the channel 19 is formed in the protruding portion 407. The space in the protruding portion 407 increases the depth of the channel 19 in the vicinity of the inlet tube 13 and the outlet tube 14, whereby a liquid receiver is created in the space in the protruding portion 407. The liquid receiver can efficiently cool the power semiconductor module 350 for an accessary component.

To electrically connect the current sensors 180 to the driver circuit substrate 22, using a wiring connector undesirably increases the number of connection steps and produces a risk of connection failure.

To address the problems, the driver circuit substrate 22 in the present embodiment has first holes 24 and second holes 26, which pass through the driver circuit substrate 22, as shown in FIG. 41. Further, the signal terminals 325U and the signal terminals 325L of each of the power modules 300a to 300f are inserted through the first holes 24 and bonded to the wiring pattern in the driver circuit substrate 22 in a soldering process. Similarly, the signal lines 182 of the current sensors 180 are inserted through the second holes 26 and bonded to the wiring pattern in the driver circuit substrate 22 in a soldering process. The solder bonding is performed on the surface of the driver circuit substrate 22 that faces away from the surface thereof facing the cooling jacket 12.

The signal line connection can thus be performed without using a wiring connector, whereby the productivity can be improved. Further, since the solder bonding is performed on the signal terminals 325 of the power modules 300a to 300f and the signal lines 182 from the current sensors 180 from the same side, the productivity can be further improved. Moreover, since the first holes 24, through which the signal terminals 325 pass, and the second holes 26, through which the signal lines 182 pass, are separately provided in the driver circuit substrate 22, the risk of connection failure can be suppressed.

Further, a drive circuit (not shown), such as a driver IC chip or any other component, is mounted on the driver circuit substrate 22, specifically, on the surface thereof facing the cooling jacket 12. The amount of heat generated in the solder bonding and transferred to the driver IC chip or any other component is therefore reduced, whereby the driver IC chip or any other component will not be damaged due to the solder bonding. Further, since a transformer or any other tall electric part mounted on the driver circuit substrate 22 is disposed in the space between the capacitor module 500 and the driver circuit substrate 22, the height of the entire electric power converter 200 can be reduced.

Figure 42:
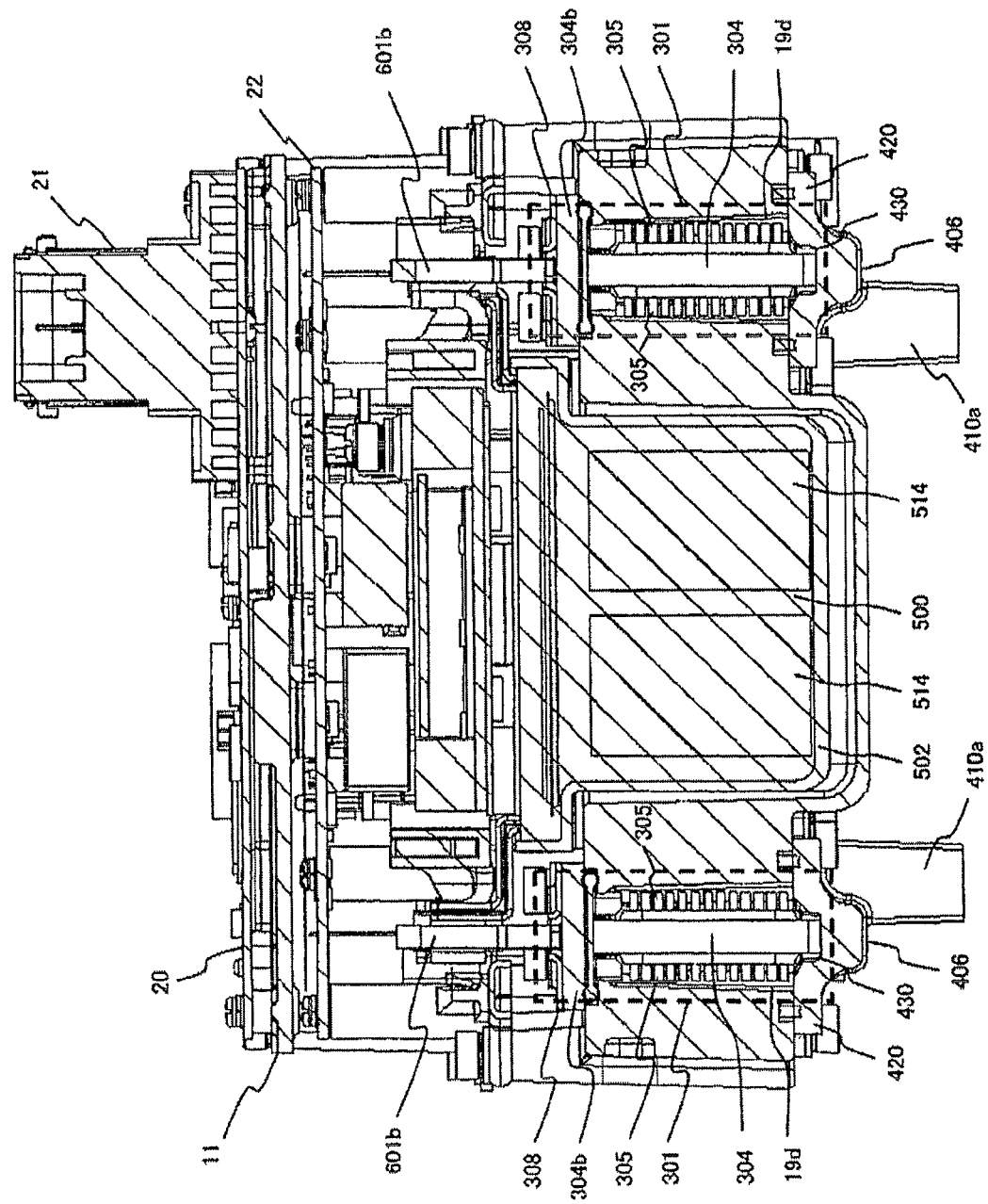
FIG. 42 is a cross-sectional view of the electric power converter 200 shown in FIG. 41 taken along the plane B shown in FIG. 41 and viewed in the direction C shown in FIG. 41.

FIG. 42 is a cross-sectional view of the electric power converter 200 shown in FIG. 41 taken along the plane B shown in FIG. 41 and viewed in the direction C shown in FIG. 41.

The flange 304B provided as part of each of the modular cases 304 is pressed against the cooling jacket 12 by the flange 515a or a flange 515b provided as part of the capacitor case 502. That is, pressing the module cases 304 against the cooling jacket 12 by using the self-weight of the capacitor case 502, which accommodates the capacitor cells 514, can improve the airtightness of the channel 19.

To improve the cooling efficiency of the power modules 300a to 300f, the coolant in the channel 19 needs to flow to a region where the fins 305 are formed. To provide a space for the thin-walled portion 304A of each of the module cases 304, no fins 305 are formed in a lower portion of the module case 304. On the other hand, the lower cover 420 is so formed that the lower portion of the module case 304 fits into a recess 430 formed in the lower cover 420. The coolant will therefore not flow into a space where no cooling fins are formed.

The direction in which the power modules 300a to 300f and the capacitor module 500 are arranged crosses the direction in which the control circuit substrate 20, the driver circuit substrate 22, and the transmission 118 are arranged, as shown in FIG. 42. In particular, the power modules 300a to 300f and the capacitor module 500 are disposed side by side in the lowest layer in the electric power converter 200. As a result, the height of the entire electric power converter 200 can be reduced, and the degree of the effect of the vibration from the transmission 118 can be reduced.

As described above, according to the embodiments of the power semiconductor module of the invention, the plurality of recesses 348C and 348D are provided in the resin sealer 348, which covers and seals the conductor plates 318, 319, 315, and 320, on which the semiconductor devices are mounted, and the spray coated film 710 is formed on the surface of the resin sealer 348 including the interior of the recesses 348C and 348D. The adhesion strength between the spray coated film 710 and the resin sealer 348 can therefore be advantageously improved.

Each of the embodiments described above is presented by way of example with reference to the case where the recesses 348C and 348D in the resin sealer 348 are formed by using protrusions provided on a die. The recesses 348C and 348D in the resin sealer 348 can be formed by using another method, for example, by laser processing. Forming the recesses 348C and 348D in the resin sealer 348 by using laser processing causes the sidewall surface 348H to have a region where the inclination angle θ of the surface on which the spray coated film is deposited does not fall within the range from 0° to 45°, as in a blasting process and other processes. In this case, providing the predetermined distance X shown in FIG. 20 can prevent degradation in the insulation characteristic.

In addition to the above, a variety of changes can be made to the power semiconductor modules according to the invention within the scope of the substance of the invention.

REFERENCE SIGNS LIST 156, 166 Diode
300, 300a to 300f Power module
302 Power semiconductor module
304 Module case (heat dissipation member)
304A Thin-walled portion
307A, 307B, 362A, 362B Heat dissipation portion
315, 318, 319, 320 Conductor plate
328, 330 IGBT
348 Resin sealer
348C, 348D Recess
348E Side surface
348F Ceramic filler
348G Resin
348H Sidewall surface
361 Case body (connection section)
374 Transfer mold die
380 Cooler
381 Coolant channel
700 Insulation layer
710 Spray coated film
711 Flat portion 712 Hole
720 Insulation film
720A Insulation sheet
730 Resin layer

The invention claimed is:

1. A power semiconductor module comprising: a semiconductor device;
- a conductor plate having a first surface on which the semiconductor device is mounted;
- a resin sealer that covers a side portion of the conductor plate and exposes at least part of the a second surface of the conductor plate that faces away from the first surface; and
- a spray coated film provided on an outer surface of the resin sealer and the at least part of the second surface of the conductor plate that is exposed through the resin sealer, and
- a recess is formed in the outer surface of the resin sealer, and the planar size of the recess is greater than the planar size of each flat portion that forms the spray coated film;
- wherein the spray coated film is continuously disposed on the outer surface of the resin sealer, in the recess, and on the at least part of the second surface of the conductor plate that is exposed through the resin sealer, without interruption.

2. The power semiconductor module according to claim 1, wherein an end of the recess that is closer to the conductor plate is set apart by a predetermined length from a boundary between the exposed part of the second surface of the conductor plate and the resin sealer.

3. The power semiconductor module according to claim 2, wherein the predetermined length is greater than or equal to a distance that prevents discharge in the resin sealer even when voids are formed in the spray coated film and when the semiconductor device operates at a maximum rating.

4. The power semiconductor module according to claim 3, wherein the predetermined length is greater than X calculated by using the following Expression (I):

$$X = t \in \{(V_i/U_i) - 1\} \quad \text{Expression (I)}$$

where t represents the size of a gap that is most likely to cause discharge, $\in$ represents the dielectric constant of a sealing resin, $U_i$ represents a discharge initiation voltage at which discharge is initiated in the gap, and $V_i$ represents a partial discharge initiation voltage.

5. The power semiconductor module according to claim 1, wherein the thickness of the spray coated film is greater than the depth of the recess formed in the resin sealer.

6. The power semiconductor module according to claim 1, wherein minute protrusions and recesses are formed at least one of the lower surface of the resin sealer and the other surface of the conductor plate that is exposed through the resin sealer, and the minute protrusions and recesses are smaller than the planar size of the recess of the resin sealer.

7. The power semiconductor module according to claim 1, wherein the resin sealer contains ceramic fillers, the ceramic fillers are exposed in the recess formed in the resin sealer, and the spray coated film is bonded to the ceramic fillers.

8. The power semiconductor module according to claim 1, wherein the power semiconductor module further comprising:
- an insulation film disposed on the spray coated film and containing ceramic fillers; and
- a stress relaxation resin layer formed around the insulation film.

9. The power semiconductor module according to claim 8, wherein the thermal conductivity of the stress relaxation resin layer is smaller than the thermal conductivity of the insulation film.

10. The power semiconductor module according to claim 1, wherein holes in the spray coated film are impregnated with an insulating resin.

11. The power semiconductor module according to claim 1, wherein a side surface of the recess formed in the resin sealer is an inclined surface inclined in a direction in which the planar size of the recess increases from a bottom thereof toward an opening thereof.

* * * * *